(12) United States Patent
Fjelstad et al.

(10) Patent No.: US 8,338,713 B2
(45) Date of Patent: Dec. 25, 2012

(54) CABLED SIGNALING SYSTEM AND COMPONENTS THEREOF

(75) Inventors: Joseph C. Fjelstad, Maple Valley, WA (US); Para K. Segaram, Campbell, CA (US); Thomas Obenhuber, San Francisco, CA (US); William F. Wiedemann, Campbell, CA (US)

(73) Assignee: Samsung Electronics Co., Ltd. (KR)

( * ) Notice: Subject to any disclaimer, the term of this patent is extended or adjusted under 35 U.S.C. 154(b) by 475 days.

(21) Appl. No.: 11/939,554

(22) Filed: Nov. 14, 2007

(65) Prior Publication Data

US 2009/0120668 A1 May 14, 2009

Related U.S. Application Data

(62) Division of application No. 10/659,210, filed on Sep. 9, 2003, now abandoned.

(60) Provisional application No. 60/427,276, filed on Nov. 16, 2002, provisional application No. 60/431,492, filed on Dec. 6, 2002, provisional application No. 60/462,485, filed on Apr. 11, 2003, provisional application No. 60/477,856, filed on Jun. 11, 2003, provisional application No. 60/483,571, filed on Jun. 26, 2003.

(51) Int. Cl.
*H05K 1/09* (2006.01)

(52) U.S. Cl. .......................................... 174/251; 174/36

(58) Field of Classification Search .................. 174/251, 174/70 R, 72 R, 72 A, 36; 439/63, 83; 361/760
See application file for complete search history.

(56) References Cited

U.S. PATENT DOCUMENTS

| | | | |
|---|---|---|---|
| 3,872,236 A | | 3/1975 | Sewngle et al. |
| 4,588,241 A | * | 5/1986 | Ardezzone .................... 439/581 |
| 4,679,321 A | * | 7/1987 | Plonski ........................... 29/850 |
| 5,046,966 A | * | 9/1991 | Snyder et al. ................. 439/579 |
| 5,167,512 A | * | 12/1992 | Walkup ............................ 439/66 |
| 5,400,003 A | | 3/1995 | Kledzik |
| 5,689,216 A | | 11/1997 | Sturdivant |
| 6,208,526 B1 | | 3/2001 | Griffin et al. |
| 6,218,621 B1 | * | 4/2001 | Kuczynski ................ 174/110 R |
| 6,295,724 B1 | | 10/2001 | Crudo et al. |
| 6,476,316 B1 | | 11/2002 | Elco |

(Continued)

FOREIGN PATENT DOCUMENTS

EP  0 150 327  8/1985

(Continued)

OTHER PUBLICATIONS

Voss, Bernard, "Routing High Bit-Rate Connectors: The Physical characteristics and routing tradeoffs of using 3.125 Gb/s," Printed Circuit Design & Mfg., Jun. 2003, p. 30.

*Primary Examiner* — Yuriy Semenenko

(74) *Attorney, Agent, or Firm* — Myers Bigel Sibley & Sajovec, P.A.

(57) ABSTRACT

An assembly for conducting an electronic signal. The assembly includes a substrate and an electronic cable. The substrate has distinct first and second regions to enable connection to first and second circuit boards, respectively. First and second through-holes are formed in the substrate in the first and second regions, respectively. The electronic cable is disposed within the first through-hole and extends out of the first through hole, adjacent the substrate and into the second through-hole.

18 Claims, 38 Drawing Sheets

U.S. PATENT DOCUMENTS

2002/0094705 A1 7/2002 Driscoll et al.
2003/0045139 A1* 3/2003 Hanson ........................... 439/82
2004/0094328 A1* 5/2004 Fjelstad et al. ................ 174/251
2004/0149490 A1 8/2004 Chang et al.
2008/0139045 A1* 6/2008 Ho ................................ 439/578

FOREIGN PATENT DOCUMENTS

WO     WO 8802560     4/1988
WO     PCT/US03/033672     4/2004

* cited by examiner

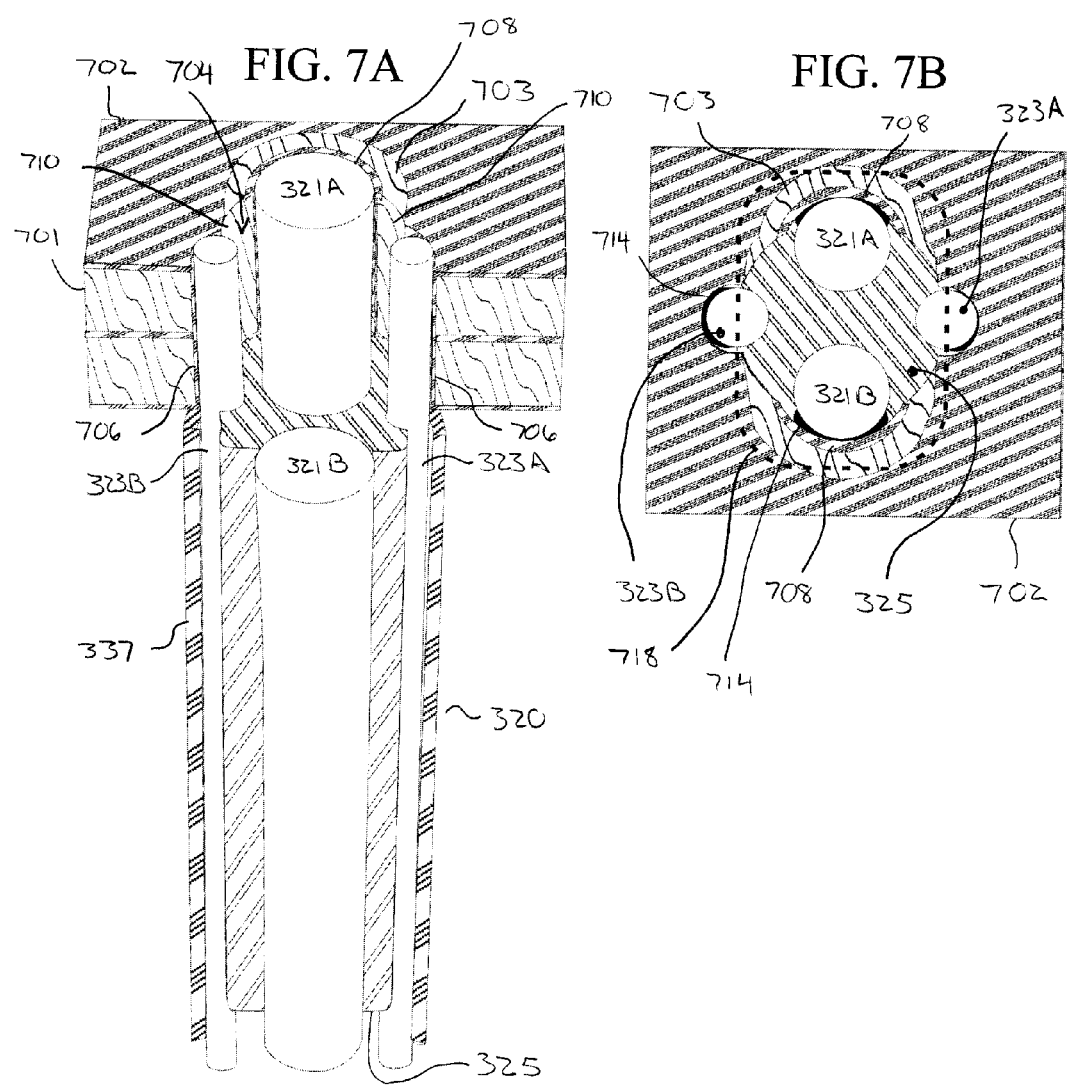

CABLED SIGNALING SYSTEM AND COMPONENTS THEREOF

CROSS-REFERENCE TO RELATED APPLICATIONS

This application is a divisional application of U.S. patent application Ser. No. 10/659,210, filed Sep. 9, 2003 now abandoned, which claims the benefit of the following U.S. Provisional Applications:

| Application Ser. No. | Filing Date |
| --- | --- |
| 60/427,276 | Nov. 16, 2002 |
| 60/431,492 | Dec. 6, 2002 |
| 60/462,485 | Apr. 11, 2003 |
| 60/477,856 | Jun. 11, 2003 |
| 60/483,571 | Jun. 26, 2003 | all of which provisional and non provisional applications are hereby incorporated by reference.

FIELD OF THE INVENTION

The present invention relates generally to the field of electronic signal transmission, and more particularly to interconnection structures for high speed electronic signaling.

BACKGROUND

Telecommunications devices such as network switches and routers typically include various line cards and switch cards mounted to a backplane and electrically interconnected through metal traces printed on the backplane. Due to the immense number of interconnections demanded by modern switching and routing applications, the present generation of backplane products are complex structures having as many as 40 or more metal layers. Such structures tend to be difficult to manufacture and expensive, as any small deviation from design specifications can render them useless.

FIG. 1 illustrates a prior-art backplane-based interconnection system 100 including a multi-layer backplane 101 and a pair of daughterboards 103A, 103B. To establish interconnections between the daughterboards 103A, 103B, metal traces 113 are printed on the various backplane layers and routed between respective via pairs (e.g. 111A, 111B). Metal pins 123 inserted in the vias form projecting contacts that extend from the backplane 101 into a connector socket 121. Each of the daughterboards 103A, 103B includes a printed circuit board (PCB) 119 and edge connector 105, the edge connector 105 having conductive receptacles 109 to receive the pins 123 projecting from the backplane 101. The receptacles 109 are electrically coupled to traces 117 within the PCB 119 by conductive members 107 which extend into trace-coupled vias 115. Ultimately, the PCB traces 117 extend to far-end vias which enable connection to contacts of an integrated circuit (IC) device (not shown), the IC device itself including an IC die (i.e., chip) disposed within an IC package and having signal routing paths that extend from package contacts to the chip. Thus, a signal transmitted over the interconnection system 100 passes from chip to package to PCB 119, through PCB trace 117 to connector 105, from the connector 105 to the backplane 101, through backplane trace 113 to another daughterboard connector at which the path back to the recipient chip is replicated in reverse.

The signaling bandwidth that can be achieved in the interconnection system 100 is limited by a number of factors. For example, various sources of impedance discontinuities (e.g., at the IC package interface and daughterboard connectors 105) reflect electrical energy back to the source, adding or subtracting from the incident signal and thereby increasing the noise to signal ratio. One of the most troublesome sources of impedance discontinuity is the via stub, the extension of a conductive via beyond the trace connection at a given backplane layer, as shown at 127. Although back-drilling may be used to remove the offending metal, such operations tend to be expensive and time consuming as the drilling depth varies from via to via according to the trace contact point and requires precise control to avoid destroying the via-to-trace junction.

Another bandwidth-limiting phenomenon is signal loss in the conductive traces 113, 117 disposed on the substrate layers of the backplane 101 and PCBs 119. Total signal loss is the result of conductor loss and dielectric loss and therefore depends both on the thickness and width of the signal traces and the dielectric properties of the substrate material. Moreover, control of the width of the signal traces is critical to performance lest more discontinuities be introduced. The thickness and width of the signal traces are normally limited due to manufacturing and design constraints and the substrate materials that are easiest to manufacture with are not always the ones with the best dielectric properties for high speed signal transmission.

Crosstalk is another source of noise in the interconnection system 100 and results from inductive or capacitive coupling of signals propagating on neighboring traces and other signal path elements. Crosstalk increases as the various backplane traces 113, PCB traces 117, and connector contacts become more densely routed, and typically limits the total number of signal paths that can be supported by the interconnection system 100 at a given operating frequency.

Timing skew is another phenomenon that can affect signal bandwidth in the interconnection system 100 and results from unequal propagation times on different signal paths. Timing skew is particularly problematic in differential signaling systems, as non-simultaneous arrival of differential signals distorts the differential relationship, potentially causing reception errors. Consequently, significant time and effort are typically expended to establish equal-length differential signaling paths, such efforts often necessitating additional substrate layers in the backplane 101.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 7A and 7B illustrate the disposition of a multi-conductor cable within a through-hole of a backplane according to one embodiment;

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa.

In interconnection systems and components of the present invention, impedance discontinuities, signal loss, crosstalk and timing skew are substantially reduced by routing high-speed electronic signals through electronic cables that serve as replacements for traces printed on a backplane or other printed circuit board. For example, in one embodiment, backplane traces are replaced by shielded differential-pair cables that extend directly between connector interfaces, avoiding via stubs and dielectric loss through the backplane laminates. Each cable is cut perpendicularly to its length so that the signal path traversed by each signal of a differential pair is substantially identical, assuring virtually simultaneous propagation time through the cable and thereby reducing end-to-end timing skew. In other embodiments, cables are routed directly from electrical connectors to IC package contacts, thereby avoiding via stubs and dielectric loss in the daughterboard assemblies. In yet other embodiments, novel electrical connectors are used to reduce impedance discontinuities in board-to-board, cable-to-board and cable-to-cable interconnections.

Figure 1:
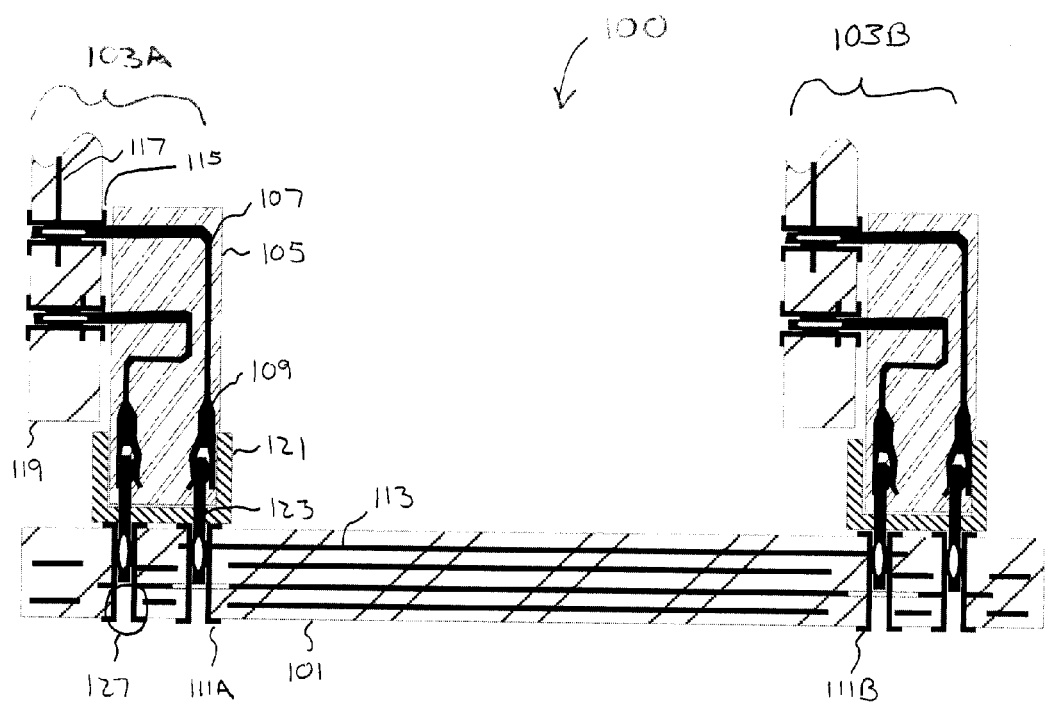
FIG. 1 illustrates a prior-art backplane-based interconnection system.
Figure 2A:
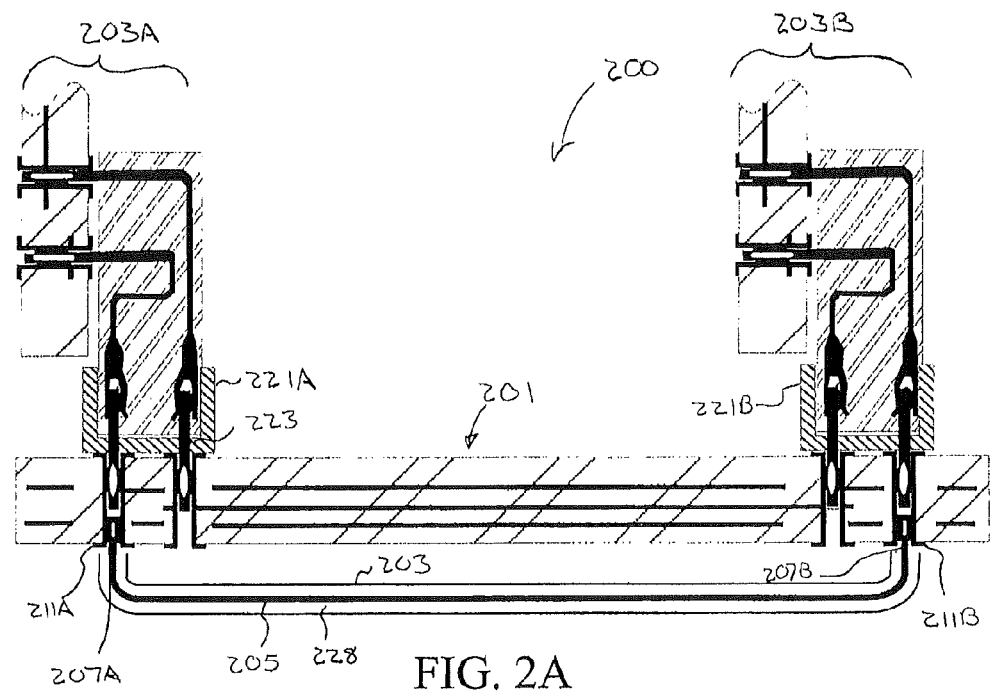
FIG. 2A illustrates an interconnection system according to an embodiment of the invention.

FIG. 2A illustrates an interconnection system 200 according to an embodiment of the invention. The interconnection system 200 includes a backplane 201 and a pair of daughterboards 203A and 203B. The backplane 201 includes connector interfaces formed by conductive pins 223 (or posts) inserted into conductive vias 211A and 211B and projecting into connector sockets 221A and 221B. Although two connector interfaces are shown in FIG. 2A, the interconnection system 200 may have any number of connector interfaces to enable connection to additional daughterboards.

In the interconnection system 200 of FIG. 2A, one or more high speed signaling paths are formed by cabled electrical connections between backplane vias instead of conductive traces formed on the backplane 201. For example, cable 203 extends outside the backplane 201 between vias 211A and 211B, and includes an electronic conductor 205 (i.e., conductor of electric current) electrically coupled at opposite ends to the vias 211A and 211B to establish a signaling path. In contrast to a conductive trace disposed on a submerged backplane layer, the conductor 205 is coupled to endpoints of the conductive vias 211A, 211B, and therefore does not form a reflection-inducing via stub. The cable 203 may be formed using conventional manufacturing techniques to ensure substantially constant impedance along its length, thereby reducing impedance continuity relative to typical conductive traces. Also, an insulating material having a low-dielectric-constant is disposed about the conductor 205 over the length of the cable 203, substantially reducing dielectric loss relative to conductive traces disposed on conventional backplane substrates. Further, a conductive shield may be disposed about the conductor 205 over the length of the cable 203 to reduce inductive and capacitive coupling of signals carried on neighboring cables, thus reducing crosstalk relative to unshielded backplane traces. Also, in differential signaling systems, two-conductor cables (e.g., twin-axial cables, coaxial cables, twisted pair cables, etc.) may be used to carry the differential signals in a single cable. Such cables may be cut perpendicularly to their lengths at each end, thereby ensuring equal-length signaling paths for the differential signals and reducing overall timing skew in the signaling path. In an alternative embodiment, separate cables may be used to carry the differential signals with the cables being cut to equal lengths before being secured to respective contact points on the backplane 201.

Reflecting on the interconnection system 200, it can be seen that, by replacing backplane traces with cable-based high-speed signaling paths, the number of conductive traces required within the backplane 201 may be substantially reduced. The number of substrate layers required in the backplane 201 may be correspondingly reduced, substantially lowering manufacturing cost and increasing yield. In an extreme case, no interconnections need be made through backplane traces, enabling use of a single substrate layer to provide a mounting surface for the daughterboards 203A and 203B and via interconnections to cabled signaling paths, but with no printed (or etched) traces required. Alternatively, power connections (supply and ground voltages) may be provided by conductive traces or conductive planes printed on the substrate, and/or non-speed-critical signals may be routed between connectors via conventional backplane traces. Segregating connector embodiments that provide separate interconnections for speed-critical and non-speed-critical signal paths are described below.

Still referring to FIG. 2A, the cable-to-via connections may be established in a number of ways. In one embodiment, terminal portions 207A and 207B of the conductor 205 extend beyond either end of the cable housing 228 and are soldered to the vias 211A and 211B, respectively. Alternatively, the terminal portions of the conductor 205 may be swaged or otherwise formed into press-fit elements that are frictionally secured within the vias 211A and 211B. Retaining hardware may also be used to maintain the terminal portions of the conductor 205 in contact with the vias 211A and 211B. More generally, any type of electrical connection between the ends of conductor 205 and the vias 211A, 211B may be used. Also, it should be noted that the vias 211A, 211B may be filled with solder or conductive material (i.e., plated through-holes filled with solder), rather than being open from end-to-end.

Figure 2B:
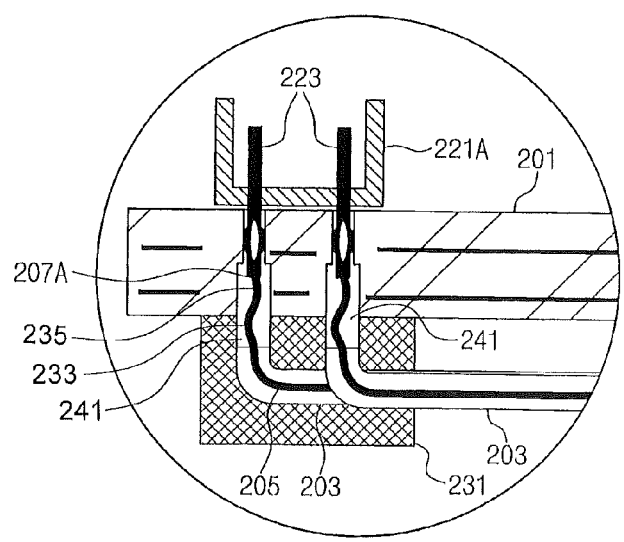
FIG. 2B illustrates an alternative embodiment for establishing contact between the cable conductors and pins that project into a connector socket.

FIG. 2B illustrates an alternative embodiment for establishing electrical connection between the conductors 205 of cables 203 and the pins 223 that project into connector socket 221. Rather than inserting the pins 223 into conductive backplane vias as shown in FIG. 2A, the pins are secured within non-plated through-holes 241 in the backplane 201 and a capture member 231 is used to secure the cables 203 in position beneath the through-holes 241. Bends 233 and 235 are formed in the cable conductors 203 to form integral-spring structures that urge against the projecting pins 223.

Figure 2C:
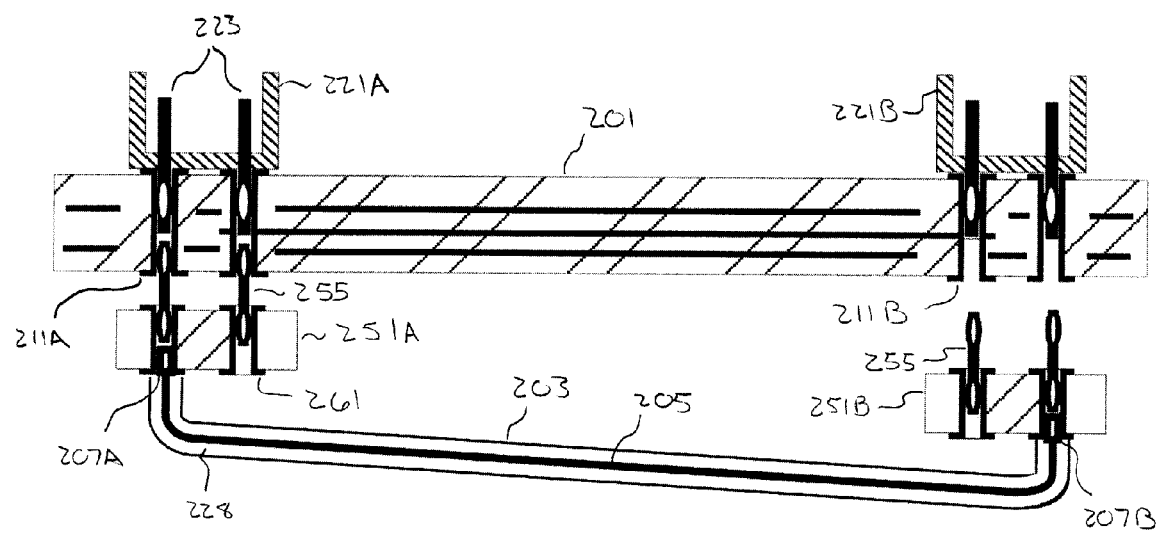
FIG. 2C illustrates another alternative embodiment for establishing contact between the cable conductors and pins that project into a connector socket.

FIG. 2C illustrates another alternative embodiment for establishing electrical connection between the conductors 205 of cables 203 and the pins 223 that project into connector socket 221. Header elements 251A and 251B are provided to receive the cables 203 and establish electrical connection between the cable conductors 305 and the conductive vias 211A and 211B of the backplane 201. In the embodiment shown, each of the header elements 251A, 251B includes conductive vias 261 having pins 255 disposed therein. The pins 255 project out of the header vias 261 and are inserted into the vias 211A, 211B of the backplane. In one embodiment, terminal portions 207A and 207B of the cable conductors 205 extend beyond either end of the cable housing 228 and are soldered to the vias 261 of headers 251A and 251B. Alternatively, the terminal portions of the conductors 205 may be swaged or otherwise formed into press-fit elements that are frictionally secured within the vias 261. Retaining hardware may also be used to maintain the terminal portions of the conductors 205 in contact with the vias 261. More generally, any type of electrical connection between the ends of conductors 205 and the vias 261 may be used.

Virtually any electronic cable may be used to implement the cable 203 of FIGS. 2A and 2B. The expression electronic cable is used herein to mean a flexible structure having at least one electronic conductor enveloped along its length by an insulating material. The insulating material preferably has a low dielectric constant (e.g., three or lower, though materials having higher dielectric constants may be used), and may be disposed continuously along the length of the cable or at predetermined intervals. For example, in one cable embodiment, a signal carrying conductor is centered within a shield and/or cable housing by support rings disposed at regular intervals and with air or other low-dielectric-constant material enveloping the conductor in the regions between support rings. Alternatively, a support material may be spiral wrapped about one or more signal carrying conductors to achieve a gap between the signal carrying conductors and a shield and/or cable housing. The gap may be filled with air or other low-dielectric-constant material.

Figures 3A, 3B, 3C:
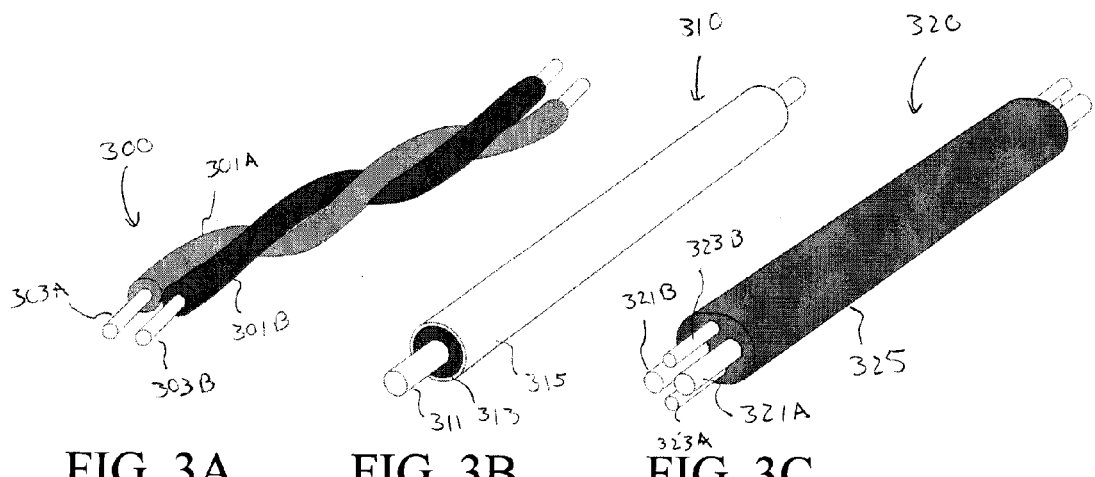
FIGS. 3A-3E illustrate various electronic cables that may be used in embodiments of the invention.

In differential signaling embodiments, various multi-conductor cables may be used to carry the differential signal pair. FIG. 3A, for example, illustrates a twisted pair cable 300 that may be used, the twisted pair cable 300 including conductors 303A, 303B insulated by respective insulators 301A and 301B, and optionally including a shielding material (not shown) such as a metal foil or wire braid disposed about the insulated conductors. In other embodiments, three or more insulated conductors may be twisted together to form a cable for carrying differential signals and one or more return signals.

FIG. 3B illustrates a coaxial cable 310 that may be used to carry a differential signal pair, the coaxial cable having a center conductor 311 and concentric outer conductor 315, separated by an insulator 313 that extends along the length of the cable. The center conductor 311 and outer conductor 315 may be used to carry respective signals of the differential signal pair, or two coaxial cables may be used, the center conductor of each coaxial cable carrying a respective signal of the differential signal pair, and the outer conductors being used as return conductors or shields.

FIG. 3C illustrates a multi-conductor cable 325 having a pair of primary conductors 321A and 321B that may be used to carry a differential signal pair, and having a pair of secondary conductors 323A and 323B that may be used to carry return signals (i.e., current flowing in the opposite direction of current flowing on the primary conductors to complete the transmission circuit). In the embodiment of FIG. 3C each of the primary and second conductors is housed within a low-dielectric-constant housing 325 that maintains the conductors in position relative to one another.

Figures 3D, 3E:
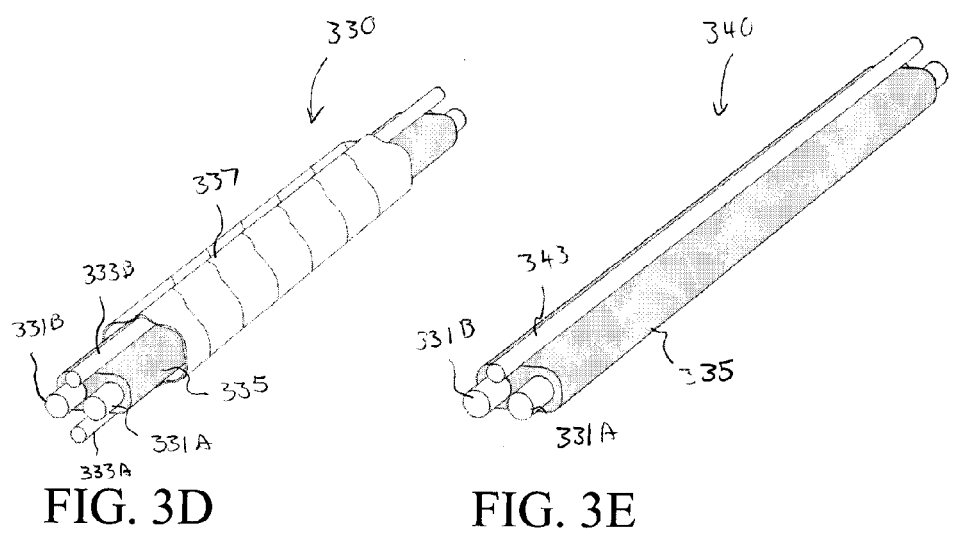

FIG. 3D illustrates a twin-axial cable 330 embodiment having a pair of primary conductors 331A and 331B that extend parallel to one another within a insulating material 335. Secondary conductors 333A and 333B are disposed above and below the insulating material 335, and a shielding material 337 (e.g., metal foil or metal braid) is disposed about the cable in contact with the secondary conductors 333A and 333B. In an alternative embodiment, an insulating material may be disposed between the secondary conductors and the shielding material 337, or the shielding material 337 may be omitted altogether. In a differential signaling embodiment, the primary conductors 331A and 331B may be used to carry the differential signal pair, and the secondary conductors 333A and 333B used to carry return signals. A cable housing or cover, not show in FIG. 3D, may be disposed about the shielding material 337.

FIG. 3E illustrates an alternative twin-axial cable embodiment 340 having primary conductors 331A, 331B and insulating material 335 disposed in the same manner as in FIG. 3D, but having only a single secondary conductor 343. Alternatively, the secondary conductor 343 may be wrapped around the insulating material 335 along the length of the cable. In a differential signaling embodiment, the primary conductors 331A and 331B may be used to carry the differential signal pair, and the secondary conductor 343 used to carry the corresponding return signals. The twin-axial cable 340 may additionally include a shielding material as shown and described in reference to FIG. 3D, and a cable housing or cover.

Numerous other types of cables may be used as backplane trace replacements (or trace replacements for other printed circuit boards) including, without limitation, flex cables having any number of conductors per flex row and any number of flex cable layers.

Figure 4A:
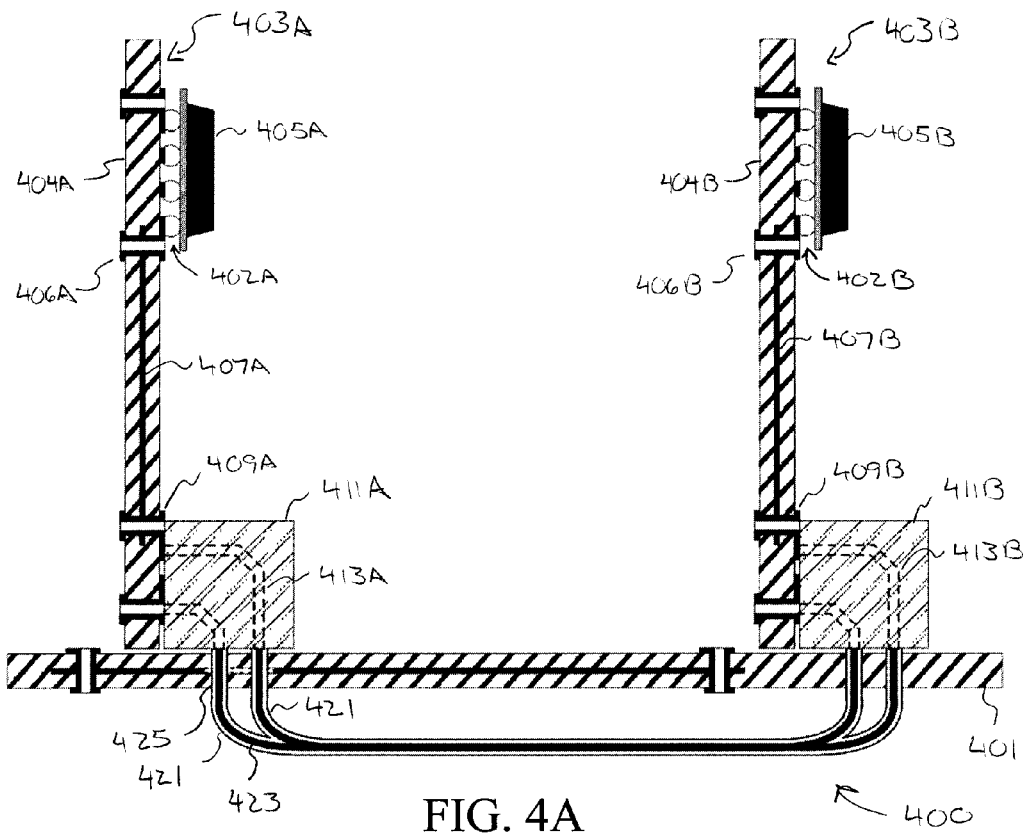
FIG. 4A illustrates an interconnection system according to an alternative embodiment of the invention.

FIG. 4A illustrates an interconnection system 400 according to an alternative embodiment of the invention. The interconnection system includes daughterboard 403A, 403B, backplane 401 and cables 421. Each of the daughterboards includes an IC device 405A, 405B mounted to a PCB 404A, 404B and having contacts 402A, 402B electrically coupled to conductive traces 407A, 407B in the PCB by conductive vias 406A, 406B. Each of the daughterboards 403A, 403B additionally includes a connectors 411A, 411B having conductive elements 413A, 413B coupled to the traces 407A, 407B through vias 409A and 409B. In contrast to FIG. 2A in which backplane vias are used to bridge between daughterboard connectors and backplane-connected cables, a set of cables 421 are disposed within through-holes 425 in the backplane 401 such that the cable conductors 423 themselves provide conductive landings for counterpart contacts within daughterboard connectors 411A and 411B. By removing backplane vias from the cabled signaling path, a potential source of impedance discontinuity is avoided. Also, because the connector contacts land directly on the conductors of the cables, the projecting pins 223 of FIG. 2A are also omitted, avoiding another potential impedance discontinuity. As in the embodiment of FIG. 2A, high-speed signals propagate through controlled impedance, low-dielectric-constant cables 421 rather than relatively lossy backplane traces, and therefore exhibit less signal attenuation and dispersion upon arrival at their destinations. Conductive shielding may be provided within the cables 421 (e.g., shield disposed about one or more conductors along the length of the cables) to reduce crosstalk and thereby enabling a closely packed set of cables to be extended between the connectors 411A and 411B. Also, as discussed above, each of the cables 421 may be cut perpendicularly to length so that differential signals propagating on different conductors 423 within the cable 421 exhibit substantially identical propagation delays between connectors 411A and 411B, thereby reducing timing skew in the end-to-end signaling paths. In signaling systems in which simultaneous (i.e., non-skewed) arrival of multiple arbitrarily related signals is important (e.g., as where a set of 4, 8, 16, 32, 64, 128, or more signals are sampled in response to a common timing reference such as a sampling clock signal or strobe), the cables may be cut to length to achieve substantially equal propagation delays between signals propagating on different cables. Thus, overall, the cabled signaling system of FIG. 4A has fewer impedance discontinuities and lower dielectric loss than signaling paths formed by via-connected backplane traces, and exhibits relatively low degrees of crosstalk and timing skew, thereby enabling potentially higher signaling rates than in the prior-art signaling system 100. Signaling rates between 10-20 GHz have been demonstrated in prototype testing, and simulation results indicate that signaling rates up to 40 GHz and potentially higher are achievable. Also, because signal attenuation is reduced in the low-loss signaling path established through the cable (i.e., relative to more lossy paths such as conductive traces disposed on FR4 or other backplane substrates), smaller output signal swings may be generated by the transmitting device without loss of signal at the receiving device. This is a significant benefit, providing headroom for further reduction of supply voltages in the face of shrinking process geometries. Also, as discussed in reference to FIG. 2A, by replacing printed traces with cables, backplane layer count may be reduced, simplifying manufacturing and reducing cost (improving yield and increasing reliability).

Figure 4B:
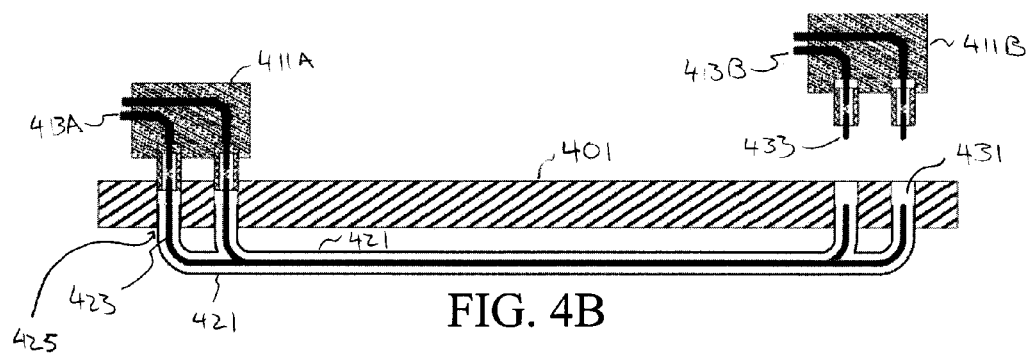
FIGS. 4B and 4C illustrate alternative backplane assemblies having recessed cable conductor contacts.
Figure 4C:
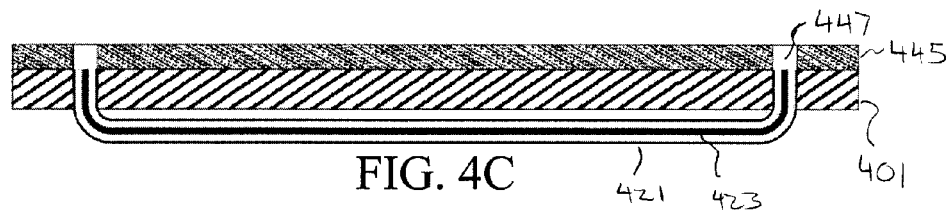

Referring to FIG. 4B, cables 421 may alternatively be recessed within the through-holes 425 of backplane 401, thereby forming cavities 431. Spring assemblies 433 may be secured to the conductive elements 413A, 413B within connectors 411A, 411B and inserted into the cavities 431 to make contact with flat or chamfered ends o the cable conductors 422. As shown in FIG. 4C, cavities 447 for receiving connector contacts may be formed by securing or molding a layer of material 445 over backplane 401 before or after cables 421 have been disposed in the through-holes 425.

Referring to FIGS. 4A-4C, it should be noted that while metal-to-metal contact may be established between connector contacts and landings formed by the conductors 423 of cables 421, capacitively coupled connections (i.e., AC-coupled signal path) may be established between connector contacts and conductors 423 by interposing a thin layer of dielectric material (e.g., paper, nylon or other material) or air or other gas between the connector contacts and contact surfaces of conductors 423. Referring to FIG. 4A, for example, a thin layer of dielectric material may be disposed on the surface of the backplane 401 over the cable conductors 423 to establish the AC-coupling between conductive elements 413A, 413B and conductors 423. In the embodiment of FIGS. 4B and 4C, dielectric material may be disposed within the cavities 431 and 447, respectively. In all such embodiments, the thickness and dielectric constant of the dielectric material may be selected to achieve the capacitance needed for a given signaling application. While direct-contact conductive surfaces are described in interconnection system embodiments below, in all such embodiments, dielectric interposers may alternatively be disposed between contact surfaces to establish AC-coupled signal paths.

Figure 5:
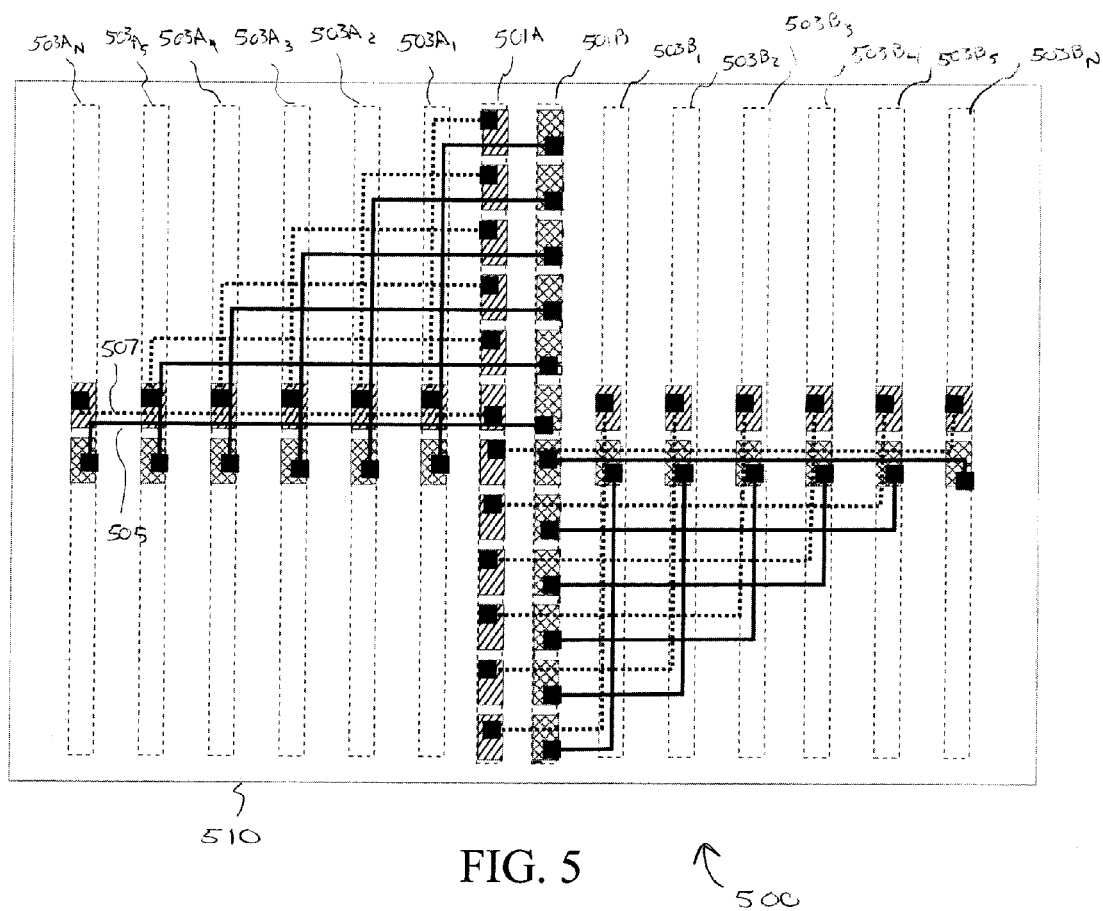
FIG. 5 illustrates a signal routing arrangement in a cabled-backplane interconnection system.

FIG. 5 illustrates a signal routing arrangement in a cabled-backplane interconnection system 500 having a backplane 510 and a plurality of daughterboard interfaces. In the embodiment shown, central daughterboard interfaces 501A and 501B are coupled to primary and secondary switching cards (not shown), the secondary switching card serving as a backup in the event of primary switching card failure. Daughterboard interfaces $503A_1$-$503A_N$ and $503B_1$-$503B_N$ are coupled to respective line cards (not shown), and are each coupled to both of the central daughterboard interfaces 501A and 501B through respective sets of electronic cables. For example, a primary set of N cables coupled between daughterboard interfaces 503A$_1$ and 501A is shown as a single bold line 505 in FIG. 5. A redundant set of N cables coupled between the daughterboard interfaces 503A$_1$ and 501B is shown as a dashed line 507. Primary and redundant cable sets coupled between interfaces 501A and 501B, respectively, and other daughterboard interfaces 503A$_2$-503A$_N$ and 503B$_1$-503B$_N$ are similarly shown as bold lines and dashed lines.

In some applications, it is desirable for the signal paths between the line cards and the switching cards to have identical electrical lengths (e.g., so that network traffic arrives at the switching cards in distinct, non-overlapping time slots). By using the cabled interconnections described in reference to FIGS. 2 and 4, substantially identical electrical-length signaling paths may be established relatively easily and without requiring large numbers of backplane substrate layers. The cables used to form the interconnects may be cut to identical lengths, then routed between the desired daughterboard interfaces. Note that the cable sets 505 and 507 illustrated in FIG. 5 are rendered with right angle bends to demonstrate the same-length cabled paths. Once cut to desired lengths, the cable sets 505 and 507 may be extended directly between interconnection points or routed as necessary to enable the desired cabled connections. That is, cables longer than required to extend between backplane connection points may have any number of turns or bends as necessary to consume the excess cable length.

Figure 6A:
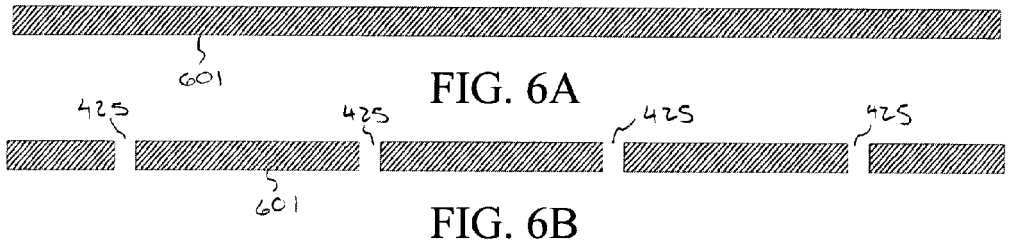
FIGS. 6A-6E illustrate a manufacturing process that may be used to produce the cabled backplane of FIG. 4A.
Figure 6B:
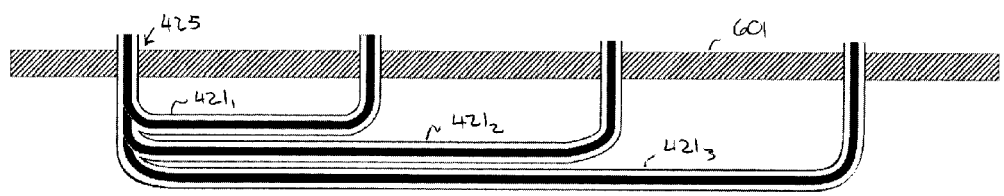
Figure 6C:
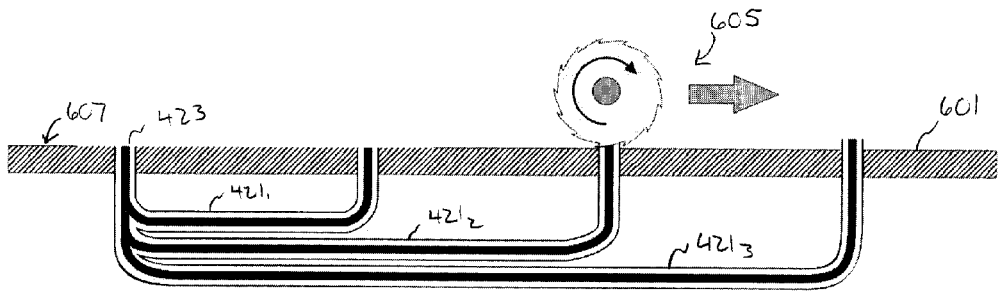
Figure 6D:
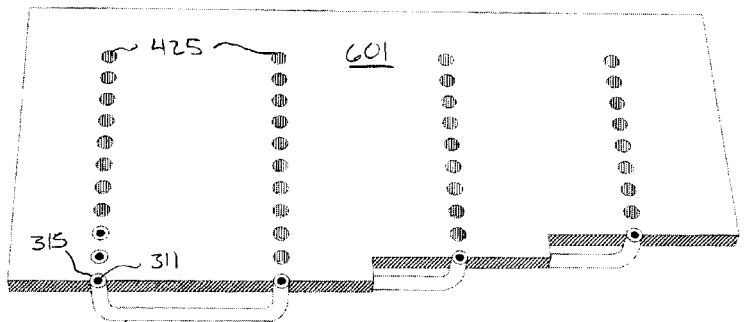
Figure 6E:
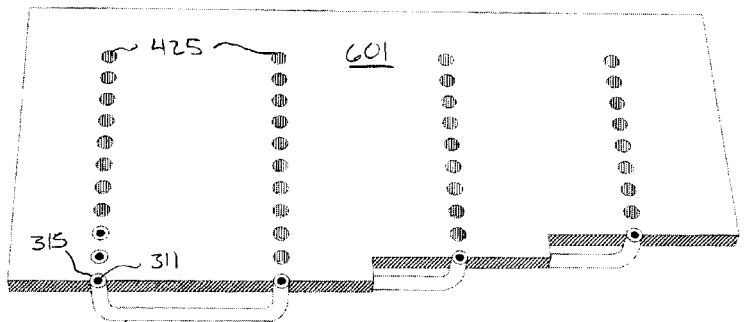

FIGS. 6A-6E illustrates a manufacturing process that may be used to produce the cabled backplane of FIG. 4A. Starting with the substrate 601 shown in FIG. 6A (which may be a multi-layer substrate having contacts for low-speed signals, power and ground disposed thereon), through-holes 425 are formed as shown in FIG. 6B, for example through drilling or punching. Referring to FIG. 6C, cables 421$_1$-421$_3$ are inserted into the through-holes 425, with each cable (or set of cables) extending between respective connector regions. The cables 421$_1$-421$_3$ are then cut as shown at 605 of FIG. 6D such that the cable conductors are substantially flush with a surface 607 of the backplane 601. As discussed in reference to FIGS. 4B and 4C, the cables 421 may alternatively be recessed within the through-holes 425, or an additional substrate layer may be added after the cables are cut to achieve a recessed area into which spring-contacts may extend. In alternative embodiments, the cables may be cut prior to insertion within the through-holes 425, then inserted into the through-holes 425 such that the conductors are recessed within the through-holes 425, flush with the backplane surface 607, or project above the through-holes 425. Also, the cable may be stripped such that the cable conductor 423 projects beyond other components of the cable (e.g., insulating cover, insulating inner layer, shield etc.). The cable conductor 423 may also project above the backplane surface 607. Referring to the perspective view of FIG. 6E, the through-holes 425 may be shaped to receive round cables 421 (e.g., coaxial cables having a center conductor 311 and outer conductor 315) or may have other shapes according to the type of cable used. As discussed above, virtually any electronic cable may be used to establish signal paths between backplane regions.

FIGS. 7A and 7B illustrate the disposition of a multi-conductor cable 320 within a through-hole 704 of a backplane 701 according to one embodiment. Referring first to the perspective view of FIG. 7A, the backplane 701 includes a layer of conductive material 702 to establish a ground plane. The through-hole 704 includes plated sidewall regions 706 and 708, with sidewall regions 706 being coupled to the ground plane formed by layer 702. Sidewall regions 708 (only one of which is shown in FIG. 7A) are electrically isolated from the ground plane by etched region 703 and are electrically isolated from regions 706 by non-plated sidewall regions 710. Return conductors 323A and 323B of cable 320 are soldered or otherwise electrically coupled to sidewall regions 706, while counterpart signal carrying conductors 321A and 321B are soldered or otherwise electrically coupled to sidewall regions 708 (solder being shown by shaded regions 714 in FIG. 7B). The return conductors 323A, 323B and signal conductors 321A, 321B are held in position relative to one another by insulator 325. A shield 337 is disposed about the outer perimeter of the cable 320, with the shield 337 being disposed in contact with the return conductors 323A and 323B, but electrically isolated from signal conductors 321A and 321B by insulator 325. The dashed line 718 in FIG. 7B illustrates the outline of the insulator 325 before being stripped away to enable the signal conductors 321A, 321B to be soldered or otherwise secured to the sidewall regions 708. Thus, the return conductors 323A, 323B are grounded, the signal conductors 321A and 321B isolated from ground, and all the conductors 323, 321 are secured (e.g., by solder or friction connection to the plated sidewall regions 706 and 708) within the through-hole 704 to establish landings for counterpart contacts of a connector. Other constructs may be used to secure cables within through-holes of a backplane or other PCB in alternative embodiments.

Modular Backplane-Based Interconnection System

Figure 8:
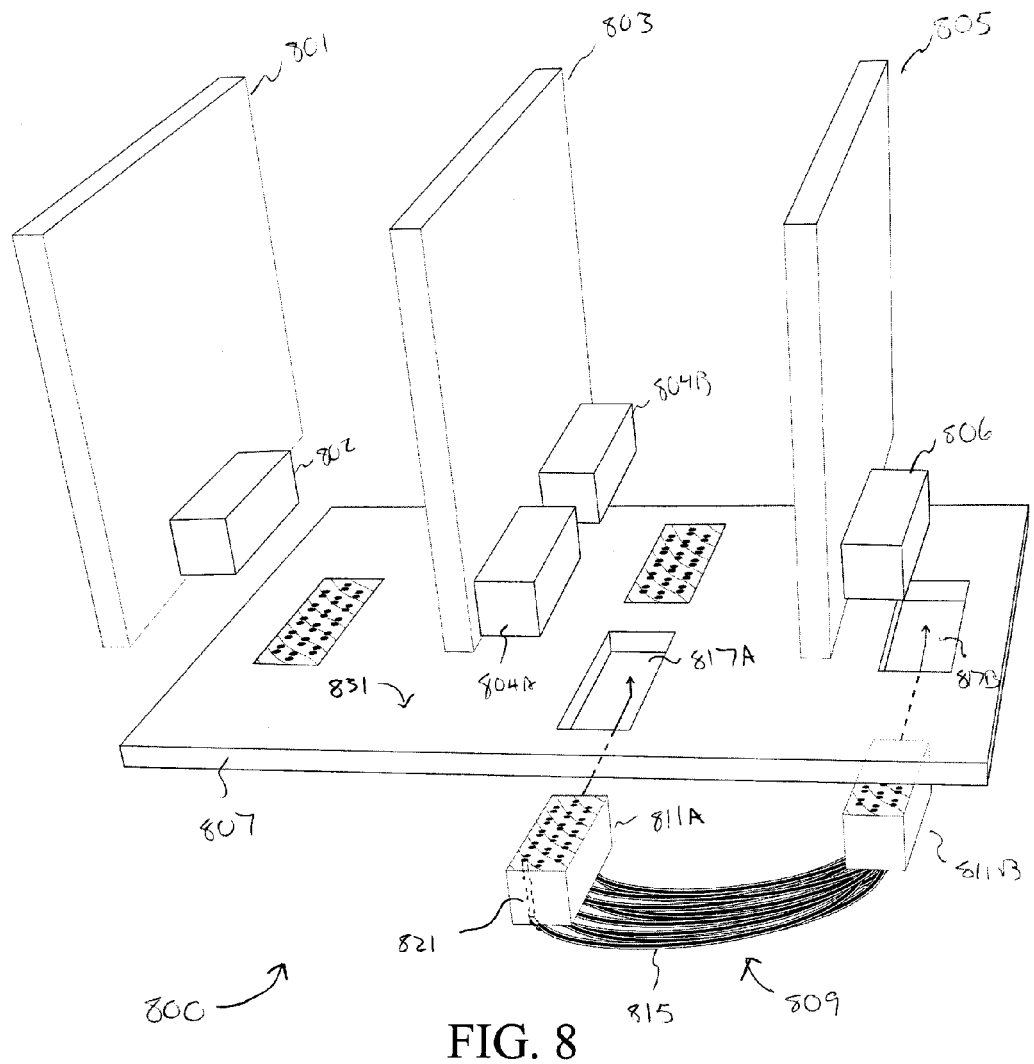
FIG. 8 is an exploded view of a backplane-based interconnection system according to another embodiment of the invention.

FIG. 8 is an exploded view of a backplane-based interconnection system 800 according to another embodiment of the invention. The interconnection system 800 includes a backplane, daughterboards 801, 803, 805 adapted for removable connection to a backplane 807, and cabled connector assemblies 809 secured within openings 817A, 817B in the backplane 807. Each of the cabled connector assemblies 809 includes a pair of capture blocks 811A, 811B having through-holes 821 formed therein, and a set of cables 815 extending between the capture blocks 811A, 811B and having ends disposed within the through-holes 821. In one embodiment, all the cables of a given cable set 815 are cut to equal lengths, and the ends of each cable are inserted into through-holes 821 within the capture blocks 811A and 811B, respectively, such that the cable conductor (or conductors) forms a landing for a corresponding contact of a daughterboard connector. The cables may be secured within the through-holes 821 of the capture blocks 811A, 811B using an adhesive material, by friction, or by mechanical holding elements (e.g., teeth) or openings 817A, 817B may be tapered to accept tapered-bodied capture blocks or oversized capture blocks. Alternatively, the capture blocks 811A, 811B may have flanged bottom surfaces to prevent push through.

The capture blocks 811A, 811B may be formed using portions of the backplane that are removed (i.e., cut-out or stamped out) to form the openings 817A, 817B. In an alternative embodiment, a cable set 815 is secured within a mechanism that holds the constituent cables parallel to one another and the capture blocks 811A and 811B are molded about the cable set 815 at desired distances from one another. The portions of the cable extending beyond the molded capture blocks 811A, 811B are then cut to expose the cable conductors at the faces of the capture blocks. In one embodiment, all the cable assemblies 809 within the backplane interconnection system 800 have identical-length cables. Alternatively, the various cable assemblies 809 may be manufactured in different lengths according to application needs.

Once formed, the cable assemblies 809 are secured within a pair of backplane openings such that the contact face of each capture block 811A, 811B is substantially flush with the surface 831 of the backplane 807. Thus, when fully assembled, the interconnection system 800 is electrically identical to the interconnection system of FIG. 4A. As with the backplane 401 of FIG. 4A, the backplane 807 may have any number of printed traces to carry supply voltages, and non-speed-critical signals. One or more of the daughterboard connectors 804A, 806 may be larger than the counterpart openings 817A, 817B such that some of the connector contacts mate with printed pads on the backplane 807 and others of the contacts mate with landings formed by the cable conductors. Alternatively, separate daughterboard connectors may be provided to establish contact with conductive pads on the backplane 807 for purposes of receiving power and/or transmitting or receiving non-speed-critical signals. Also, rather than using cable conductors to form landings at the surfaces of the capture blocks 811A, 811B, the cable conductors may be electrically coupled to conductive vias within the capture blocks as described in reference to FIG. 2A, thereby enabling projecting-pin connectors to be used. In such an embodiment, the conductive vias may be formed by plating the through-holes within the capture blocks 811A, 811B, inserting the connector pins into the vias, then securing the connector socket (e.g., element 221 of FIG. 2A) to the surface of the capture block 811A, 811B. Alternatively, the connector socket may be secured to the surface of the backplane 807 and the pins inserted into the plated vias of the capture blocks 811A, 811B and inserted through the underside of the connector housing when the capture blocks 811A, 811B are secured within openings 817A, 817B. In such an embodiment, the capture blocks 811A, 811B may carry less than the full complement of connector pins, with the remaining connector pins being inserted into conductive vias formed within the backplane 807 itself.

Reflecting on the interconnection system of FIG. 8, it can be seen that the cable assemblies 809 and backplane 807 may be manufactured separately, then integrated in a subsequent manufacturing operation to form a backplane assembly. This provides potential manufacturing advantages as different parties may manufacture and test the cable assemblies 809 and backplane 807, another party may integrate the cable assemblies 809 and backplane 807, and yet another party may integrate the daughterboards 801, 803, 805 and backplane assembly. Also, if any of the cable assemblies 809 is determined to be defective after integration with the backplane 807, the defective cable assemblies 809 may simply be replaced without having to discard the entire backplane assembly. As in the backplane-based interconnection systems described in reference to FIGS. 2A and 4, virtually any type of electronic cable may be used in the cable assemblies 809.

Still referring to FIG. 8, in an alternative embodiment, the cable assemblies may be formed by extending cables 815 through the openings 817A and 817B then forming molded capture blocks 811A and 811B within the openings 817A and 817B, respectively, to secure the cables 815 in position. Once molded into position within the openings 817A, 817B, the cables 815 may be cut to expose the cable conductors at the surface of the capture blocks 811A and 811B, thereby providing landings for counterpart contacts within the daughterboard connectors 802, 804A, 804B, 806.

Figure 9A:
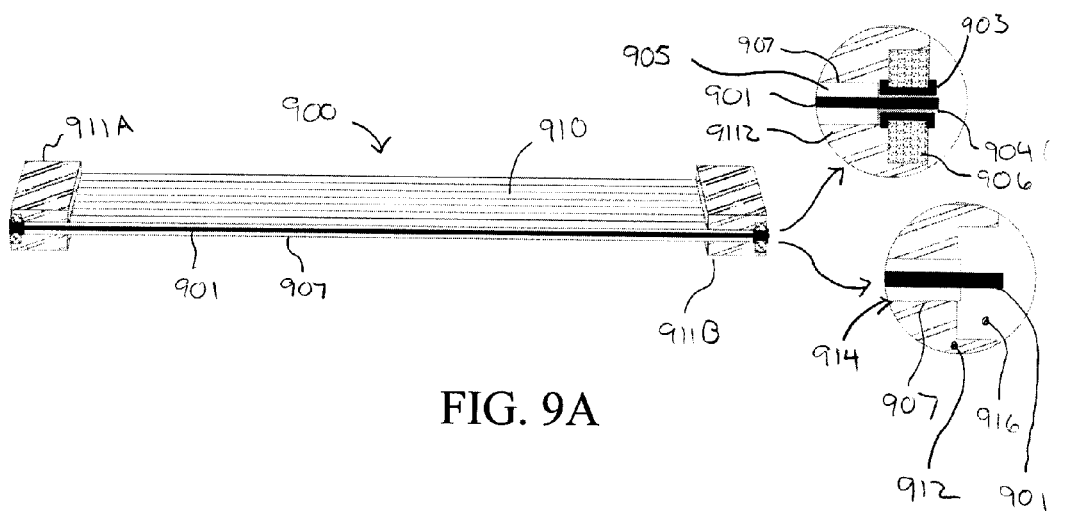
FIGS. 9A-9H illustrate embodiments of cable assemblies that may be used within the interconnection system of FIG. 8.

FIGS. 9A-9E illustrate embodiments of cable assemblies that may be used within the interconnection system of FIG. 8. FIG. 9A, for example, illustrates a cable assembly 900 having a single row of cables 910 secured within straight-passageway capture blocks 911A and 911B. Each of the capture blocks 911A, 911B includes a housing 912 having straight passageways 914 into which the cables 910 are inserted, and a recess 916. In one embodiment, the cables are coaxial cables having a center conductor 901, insulating material 905 disposed about the center conductor and a concentric outer conductor 907. The coaxial cables are disposed within the passageways 914 of the housing 912 such that the outer conductor 907 and insulating material 905 extend to the recess 916, and the center conductor 901 projects beyond the insulating material 905 and outer conductor 907. A low-dielectric-constant sleeve 904 (which may be an extension of the insulating material 905) is disposed about the projecting portion of the center conductor 901, and conductive collars 903 are disposed about the insulating sleeve in contact with the outer conductor 907. A retaining member 906 having through-holes formed therein is snapped (or molded) over the collars 903 and secured within the recess. The retaining member 906 may be conductive and electrically coupled to all the outer conductors 907 of the cables 910, or non-conductive to maintain electrical isolation between the outer conductors 907 of the cables 910. Alternatively, a conductive retaining member 906 may be a metal clad laminate with plated through-holes to which the outer conductors 907 of the cables 910 are soldered or otherwise electrically coupled. In an alternative embodiment, each of the cables 910 is a twin-axial cable having side-by-side signal conductors that are secured within a molded sleeve and corresponding twin-conductor collar.

Figure 9B:
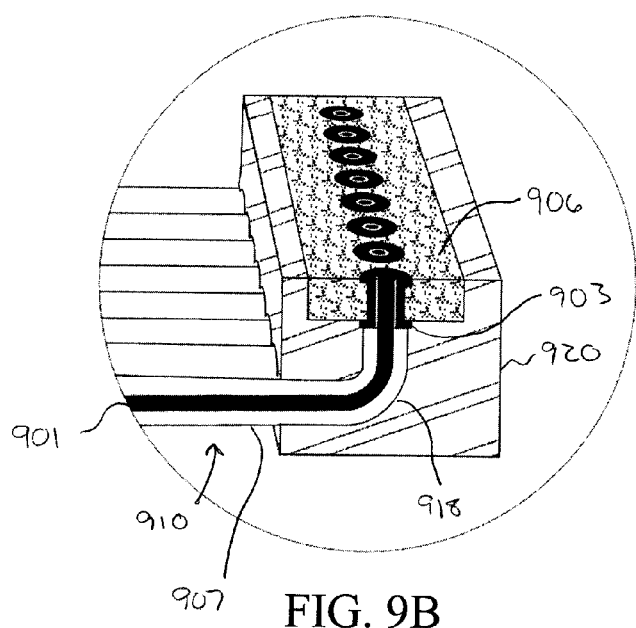

FIG. 9B illustrates an alternate capture block 920 embodiment having right-angle passageways 918 instead of straight passageways. The right-angle passageways 918 guide cables 910 toward a backplane opening and prevent cable bends from exceeding a specified bend radius as the cables 910 egresses from the capture block and extends toward the remote backplane opening. That is, the bend is achieved within the capture block 920 instead of outside the capture block. The capture block 920 may have passageways with bend angles greater or less than 90 degrees in other embodiments.

Figure 9C:
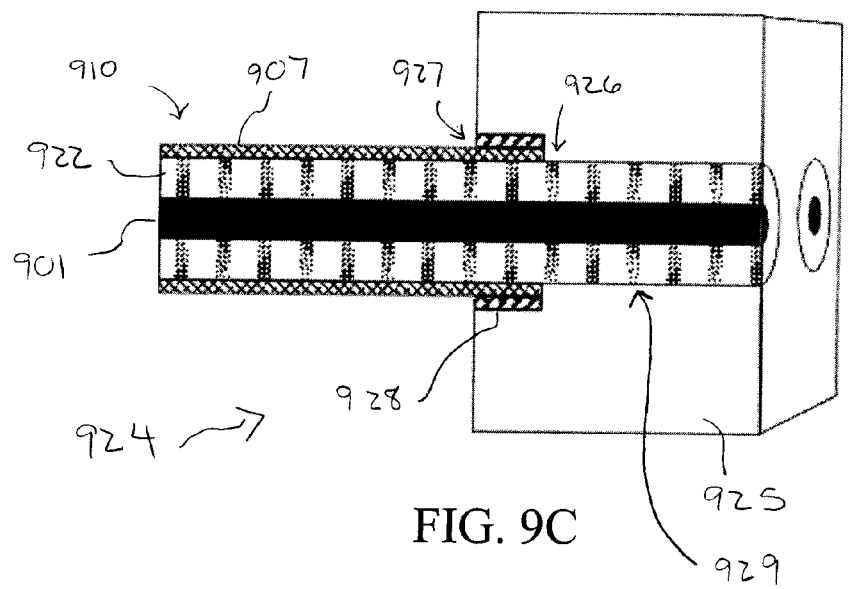

FIG. 9C illustrates a capture block 924 according to another embodiment. The capture block 924 includes a housing 925 and a row (or array) of passageways 929 in which respective cables 910 are disposed. In one embodiment, each passage 929 way has a first circular opening 927 at a cable ingress side of the housing 925 (i.e., the side of the housing into which the cable 910 is inserted), and a narrower opening 926 that extends to the opposite side of the housing 925. A conductive material 928 is plated or otherwise disposed along a wall of the housing 925 that defines the opening 927 to contact the outer conductor (or shield) 907 of a coaxial cable 910. The narrower opening 926 is sized to enable passage of the insulating material 921 and conductor 901, but not the outer conductor. The conductive material 928 may be coupled to the conductive material 928 in other passageways 929 and ultimately to a ground reference. The housing 925 may be formed or coated with metal or other conductive material.

Figure 9D:
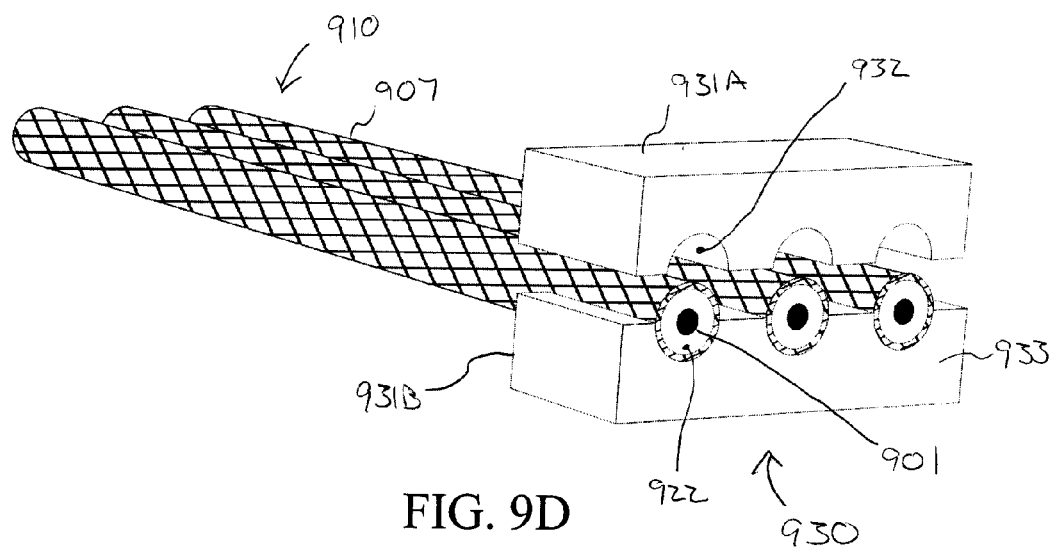

FIG. 9D illustrates an alternative cable capture block 930 in which opposing housing halves 931A and 931B, each with semi-cylindrical grooves 932 formed therein, are secured to one another to form a housing having cylindrical passageways. In on embodiment, coaxial cables, each having a center conductor 901, insulating layer 922 and outer conductor 907, are disposed in the grooves 932 of housing half 931B such that a flat or chamfered end of the conductor 901 is exposed at a contact surface 933 of the capture block 930. Housing half 931A is then disposed over the cables to secure the cables 910 within the cylindrical passageways formed by counterpart pairs of grooves 932. The housing halves 931A and 931B may be secured to one another by adhesives or mechanical retaining structures (e.g., clips, screws, bolts, etc.) and may be formed or coated with metal or other conductive material.

Figure 9E:
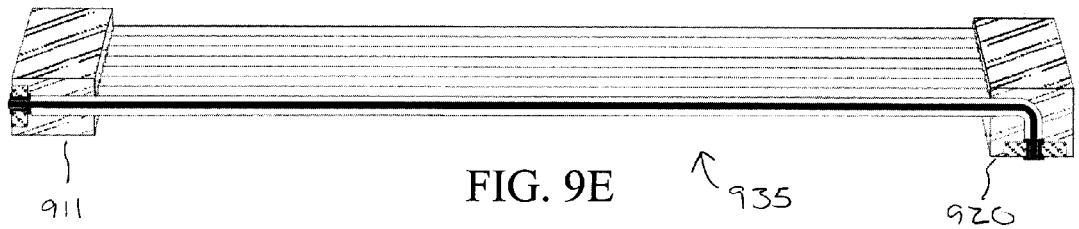
Figure 9F:
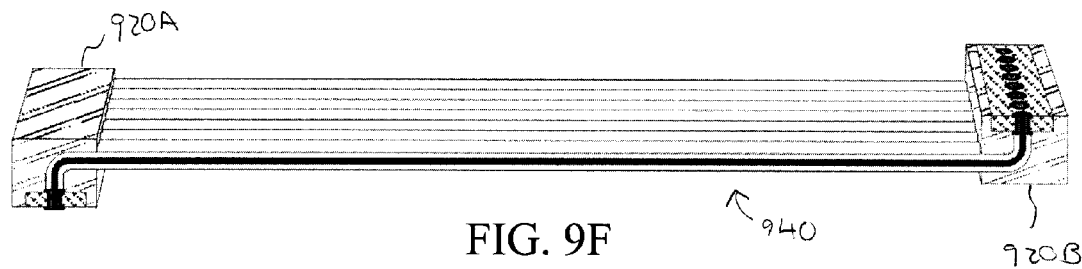
Figure 9G:
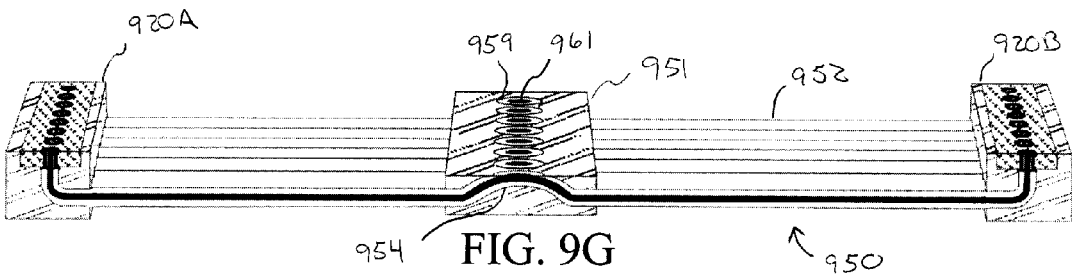

FIG. 9E illustrates an embodiment of a cable assembly 935 that has a straight-through capture block 911 at one end (i.e., capture block having straight passageways) and a right-angle capture block 920 at the opposite end. In another embodiment, illustrated in FIG. 9F, a cable assembly 940 has a pair of right-angle capture blocks 920A and 920B with oppositely-directed right-angle passage ways to facilitate interconnections to printed circuit boards having different opposite mounting orientations. In yet another embodiment, the conductors within cables extending between two capture blocks may be exposed at one or more locations along the cable lengths to achieve additional signal path branches (i.e., multiple drops instead of point-to-point signal interconnection). Referring to cable assembly 950 of FIG. 9G, for example, cables 952 extend through a mid-span housing 951 which includes an arched passageway 954 to route the cables 952 adjacent the surface of the housing 951, such that the cables 952 are exposed through openings 959. In the case of coaxial cables, a circular portion of the outer conductor and insulating material is removed from each cable 952 to expose a surface 961 of the center conductor. The exposed conductor surface 961 may be machined to achieve a flat or chamfered landing having a dimension similar to the ends of the center conductor exposed at the end-point capture blocks 920A and 920B. By this arrangement, a cable assembly having multiple drops along its length is achieved. The mid-span housing 951 may have the same or similar form-factor as the capture blocks 920A, 920B, and therefore may be inserted in a backplane opening in the manner described in reference to FIG. 8. In alternative embodiments, any number of mid-span housings 951 may be provided and corresponding additional signal drops formed along the lengths of the cables 945. Also, not all the cables 945 must pass through a given mid-span housing 951. For example, a number of multi-drop signal paths may be formed by passing a subset of cables 952 through one or more mid-span housings 951, while the remaining cables 952 form point-to-point signaling paths between the capture blocks 920A and 920B. Also, the bend orientation of either or both of the capture blocks 920A and 920B may be opposite those shown in FIG. 9E (i.e., such that one or more of the mid-span signal drops are disposed on a surface that faces a direction opposite the contact surfaces of either or both of the capture blocks 920A and 920B). Also, either or both of the capture blocks 920A, 920B may have straight passageways instead of right-angle passageways.

Figure 9H:
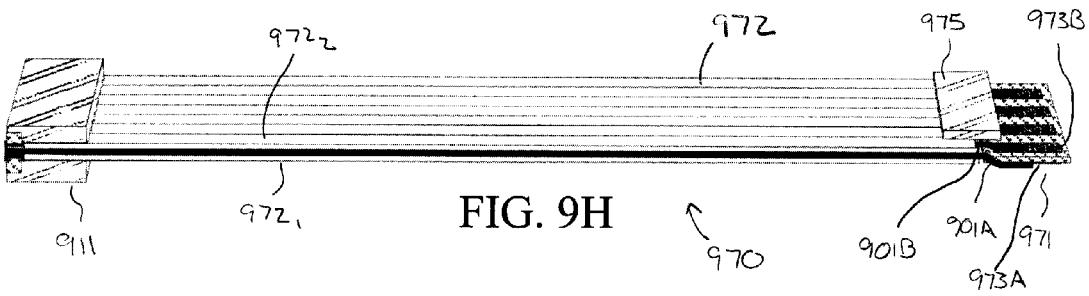

FIG. 9H illustrates an embodiment of a cable assembly 970 having an edge connector 971 on one end and a capture block 911 on the opposite end (a capture block having right-angle passageways or passageways with other bend angles may alternatively be used). In one embodiment, center conductors of adjacent coaxial cables 972 (or parallel conductors of a twin-axial cable) are coupled alternately to broadside printed contacts 973A, 973B of the edge connector 971. That is, the center conductor 901A of cable 972, is coupled to a contact 973A on one surface of the edge connector 971, and the center conductor 901B of cable 972$_2$ is coupled to a contact 973B on the opposite surface of the edge connector 971. The conductors of the remaining cables 972 are similarly coupled alternately to contacts on opposite surfaces of the edge connector 971. The outer conductors of the coaxial cable may be coupled to ground contacts printed on the edge connector such that each signal contact is disposed between a pair of ground contacts. More generally, the cable conductors and card edge contacts may be interconnected in any arrangement. Also, edge connectors may be used on both ends of the cable assembly 970, and any number of mid-span housings (e.g., element 951 of FIG. 9G) may be used to establish multiple signal drops.

While a single row of cables has been shown in the cable assemblies of FIGS. 9A-9H, any number of rows of cables may be used in alternative embodiments, with the landings formed by the conductor ends of each cable row constituting a row of contact landings within a larger array. The rows of contact landings within the array may be offset from one another as shown in FIG. 8 to achieve a desired spacing between landings within a given area. Also, rather than coaxial cables, cables having any number of conductors may be used. In the case of twin-axial cables, the conductors of a given cable may be disposed in pairs of landings as shown in FIG. 8. In the case of twin-axial cables having one or more returns, the conductor spacing patterns within the cable may be repeated in the landing footprint. For example, landing foot prints for the four-conductor cable illustrated in FIG. 7B are diamond shaped such that an array of diamond shaped landings are formed on the surface of the capture blocks. Also, individual coaxial cables, twin-axial cables, twisted pair cables, or other cable form factors may be encapsulated with a molding material (e.g., polymeric material) to increase the strength of the cable assembly and avoid tangling or bent cables. Alternatively, each of the cables may extend between capture blocks without encapsulation, as shown in FIG. 8.

Figure 10:
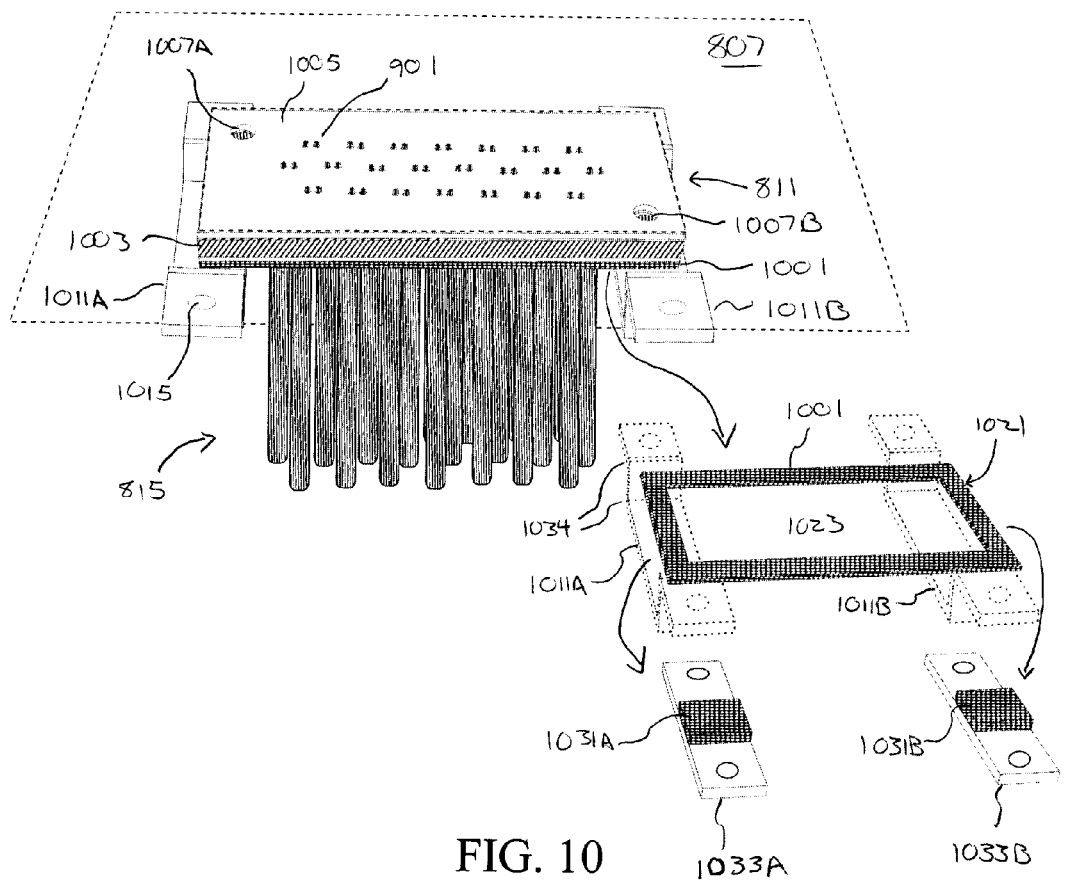
FIG. 10 illustrates a capture block mounting system according to an embodiment of the invention.

FIG. 10 illustrates a capture block mounting system according to an embodiment of the invention. The mounting system includes a pair of retaining members 1011A, 1011B and an elastomeric member 1001. In one embodiment, the elastomeric member 1001 is a frame-shaped element, having an outer perimeter 1021 that matches the outer perimeter of a capture block 811, and an opening 1023 sized to enable a set of cables 815 to pass through. In an alternative embodiment, individual cable-sized through-holes are punched or cut into the center region of the elastomeric member 1001 to enable passage of individual cables. In another alternative embodiment, the elastomeric member constitutes separate left and right elastomeric components 1031A, 1031B, disposed at opposite ends of the capture block 811, between the capture block and the retaining members 811A, 811B. In any case, at least a portion of the elastomeric member 1001 (including a two-component elastomeric member) is interposed between the retaining members 1011A, 1011B and the capture block 811. The retaining members 1011A, 1011B are fastened to a backplane 807 (e.g., by inserting screws or bolts through holes 1015, or using clips, or any other fastening mechanism). By this arrangement, the capture block is pivotably secured to the backplane, the elastomeric material being compressible to enable to pitch and/or roll of the capture block as necessary to achieve substantially equal contact pressure across the surface of a mating connector (e.g., connector 802 of FIG. 8). In one embodiment, the capture block 811 is also enabled to translate in any direction along the plane established by the surface of backplane 807 (e.g., by sliding relative to the retaining members) and is enabled to rotate about an access normal to the backplane surface (i.e., yaw). Thus, the capture block 811 is also translatably and/or rotatably secured to the backplane 807 to enable precise alignment with the contacts of a mating connector. The retaining members 1011 may have bends as shown at 1034, to accommodate a capture block 811 that extends below a bottom surface of the backplane 807, or may be relatively straight beams (e.g., as shown at 1033A, 1033B) to secure a capture block 807 having a thickness substantially similar to the thickness of the backplane 807

(i.e., the capture block 811 being mounted substantially flush with bottom surface and/or top surface of the backplane 807). In one embodiment, guideposts (not shown in FIG. 10) are secured within openings 1007A and 1007B in the capture block 811, to be received within counterpart alignment holes of a daughterboard connector (or a connector of another board). Alternatively, the guideposts may be disposed on the connector and received within the openings 1007A, 1007B of the capture block 811. In other embodiments, the guideposts or alignment holes may be disposed on the backplane 807 on either side of the capture block 811. In such an embodiment, a manufacturing tool having a desired contact pattern may be mounted to the backplane via the guideposts (or alignment holes), the capture block 811 moved to a desired contact alignment (e.g., by being translated, rotated, pivoted, raised or lowered within the backplane opening), and then the retaining members 1011A, 1011B (or 1033A, 1033B) fastened to the backplane 807 to fix the capture block 811 in the desired alignment. Such an arrangement is especially useful for accommodating manufacturing tolerance run-out when more than one connector is used on a single daughterboard.

Figure 11A:
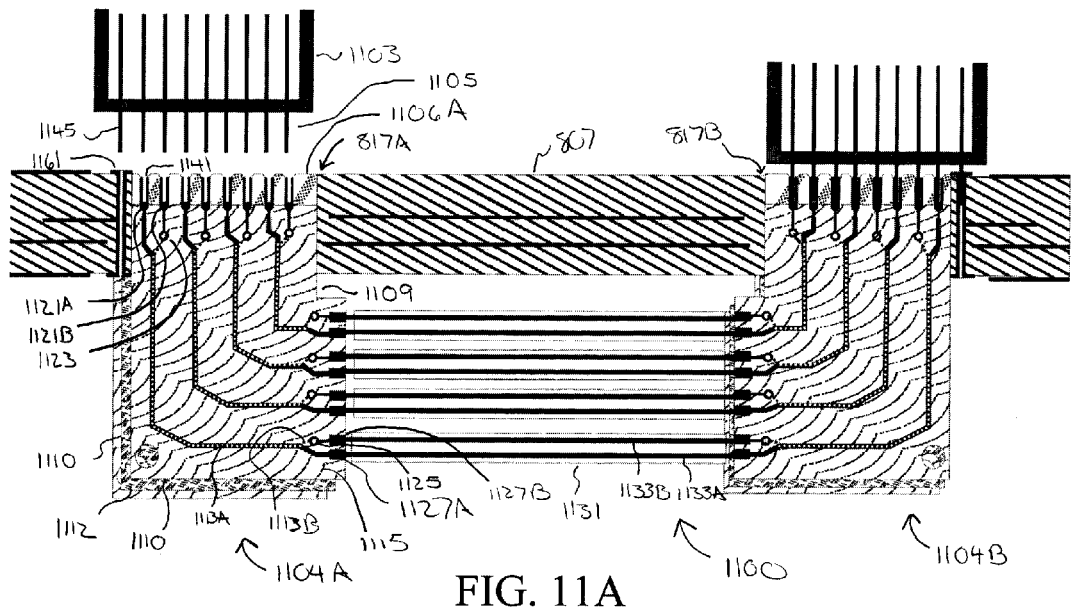
FIGS. 11A and 11B are side views of alternative cable assembly embodiments.
Figure 11B:
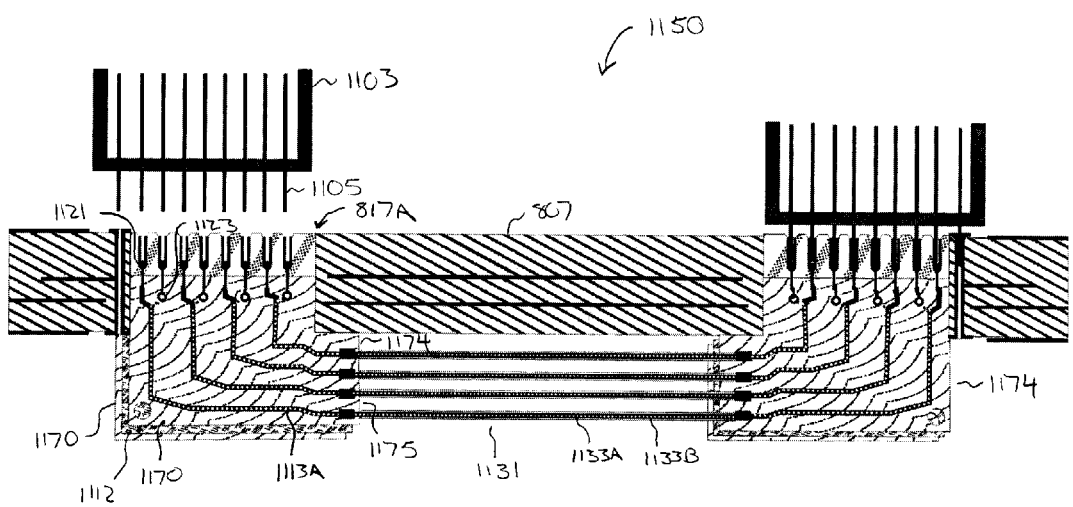

FIGS. 11A and 11B are side views of alternative cable assembly embodiments 1100 and 1150 that may be used in combination with commercially available connector sockets 1103. Referring first to FIG. 11A, the cable assembly 1100 includes a pair of socket mounting assemblies 1104A and 1104B disposed within respective openings 817A, 817B of a backplane 807 and coupled to one another by cables 1131. Each of the socket mounting assemblies 1104A, 1104B includes a socket-mounting block 1107 and a capture block 1109 coupled to the socket-mounting block 1107. Each of the capture blocks 1109 is formed by a plurality of low-dielectric-constant substrates 1110 separated from one another by insulating layers 1112. In the profile view of FIG. 11A, only one of substrates 1110 is shown in detail and includes printed traces 1113A and 1113B disposed on opposite surfaces thereof in a broad-side coupled arrangement. Traces 1113B, referred to herein as backside traces, are disposed on a back surface of the substrate 1110 (i.e., not visible in the profile view of FIG. 11A) and are illustrated in dashed outline. Conductive vias 1123, 1125 are used to route the backside traces 113B to the front surface 1115 of the substrate 1110, with the conductive paths formed by each broadside-coupled trace pair terminating at a cable contact pair 1127A, 1127B at one end, and at a pin receptacle pair 1121A, 1121B at the other end. In the embodiment of FIG. 11A, each of the cables 1131 includes a pair of conductors 1133A, 1133B (which may be, for example, a twisted pair cable, coaxial cable, twin-axial cable or other multi-conductor cable) coupled to a respective pair of the cable contacts 1127A, 1127B on the front surface of substrate 1110. The socket-mounting blocks 1106 each include an array of through-holes 1141 adapted to receive metal contact pins 1105 of a connector socket 1103. In one embodiment, the through-holes 1141 are disposed according to the pin-out pattern of a commercially available connector socket such as a GbX™ socket manufactured by Teradyne, Inc. of Boston Mass. In other embodiments, the through-holes 1141 may be disposed in other pin-out patterns to support reception of other types of connector sockets. Also, while two same-type connector sockets are shown in FIG. 11A, different connector types (e.g., connectors having different pin-outs and/or form-factors) may be inserted into opposite ends of the cable assembly 1100 in alternative embodiments.

Still referring to FIG. 11A, the contact pins 1105 of the connector socket 1103 that carry high-speed signals are inserted into the through-holes 1141 of a socket block 1106, while pins 1145 for delivering power and non-speed-critical signals are inserted into conductive vias 1161 in the backplane 807 in a conventional manner. By this arrangement, speed-critical signals propagate through the cable assembly 1100, while non-speed-critical signals 1150 propagate on traces printed on backplane 807. In an alternative embodiment, all signals, speed-critical and otherwise, may propagate on the signal paths formed by the cable assembly 1100. Also, while the signal paths formed by the conductive traces 1113A, 1113B on the substrate 1110 are shown in different lengths, serpentine routing or other trace routing strategies may be used to equalize the electrical lengths of the conductive traces 1113A, 1113B for skew reduction purposes.

The cable assembly embodiment 1150 illustrated in FIG. 11B is similar to the cable assembly 1100, except that the cable contacts for a given pair of cable conductors are disposed on opposite sides of a signal conducting substrate 1170. By this arrangement, the linear distribution of the cable contacts along cable-connecting edge 1175 of substrate 1170 is reduced, thereby enabling use of lower-profile capture blocks 1174. As with the capture blocks 1109 of FIG. 11A, the cables coupled between capture blocks 1174 may be twisted pair cables, coaxial cables, twin-axial cables or any other multi-conductor cables. Also, serpentine routing of conductive traces on the trace-carrying substrate 1170 may be used, and different types of connector sockets may be inserted into opposite ends of the cable assembly 1150.

Cabled Interconnect Using Integral-Spring Conductors

Figure 12A:
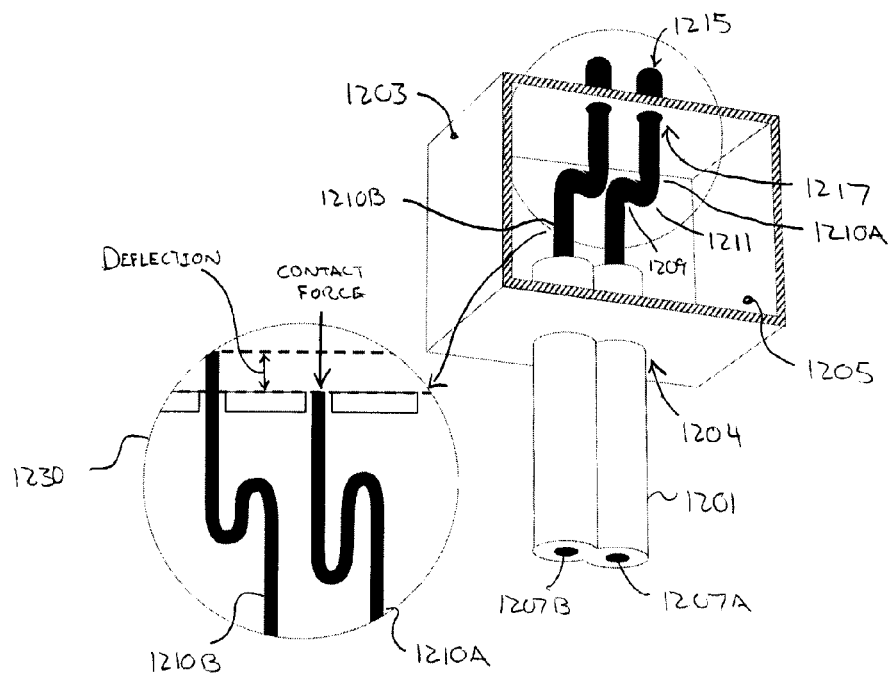
FIG. 12A illustrates an embodiment of a contact assembly in which resilient, spring-like contacts are formed integrally from cable conductors.

FIG. 12A illustrates an embodiment of a contact assembly 1200 in which resilient, spring-like contacts are formed integrally from cable conductors. The contact assembly 1200 includes a multi-conductor cable 1201 and a guide element 1203. The cable 1201 is received within a chamber 1205 of the guide element 1203 through an opening 1204 that conforms to the cable shape. A front wall of the chamber 1205 is removed in FIG. 12 to illustrate the disposition of the cable 1201 within the chamber 1205. Terminal portions 1210A, 1210B of the cable conductors 1207A, 1207B extend beyond the insulating material (and shield and outer cover, if included) of the cable 1201, have bends 1209 and 1211 (e.g., having substantially equal bend angles) to form integral springs, then project through guide holes 1217 in the guide element 1203 to form contacts at flat (or chamfered) ends 1215. By this arrangement, a normal force applied to the conductor ends 1215 will result in deflection of the ends 1215 in the direction of the force (i.e., toward the chamber). As the conductor ends 1215 deflect, the bends 1209 and 1211 adjust (e.g., bend angles become smaller or bends coil or uncoil) as shown in detail view 1230, generating a spring force in the conductors that urges the conductor ends 1215 in a direction opposite the deflecting force. That is, the terminal portions 1210A, 1210B of the conductors 1207A, 1207B form integral springs that push back against the deflecting force. The conductors 1207A, 1207B may be formed from a material having sufficient elastic modulus to provide the desired spring force, or the terminal portions 1210A, 1210B may be plated with any number of alloys to increase their elastic modulus.

It should be noted that while a twin-axial cable is depicted in FIG. 12A, other types of electronic cables may be used (e.g., twisted pair, coaxial, etc.). Also, the cable 1201 may be received in a recession at the bottom surface of the guide element 1203, with only the terminal portions 1210A, 1210B of the conductors projecting into (and through) the guide element 1203. The guide element 1203 may be formed from or coated with conductive material for shielding purposes, and a shield within the cable 1201 may be coupled to the guide element. If the guide element 1203 is formed from or coated with conductive material, the guide holes 1217 may have insulating grommets disposed therein to prevent shorting between the guide member and the conductors 1207A, 1207B. Alternatively, the conductive coating may be etched away or otherwise removed from the guide holes 1217.

The integral-spring contact assembly 1200 may be applied in a number of ways in embodiments of the present invention. For example, many state of the art connectors require some sort of spring-like intermediary structure to urge connector contacts against circuit board landings. Examples of such intermediary structures include pogo pin assemblies (a discrete spring disposed between a conductor and a contact or pin), fuzz button assemblies (a resilient wire mesh disposed between a conductor and a contact or pin) and so forth. Such intermediary structures increase overall design complexity and manufacturing cost, and may introduce impedance discontinuities in the signaling path. Spring (or spring-like) intermediary structures are obviated by the integral-spring contact assembly of FIG. 12, thereby avoiding the aforementioned problems.

Figure 12B:
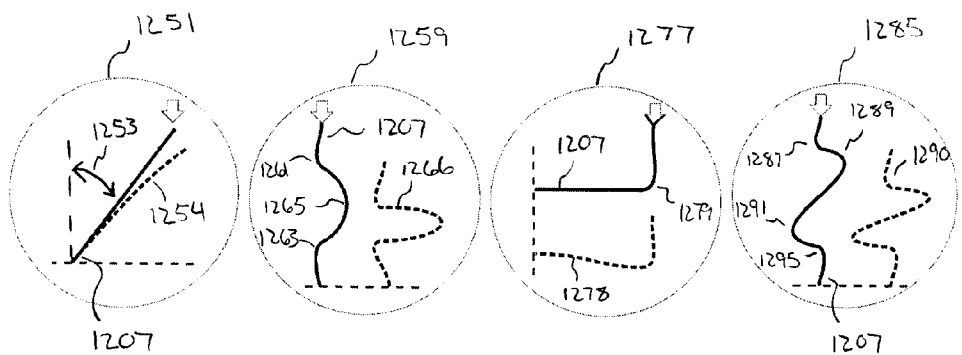
FIG. 12B illustrates alternative conductor configurations that may be used to implement integral-spring conductors.

FIG. 12B illustrates a number of alternative conductor configurations that may be used to implement integral-spring conductors. In one embodiment, illustrated at 1251, the terminal portion of a conductor 1207 has no bends, but rather is disposed at an angle 1253 relative to the direction of contact force (F), thereby enabling the conductor 1201 to bend as shown at 1254. The conductor 1207 has a sufficient elastic modulus to retain its shape and urge against the contact force. In another embodiment, illustrated at 1277, the terminal portion 1210 of the conductor 1207 has a single bend angle 1279 to enable spring-like deflection of the contact end of the conductor in response to a contact force, as shown at 1278. In another embodiment, illustrated at 1259, the terminal portion 1210 of the conductor 1207 has three bends 1261, 1263 and 1265 having bend angles that become more acute (as shown at 1266) when the contact end of the conductor 1207 is deflected by a contact force, thereby establishing a spring-force in the conductor 1207. In yet another embodiment, shown at 1285, the terminal portion 1210 of the conductor 1207 has four bends having bend angles that become more acute (as shown at 1290) when the contact end of the conductor 1207 is deflected by a contact force. More generally, the conductor 1210 may have any number of bends in any orientation, and any combination of bend angles to achieve an integral-spring conductor that may be used in embodiments of the invention.

Figure 13:
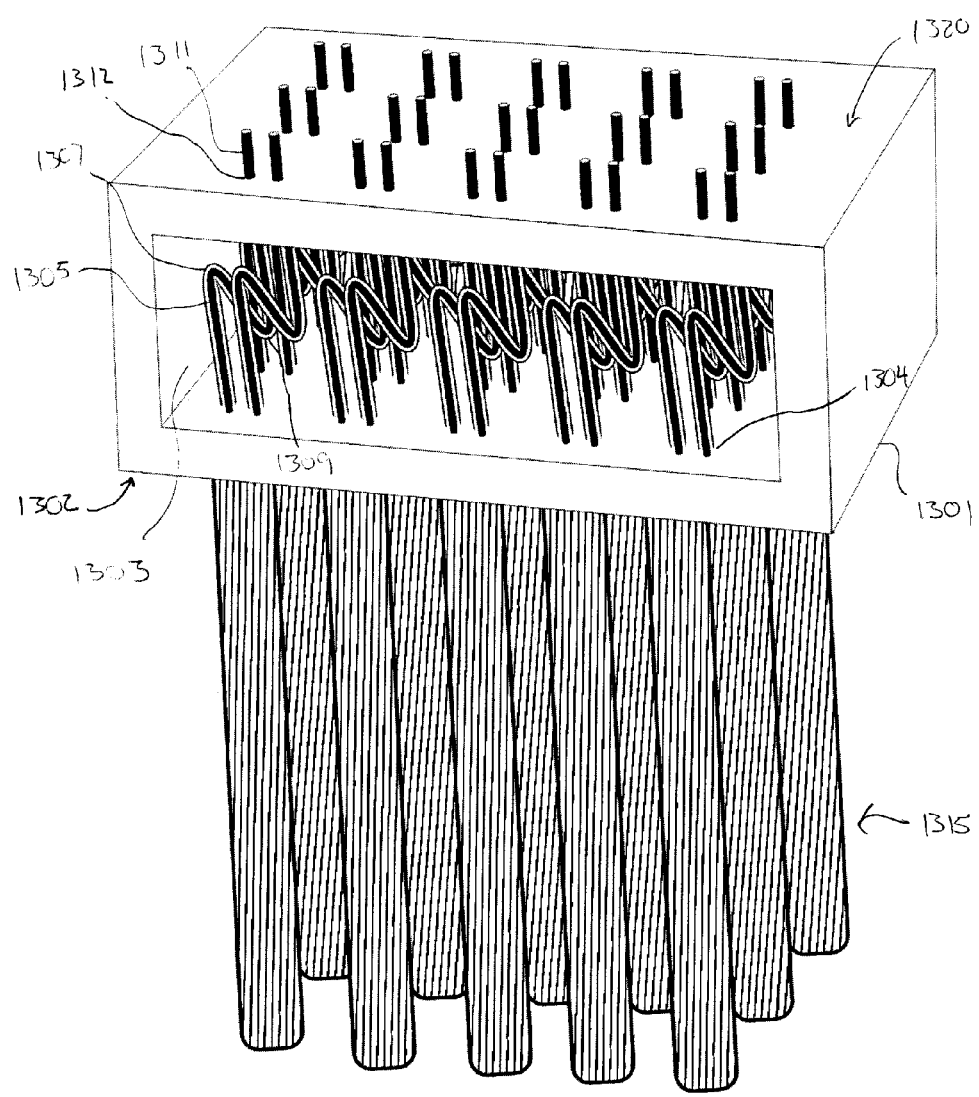
FIG. 13 illustrates a capture block according to an embodiment of the invention.

FIG. 13 illustrates a capture block 1301 according to an embodiment of the invention. The capture block 1301 includes a chamber 1303 to house integral-spring conductors that extend from a set of cables 1315. In the embodiment shown, the cables 1315 are received in recesses (not shown) within the surface 1302 of the capture block, with the cable conductors 1305 projecting into the chamber 1303 through openings 1304. In an alternative embodiment, the complete cables (e.g., housing, shield, insulating layer, as well as the conductors 1305) may extend into the chamber 1303 as shown in FIG. 12. In either case, the cable conductors 1305 have bends 1307 and 1309 to form integral springs and project slidably through openings 1312 in surface 1320 to form resilient (i.e., spring-like), deflectable contacts 1311. The capture block 1301 may be used, for example, in the cable assemblies 809 of FIG. 8 so that the conductors project above the surface 831 of the backplane 807 and are adapted to mate with counterpart contacts of connectors 802, 804A, 804B and 806. Alternatively, as described below, the capture block 1301 may be used as an interposer within a right-angle or straight-through connector (e.g., one or all of daughterboard connectors 802, 804A, 804B or 806).

Still referring to FIG. 13, it should be noted that the array of contacts 1311 formed at the surface 1320 (i.e., conductor ends) may instead be a single row or column of contacts. Also, an outer wall of the capture block 1301 has been removed to enable a view of the spring chamber. In actual implementation, the chamber may be completely sealed, except to permit ingress and egress of the cable conductors 1305. The profile of the capture block 1301 may be reduced as necessary to establish a flush fit within a backplane opening (e.g., opening 817A, 817B). Also, conductive shielding elements may be disposed within the chamber 1303 about each pair of cable conductors 1305 (or each conductor) to reduce crosstalk between signals propagating on neighboring conductors. In one embodiment, the shielding elements are formed by conductive interior walls of the capture block 1301 disposed in a grid pattern with each grid location forming a sub-chamber to house a separate conductor 1305 or pair of conductors. Such interior walls may be formed integrally with the capture block 1301 (e.g., conductive plating of a molded polymeric structure) or by insertion of metal members or plated polymeric members into the chamber 1303 prior to sealing.

Figure 14:
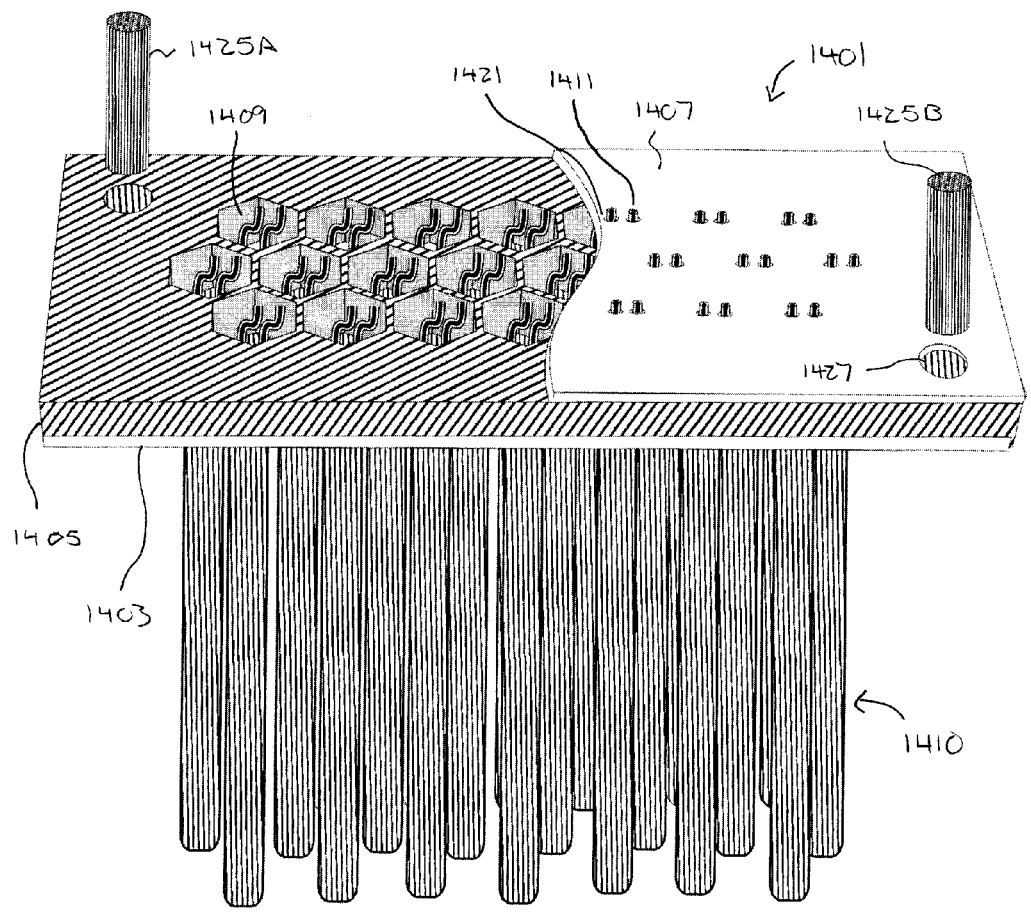
FIG. 14 illustrates a capture block having multiple shielded chambers according to an embodiment of the invention.

FIG. 14 illustrates a capture block 1401 having multiple shielded chambers 1409 according to an embodiment of the invention. The capture block 1401 comprises a shielding member 1405 disposed between a capture member 1403 and a guide member 1407. In one embodiment, recesses within the cable capture member 1403 (not shown in FIG. 14) are adapted to receive and secure cables 1410, with the signal carrying conductors of each cable 1410 extending through holes in the capture member into respective chambers 1409 within the shielding member 1405. In the embodiment of FIG. 14, each cable 1410 includes a pair of signal carrying conductors that extend into a respective chamber 1409 of the shielding member 1405. In an alternative embodiment, a single signal carrying conductor extends into each chamber 1409. The chambers 1409 may be filled with a resilient, low-dielectric-constant material to maintain substantially constant distance between the conductor pair without limiting conductor spring action (i.e., compression in response to a contact force applied to the ends of the cable conductors). Alternatively, the chambers 1409 are unfilled so that the cable conductors are surrounded by air.

Still referring to FIG. 14, the guide member 1407 includes guide holes 1421 disposed over respective chambers 1409 in the shielding member 1405 such that the cable conductors project through the guide member 1407 to form integral-spring contacts 1411. Guideposts 1425A, 1425B may be secured in holes 1427 formed within the guide member 1407 and shield member 1405 for insertion into alignment holes of a reciprocal connector. Alternatively, guideposts of a reciprocal connector may be received within the holes 1427. As with the capture block 1301 of FIG. 13, the capture block 1401 may be used in the cable assembly of FIG. 8 so that the conductors project above the surface 831 of the backplane 807 to mate with counterpart connector contacts. Alternatively, as described below, the capture block may be used as an interposer in a right-angle or straight-through connector.

Figure 15A:
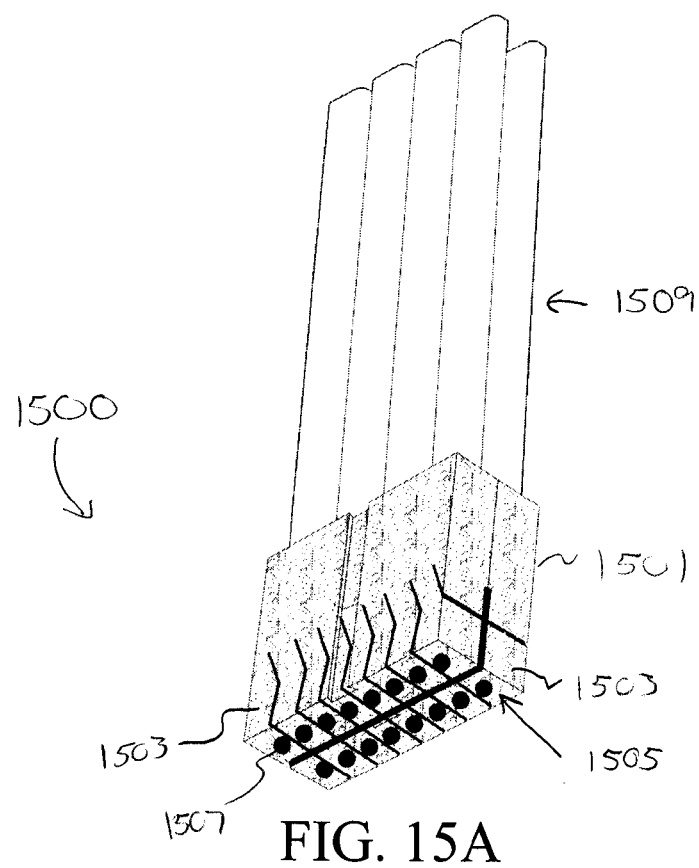
FIGS. 15A and 15B illustrate an alternative embodiment of a capture block that may be used to provide integral-spring conductor contacts.
Figure 15B:
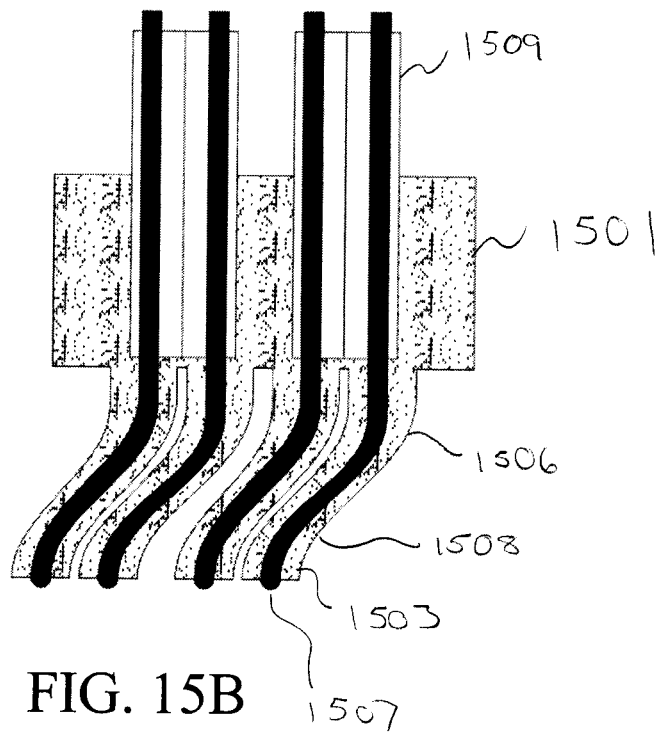

FIGS. 15A and 15B illustrate an alternative embodiment of a capture block 1500 that may be used to provide integral-spring conductor contacts. A flexible polymeric housing 1501 is molded over a set of cables 1509 with the cable conductors 1507 extending through respective projecting fingers 1503 of the housing 1501. The ends of the conductors 1507 are exposed at the ends of the projecting fingers 1503 to form contacts 1505. As shown in FIG. 15B, each finger 1503 includes a pair of bends 1506, 1508 that conform to bends in the cable conductor 1507. As the end of a conductor 1507 is deflected (i.e., in response to a contact force normal to the flat or chamfered end of the conductor 1507), the bend angles of one or both of the bends 1506 and 1508 in the fingers 1503 and the conductor 1507 increase, the flexible material of the conforming finger 1503 and the elasticity of the conductor 1507 both acting to urge the deflected end of the conductor 1507 against the source of deflection.

Although each cable 1509 is depicted in the detail view of FIG. 15B as including two side-by-side conductors 1507, coaxial cables may alternatively be used. In such an embodiment, the outer conductor of the coaxial cable may be coupled to a grounding member disposed within the polymeric housing 1501, with the center conductor extending through the conforming fingers 1503. Also, while two rows of conductors 1509 are illustrated in FIG. 15A, more or fewer rows of conductors may be provided in alternative embodiments. The polymeric housing 1501 may additionally include a latching member to secure the housing (and therefore the set of cables) within an opening in a backplane (e.g., opening 817A of FIG. 8). Alternatively, the capture block 1500 may be used as a connector to mate to a counterpart capture block such as capture block 811A described in reference to FIG. 8.

Figure 16:
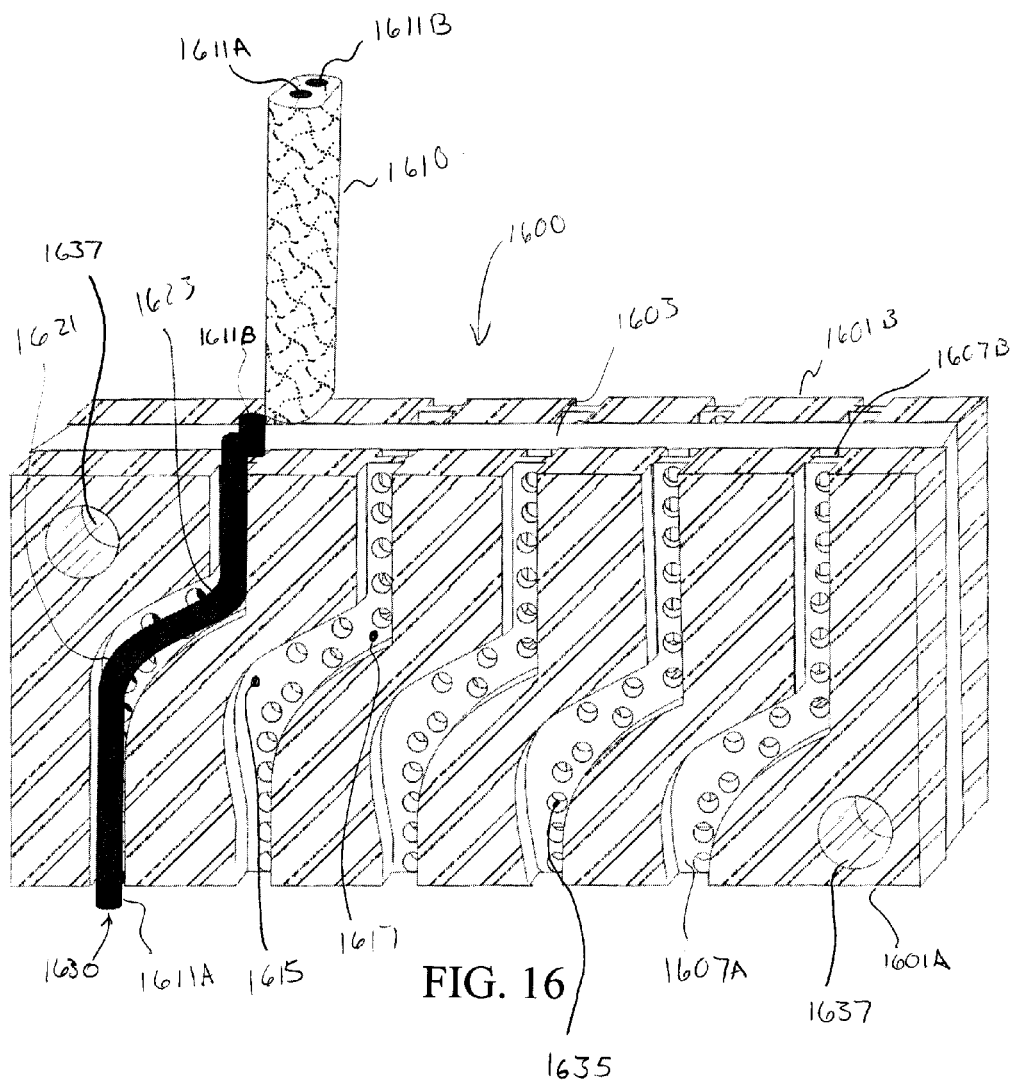
FIG. 16 illustrates another embodiment of a capture block that may be used with integral-spring cable conductors.

FIG. 16 illustrates another embodiment of a capture block 1600 that may be used with integral-spring cable conductors 1623. The capture block 1600 includes a pair of molded guide members 1601A, 1601B, separated from one another by a shielding member 1603. Each of the guide members 1601A includes a number of pairs of side-by-side conductor passageways 1607A, 1607B through which corresponding conductors 1611A, 1611B of cable 1610 extend. In the embodiment of FIG. 16, each passageway 1607 includes a pair of turns 1615, 1617 disposed in an S-shape to accommodate a corresponding pair of bends 1621, 1623 in the corresponding conductor. The passageway turn 1615 is widened relative to turn 1617 to enable translation of the vertex of the conductor bend 1623. That is, the passage way is relatively narrow at turn 1617 to secure the cable conductor 1611 within the guide member 1601A, but wider at turn 1615 to allow axial deflection of the conductor 1611 in response to a normal force applied to the end 1630 of the conductor. In one embodiment, through-holes 1635 are formed along an inner wall of each passageway 1607 to lower the effective dielectric constant of the guide members 1601 in the region adjacent the cable conductors. Although conductor 1611A is depicted in FIG. 16 as being exposed at a surface opposite the inner wall of the passageway, the conductor may alternatively be surrounded through the length of the passageway. Also, while two side-by-side passageways 1607A, 1607B are formed within the guide member 1601 to support the multi-conductor cable 1610, more or fewer passageways 1607 may be formed within the guide members 1601 in alternative embodiments according to the number of signal carrying conductors (and/or return conductors). For example, in one embodiment, each guide member includes only one passageway per cable interface to receive the center conductor of a coaxial cable, the outer conductor of the coaxial cable being electrically coupled to the shielding member 1603. Although only two guide members 1601A, 1601B and a single shielding member 1603 are shown in FIG. 16, any number of additional shielding members and guide members may provided in alternative embodiments. The capture block 1600 may additionally include a latching member or bracket to enable the capture block (and therefore a set of cables 1610) to be secured within an opening in a backplane (e.g., opening 817A of FIG. 8). Alternatively, the capture block 1600 may be used as a connector to mate to a counterpart capture block (e.g., capture block 811A of FIG. 8). The guide members 1601A, 1601B and shielding member 1603 may be secured to one another using adhesive material and/or by mechanical fasteners (e.g., screws, bolts or pins inserted into openings 1637).

Figures 17A, 17B:
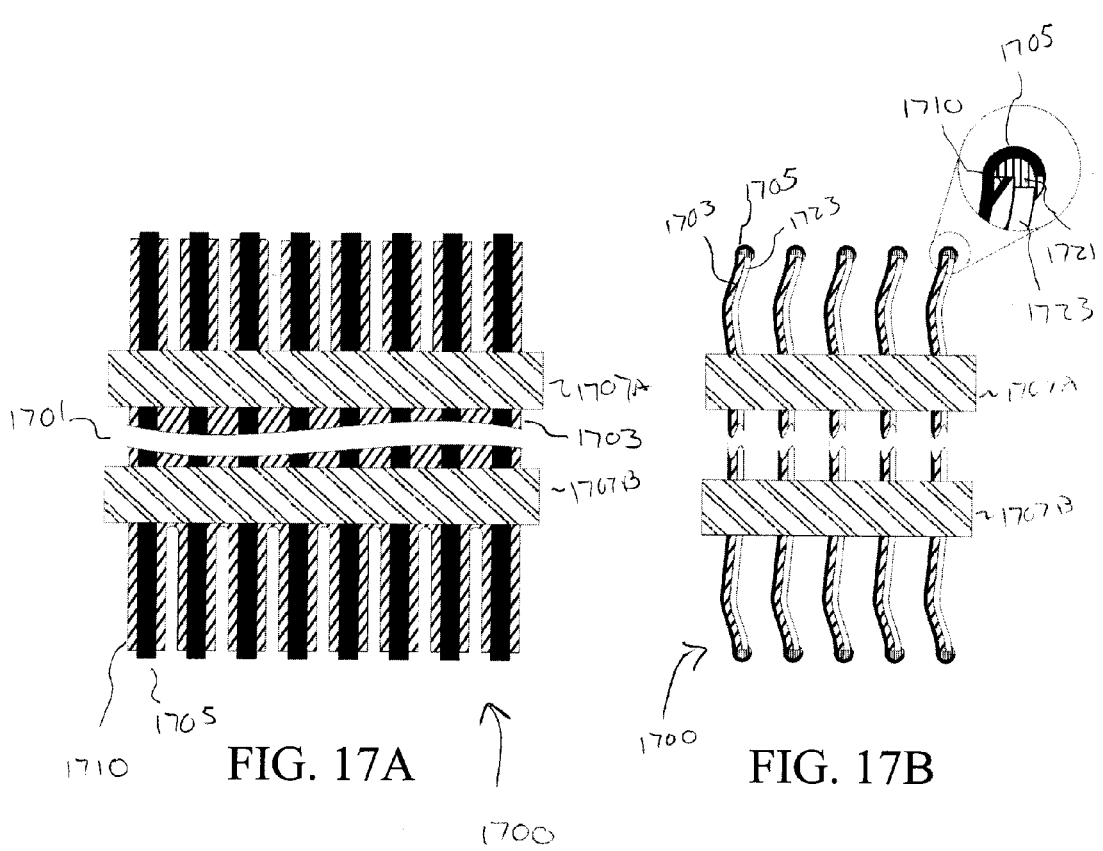
FIGS. 17A and 17B illustrate ribbon cable embodiments having materials bonded to their ends to form integral-spring conductors.

FIGS. 17A and 17B illustrate embodiments of flex circuit, flat conductor or ribbon cable assemblies having materials bonded to their ends to form integral-spring conductors. Flex circuit or flat conductor or ribbon cables 1700 of indefinite length, as indicated by break 1701, can be fashioned to serve as cables in embodiments of the invention. In the embodiment of FIG. 17A, the cable 1700 includes an insulating film 1703 and flat or round metal conductors 1705. The cable can be then bonded to a thin metal foil having spring qualities (e.g. BeCu alloys or spring steel) to provide resilience to the contact surface at the end of the conductors when mated their respective contact surfaces. The polymer is continuous in the main body but is slit between contacts to form protrusions 1710 of the insulating film 1703 that allow the ends of the conductors 1705 to act independently and adjust surface height non uniformities.

As illustrated in magnified segment, the conductors 1705 can be folded over the end of film protrusions 1710 if desired and an insulating material 1721, such as an epoxy resin can be employed to prevent shorting to a metal backing 1723. The metal backing 1723 can provide improved dimensional stability and serve as a shield or ground if desired. The metal backing can extend the entire length of the cable or can be limited to the area of the contacts. A rigid or reinforced area 1707A and 1707B can be provided to set the distance for the discrete fingers of the cable in the contact area and provide a fulcrum for bending them when they make contact with their mating half. While only a single layer of contacts are shown, multiple layers of contacts are possible. Also, the ends of selected individual conductors 1705 may extend further from the reinforced areas 1707 than others of the conductors 1705 in alternative embodiments.

Board to Board Connectors

Numerous different board-to-board connectors may be used to interconnect the daughterboards and backplanes of the interconnection systems of FIGS. 2, 4 and 8. In some embodiments, commercially available connectors are used in combination with backplanes having cabled interconnects, thereby enabling use of existing connector and daughterboard stock and easing migration to more comprehensively cabled interconnection systems. In other embodiments, described below, connectors having novel interconnecting structures are used to interface with the cabled backplane assemblies described in reference to FIGS. 2A-2C, 4A-4C and 8.

Figure 18A:
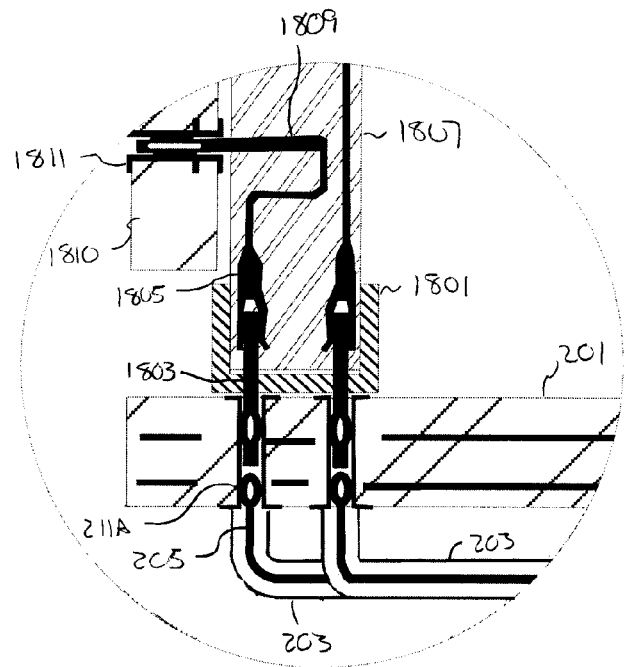
FIGS. 18A and 18B illustrate the use of commercially available connectors within an interconnection system according to the present invention.
Figure 18B:
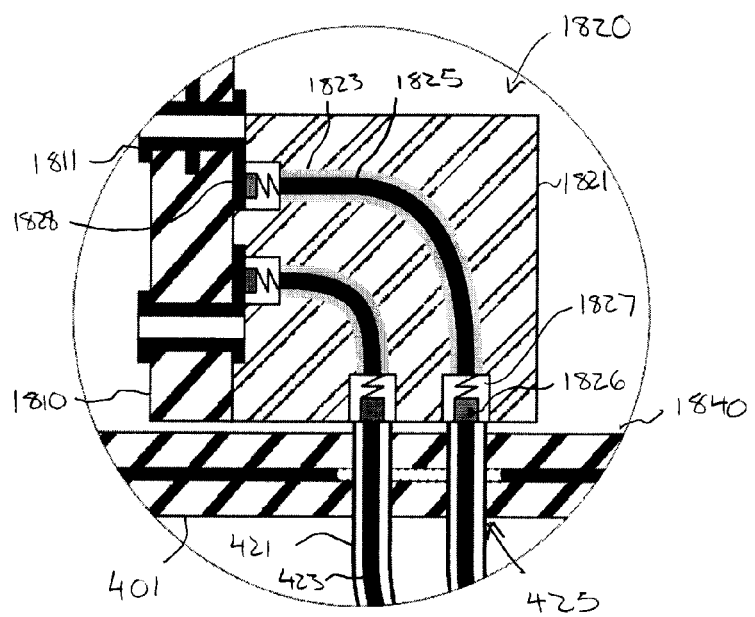

FIGS. 18A and 18B illustrate the use of commercially available connectors within an interconnection system according to the present invention. Referring first to FIG. 18A, a GbX™ type connector 1807 is affixed to a PCB 1810 in a conventional manner (e.g., by pin insertion into conductive via 1811) and includes receptacles 1805 to receive pins 1803 projecting through a socket housing 1801. In the embodiment of FIG. 18A, the projecting pins 1803 are inserted into conductive vias 211 in the backplane 201 (or a capture block secured within an opening in the backplane), and conductors of cables 203 are coupled to the ends of the conductive vias 211, for example, by soldering or press fit as described in reference to FIG. 2A. Alternatively, the projecting pins 1803 used to form the male connector interface are inserted into non-plated through-holes in the backplane 201 and a capture member is used to secure the cables in position relative to the through-holes, the cable conductors having bends to form integral-spring contacts that urge against the projecting pins 1803 as described in reference to FIG. 2B. In another alternative embodiment, the projecting pins 1803 used to form the male connector interface are inserted into a guide member of either of the cable assemblies 1100 or 1150 described in reference to FIGS. 11A and 11B.

In the embodiment of FIG. 18B, a PCB 1810 is secured to a commercially available connector 1820 having a set of shielded cables 1823 disposed within housing 1821 and discrete spring-and-pin contacts at either end. More specifically, a discrete spring element 1827 is interposed between a conductor 1825 of each cable 1823 and a discrete contact element 1826. Referring to the PCB interface, the spring element 1827 urges the contact element 186 against a printed pad 1828 on the PCB 1810 in a conventional manner, with the printed pads 1828 being coupled to a conductive trace on the PCB, directly or through one or more vias 1811. Cables 421 extending between respective pairs of through-holes 425 in a backplane 401 (or between capture blocks as described in reference to FIG. 8) have ends disposed substantially flush with a daughterboard-mounting surface 1840 of the backplane 401 and disposed in a pattern selected to match the connector contact pattern. Thus, instead of mating with pads printed on the backplane (e.g., pads coupled to conductive vias or directly to traces), some or all of the spring-biased contacts 1826 of the connector 1820 are urged against landings formed by the cable conductors 423. Connectors of the type shown in FIG. 18B are manufactured and sold under the tradename SIP1000™ by Northrop Grumman Corporation of Los Angeles, Calif.

Figure 19A:
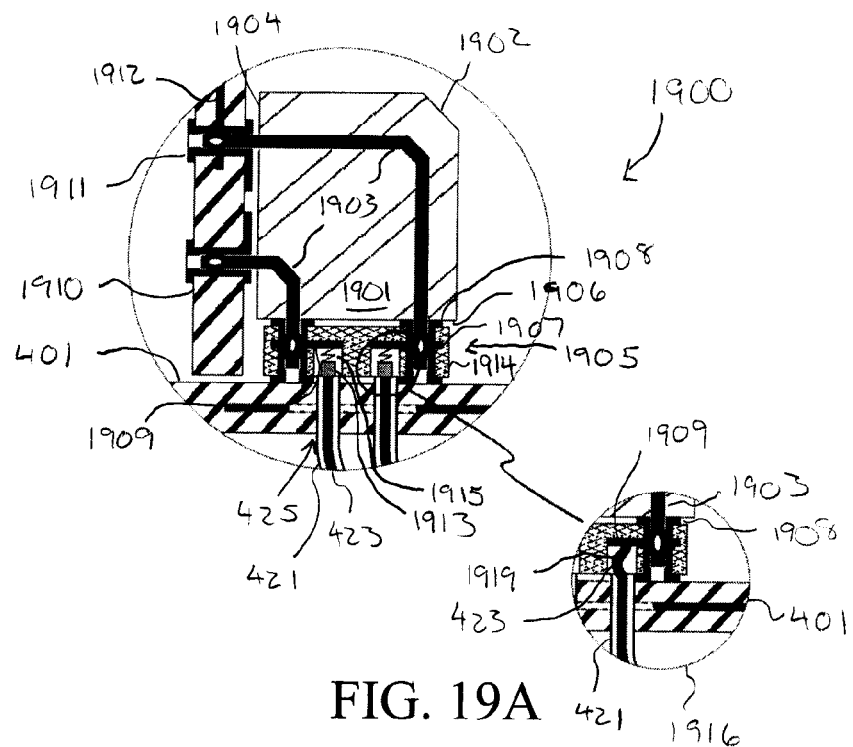
FIGS. 19A-19O illustrate electronic connectors and a conductor coupling structure according to different embodiments of the invention.

FIG. 19A illustrates an electronic connector assembly 1900 according to an embodiment of the invention. The connector assembly 1900 includes a right-angle connector 1901, and a pitch adapting assembly 1905. The right-angle connector 1901 includes a housing 1902 having perpendicular mating surfaces 1904 and 1906, and conducting members 1903 that extend through the housing 1902 and project beyond the mating surfaces 1904 and 1906. Mating surface 1904 is disposed adjacent PCB 1910 and the conducting members 1903 are inserted into to conductive vias 1911 within the PCB 1910 to make electrical contact therewith (e.g., by friction contact or soldered connection). The pitch-adapting assembly 1905 is disposed adjacent surface 1906 of the right-angle connector 1901 and includes a substrate 1907 having conductive vias 1908 disposed therein, conductive traces 1909 that extend from the conductive vias 1908 to bottom surfaces of cavities 1915 and spring-contact assemblies 1913 disposed within the cavities 1915. The cavities 1915 are formed within the substrate 1907 in alignment with counterpart through-holes 425 in a backplane 401, thereby enabling the spring-contact assemblies 1913 (e.g., pogo pins, fuzz buttons or other compressible contact assemblies) to mate with conductors 423 of cables 421 disposed within the through-holes 425. The conducting members 1903 of the right-angle connector 1901 project beyond surface 1906 and are inserted into the conductive vias 1908 of the substrate 1914 to make electrical contact therewith (e.g., by friction contact or soldered connection). Thus, signals transmitted by an IC device mounted on PCB 1910 propagate on the conductive traces of the daughterboard (e.g., 1912), through the vias 1911 to the conducting members 1903. The signals propagate through the conducting members 1903 to the conductive vias 1908 in the substrate 1914, and from the vias 1908 to the conductive traces 1909, to the spring-contact assemblies 1913 and to the conductors 423 of cables 421. Thus, the pitch adapting assembly 1905 may be used to adapt the pin-out pitch of commercially available connectors as necessary for alignment with conductor contacts in a cabled backplane assembly. Note that the conductive vias 1908 may be back-drilled to reduce via stubs. Also, as shown in detail view 1916, the conductors 423 of cables 421 may project above the surface of the backplane 401 and have an integral-spring formation 1919 to enable a flat end of the conductors to urge against the traces 1909 within the cavities 1915. Also, in an alternative embodiment, the pitch-adapting assembly 1905 may be disposed within or formed within the backplane assembly rather than being part of the connector assembly 1900. That is, the conductive vias 1908, conductive traces 1909 and cavities 1915 may be formed within the backplane substrate rather than in separate substrate member 1914. In such an embodiment, the conducting members 1903 of the right angle connector may be removably inserted into the conductive vias 1908 in the backplane to establish connection to the cabled signal path. The connector assembly of FIG. 19A may alternatively be a straight through connector assembly (e.g., using a straight-through connector rather than right-angle connector 1901).

Figure 19B:
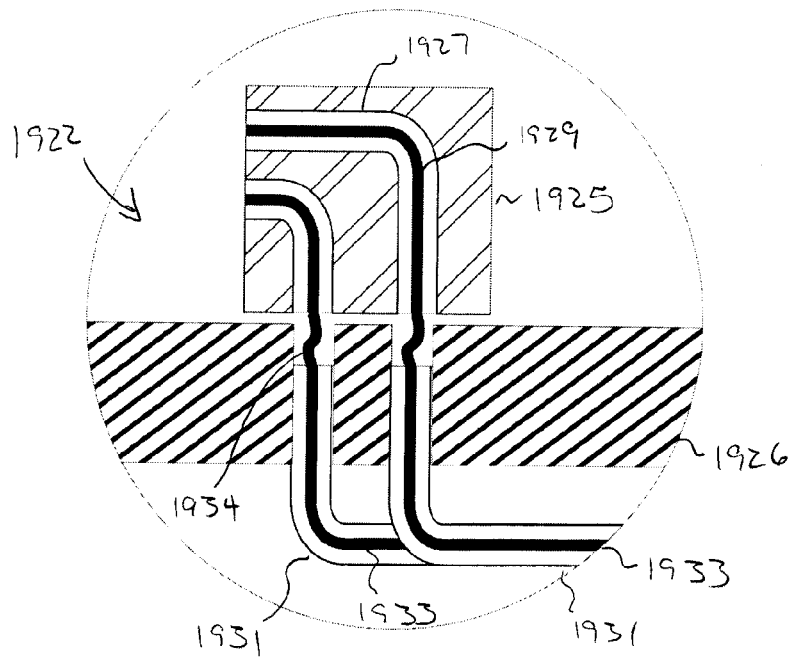

FIG. 19B illustrates an alternative electronic connector embodiment 1922 that includes a housing 1925 and a set of electronic cables 1927 disposed within the housing 1925. In contrast to the connector of FIG. 18B, the conductors 1929 of the cables 1927 extend to at least one exterior interface of the housing 1925 and form respective contact surfaces for mating with counterpart contacts on a daughterboard or backplane assembly. That is, the connector contact is formed by the end of the conductor 1929; no pogo pins, fuzz buttons or other intermediary conducting structure is provided between the end of the cable conductor and the contact. The opposite ends of the conductors 1929 may likewise form contacts for mating with counterpart contacts on a daughterboard or backplane assembly. Alternatively, intermediary conducting structures may be provided at the opposite ends of the conductors 1929 to urge contacts against printed pads on the daughterboard or backplane. In one embodiment, conductors 1933 having integral spring structures 1934 project from a backplane assembly 1926 (e.g., from a capture block as described in reference to FIGS. 13-16) and are deflected in response to normal forces resulting from contact with the ends of conductors 1929 of the connector 1922. By this arrangement, conductors of the backplane assembly 1926 and connector 1922 (i.e., conductors 1933 and 1929) are disposed in axial contact with one another, and urged against one another by the spring-force of the integral-spring structure 1934. By using cables that have similar electrical characteristics in both the backplane assembly 1926 and the connector 1922, a composite cable is formed from the daughterboard interface to the remote backplane-to-daughterboard interface (i.e., the composite cable including one of cables 1927 and a contacting one of cables 1931). The region of axial junction between cable conductors 1929 and 1933 is extremely narrow and less than a quarter wavelength of most high-speed electrical signals expected to be transmitted over the backplane assembly, thereby ensuring that little or no signal reflections result as signals propagate across the junction. Diamond or carbide dust or similar contact-facilitating material may be disposed on the ends of the conductors 1929 and 1933 to improve native oxide penetration at the contact surfaces and thus electronic conduction at the conductor junction.

Figure 19C:
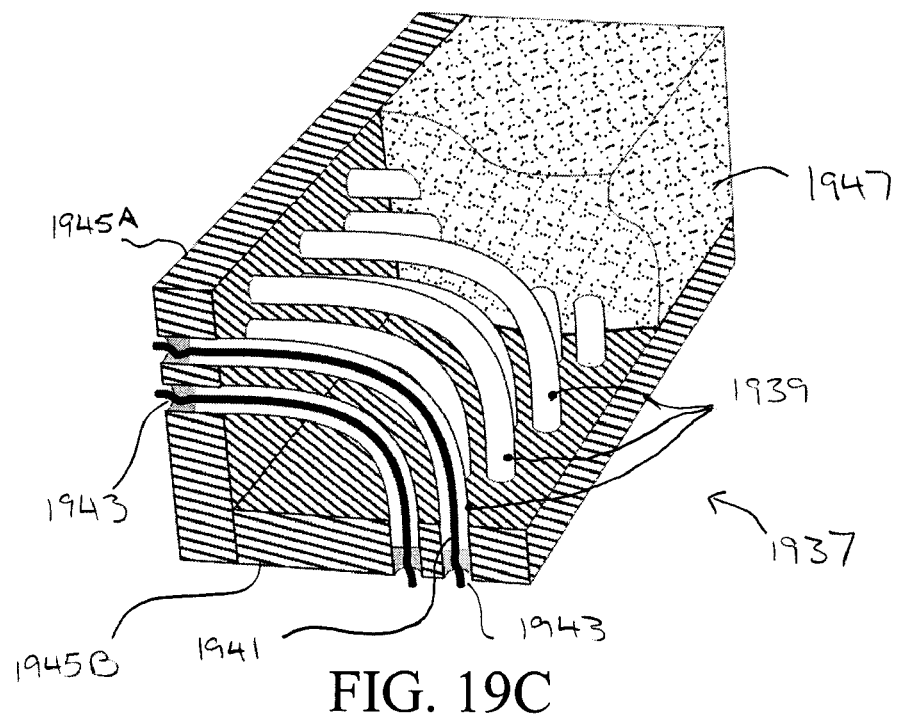

FIG. 19C illustrates an electronic connector according to another embodiment of the invention. The connector 1937 includes a set of electronic cables 1939 extending between a pair of shielding members 1945A, 1945B and housed within a molded housing 1947. In one embodiment, the shielding members 1945 are implemented in the manner described in reference to FIG. 14. That is, conductors 1941 of cables 1939 extend into chambers formed by the shielding members 1945A, 1945B and have bends 1943 to form integral-spring contacts. The guide members shown in FIG. 14 may be disposed over the shielding members 1945A, 1945B with the conductors 1941 projecting through openings in the guide members to form spring-loaded contacts to mate with pads on printed circuit boards or cable conductors as in FIGS. 4 and 8. Various constructs may be used to implement shielding members 1945A, 1945B in different embodiments including, without limitation, the shielding member 1405 described in reference to FIG. 14 or the cable capture block 1301 of FIG. 13 with shielding elements being used to form sub-chambers within the chamber 1303. Also, while shielding members 1945A, 1945B are depicted at both interfaces of the connector of FIG. 19C, a shielding member 1945 may be provided at only one interface in an alternative embodiment. Also, each of the cables may be any of the multi-conductor cables described above, including coaxial cables in which the center conductor is used to form a contact, and the outer conductor is coupled to a shielding member 1945A and/or 1945B (i.e., only one conductor extending into each chamber formed within the shielding member).

Figure 19D:
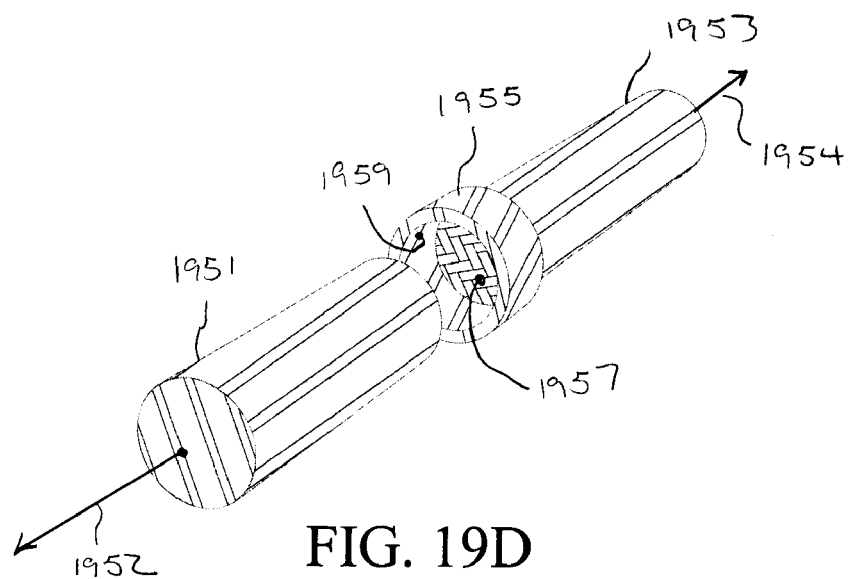

FIG. 19D illustrates an embodiment of a conductor coupling structure that may be used in conductor-to-conductor junctions such as those formed in the connector-to-backplane conductor junctions shown in FIGS. 19B and 19C. As shown, a collar 1955 is attached or integrally formed (e.g., by swaging) at the mating end of a conductor 1953, thereby forming a socket for receiving the flat or chamfered end of a counterpart conductor 1951. An insulator may also serve as the collar 1955. In one embodiment, the interior wall 1959 of the collar 1955 is conductive and contacts the neck of the counterpart conductor 1951 (i.e., the surface of the conductor adjacent the flat end). The flat end of the conductor 1951 is thus secured within the socket formed by collar 1955, thereby preventing loss of contact in response to minor translation of the connector relative to a backplane assembly or daughterboard. The conductor 1951 is maintained in contact with the flat end of the conductor 1953, for example, by a spring force resulting from the integral-spring conductor formation shown in FIG. 19B or 19C (i.e., either or both of conductors 1951 or 1953 may have an integral spring structure). Alternatively, a conductive bottom wall 1957 of the collar 1955 is secured to the end of the conductor 1953 and is maintained in contact with the flat end of the conductor 1951. Such an arrangement allows for the joining of a spring metal to a softer metal to make a contact. The ends of the conductors may be doped with micro-wires that have spring qualities or are treated to achieve spring qualities. The conductors 1951 and 1953 are referred to herein as being in axial contact with one another, as the conductors 1951 and 1953 contact one another at surfaces that are normal to axes of extension 1952 and 1954, respectively.

Figure 19E:
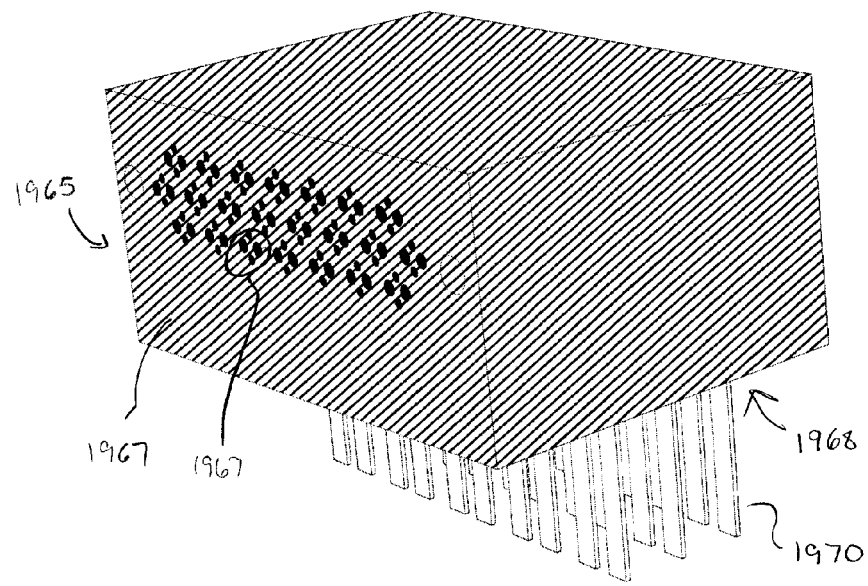

FIG. 19E illustrates an electronic connector 1965 according to another embodiment. The connector 1965 includes a plurality of multi-conductor cables each having, for example, two signal carrying conductors and two return conductors. Cables having more or fewer signal carrying conductors and more or fewer return conductors may be used in alternative embodiments. A first connector interface 1967 is formed as shown in FIG. 18B, for example, by using pogo pins, fuzz buttons or other intermediaries to urge contacts 1969 against printed pads on a daughterboard (or backplane), or against landings formed by cable conductors as shown in FIGS. 4 and 8. A second connector interface 1968 is formed as shown in FIG. 18A, by receptacles coupled to ends of the internal cable conductors and adapted to receive projecting male pins 1970 of a connector socket. As an example, in one embodiment, the first connector interface 1967 has a contact pattern that corresponds to the contact pattern of a SIP1000™ connector, and the second connector interface 1968 has internal receptacles disposed in a pattern that corresponds to a GbX™ socket. Other contact footprints and receptacle patterns may be used in alternative embodiments. Also, while a right-angle connector is shown, straight-through connectors having different connector interfaces may also be used (e.g., a connector having a contact pattern that corresponds to the contact pattern of a SIP1000™ connector at one end, and receptacles disposed in a pattern that corresponds to a GbX™ socket at the opposite end).

Figure 19F:
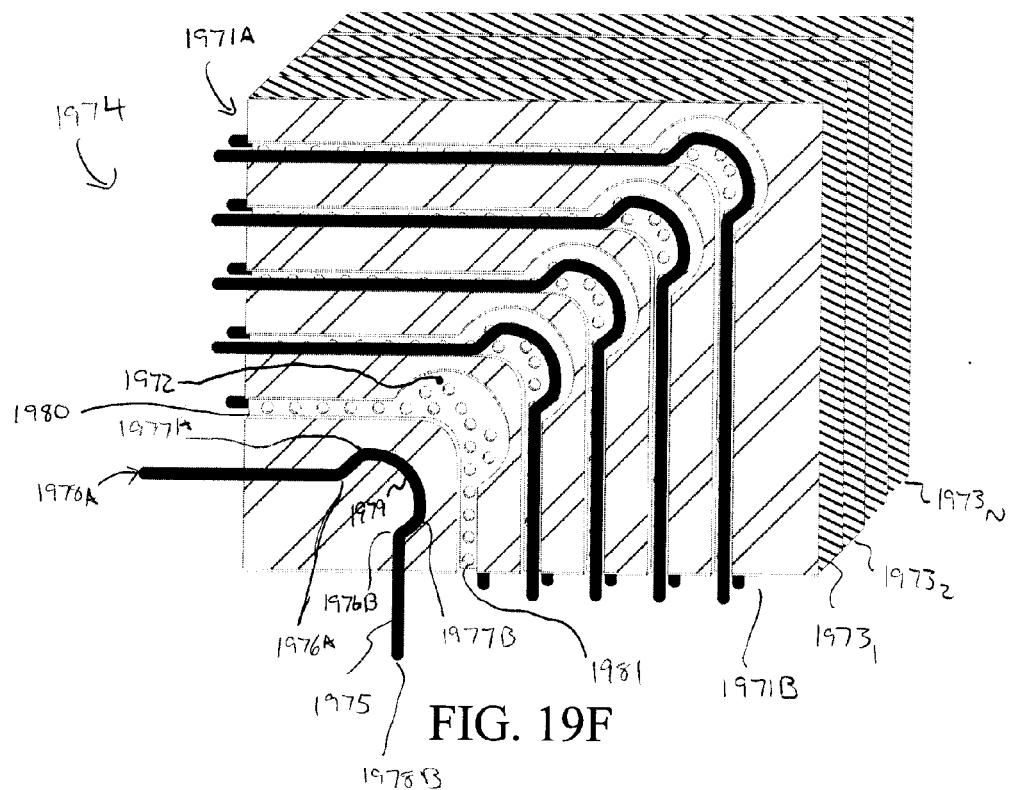

FIG. 19F illustrates an electronic connector 1974 according to another embodiment. The connector 1974 includes a plurality of guide members 1973$_1$-1973$_N$ disposed adjacent one another and each having a number of right-angle passageways 1980 formed therein. Conductive members 1975 are disposed within the right angle passageways and project from perpendicular surfaces 1971A and 1971B of the connector 1974 to form contacts for mating with printed pads on a daughterboard or backplane, or for mating with landings formed by cable conductors. In the embodiment of FIG. 19F each passageway 1980 includes an expanded interior chamber 1972 disposed at the right-angle bend, and the conductive members 1975 each include a pair of bends 1976A, 1976B disposed at the entry points of the interior chamber 1972 (i.e., chamber-entry bends), and a pair of bends 1977A, 1977B leading to an arc section 1979 of the conductive member disposed within the interior chamber 1972. By this arrangement, a normal force applied to either contact surface 1978A, 1978B of a conductive member 1975 (e.g., due to contact with a printed pad or cable conductor) will deflect the contact surface toward the corresponding surface of the connector, increasing nearest pair of bend angles (i.e., the bend angle of the chamber-entry bend 1976 and the arc bend 1977 nearest the end of the conductor being deflected) such that a counter-acting force is applied to urge the deflected end of the conductive member 1975 against the source of deflecting force (i.e., urge the end of the conductive member 1975 against a printed circuit pad or landing formed by a cable conductor). Thus, the conductive members 1975 effectively form springs that are deflectable at either connector interface and that urge against the counterpart contact. Because the conductive paths through the connector are formed with no intermediary structures (e.g., fuzz buttons, pogo pins, etc.), impedance discontinuities arising from such structures are avoided and manufacturing is simplified.

In one embodiment, the guide members 1973 are formed from a low-dielectric-constant material to reduce dielectric loss in signals propagating through the conductive members, and may include holes 1981 to further reduce dielectric loss. Also, conductive shielding may be disposed between the guide members 1973 and/or between individual passageways 1980 in a given guide member 1973. In an alternative embodiment, each of the guide members 1973 is formed from a conductive material and the passageways 1980 are coated with a low-dielectric-constant insulating material to electrically isolate the conductive members 1975 from the guide members 1973. By this arrangement, signals propagating on the conductive members 1975 are shielded from one another within the connector 1974.

Figure 19G:
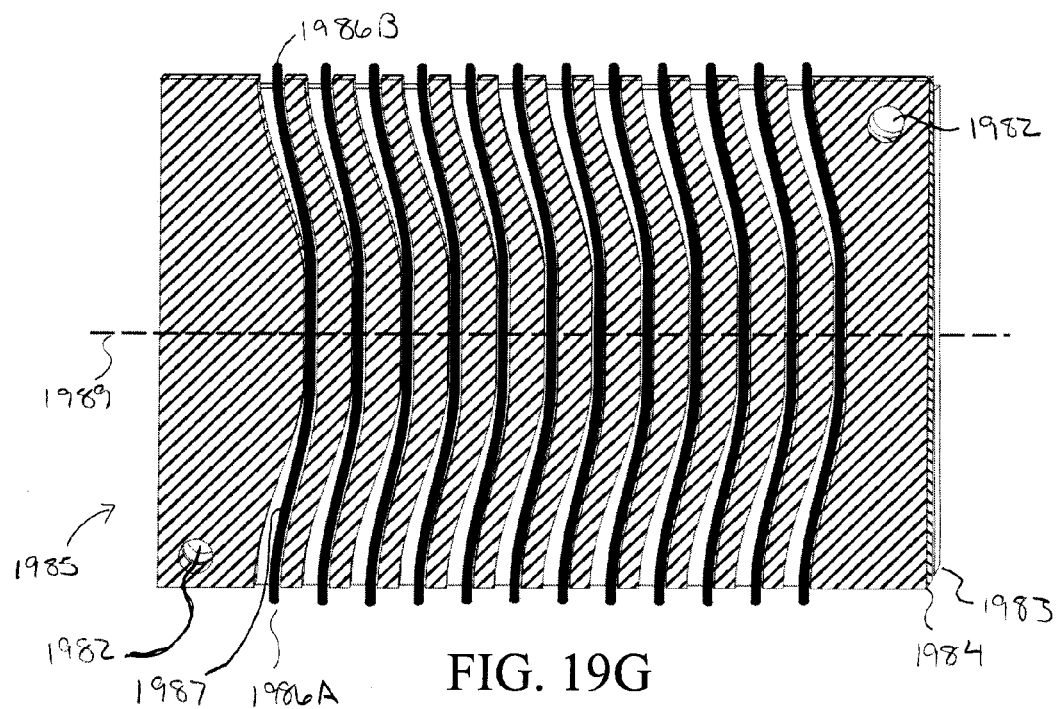

Still referring to FIG. 19F it should be noted that numerous other bend geometries may be used to achieve the spring action of the conductive members 1975. For example, the bend geometry shown in FIG. 16 may be replicated in each of the two perpendicular branches of a passageway 1980, thereby enabling contact spring action at both connector surfaces 1971A, 1971B. Also, while a right angle connector is shown in FIG. 19, a straight-through connector having integral-spring conductive members may be formed using guide members having passageways that enable spring action in either of two opposite directions. FIG. 19G illustrates a set of such a guide members 1984 and a conductive member 1987 disposed within a passageway 1988 having mirrored halves (i.e., mirrored about center line 1989) each of which corresponds to the passageway described in reference to FIG. 16. That is, each half of the passageway 1988 includes a wide turn to enable a bend angle in the conductor 1987 to increase, and a narrow turn to hold the secure the conductor within the passageway 1988. By this arrangement, conductor ends 1986A, 1986B are enabled to deflect in response to an applied contact force, and urge against the source of the contact force. In one embodiment, multiple guide members 1984 are provided within a connector, with each pair of guide members 1984 being insulated from one another by an insulating member 1983. The guide members 1984 and insulating members 1983 may be secured to one another using adhesive material and/or by mechanical fasteners (e.g., screws, bolts or pins inserted into openings 1982).

Figure 19H:
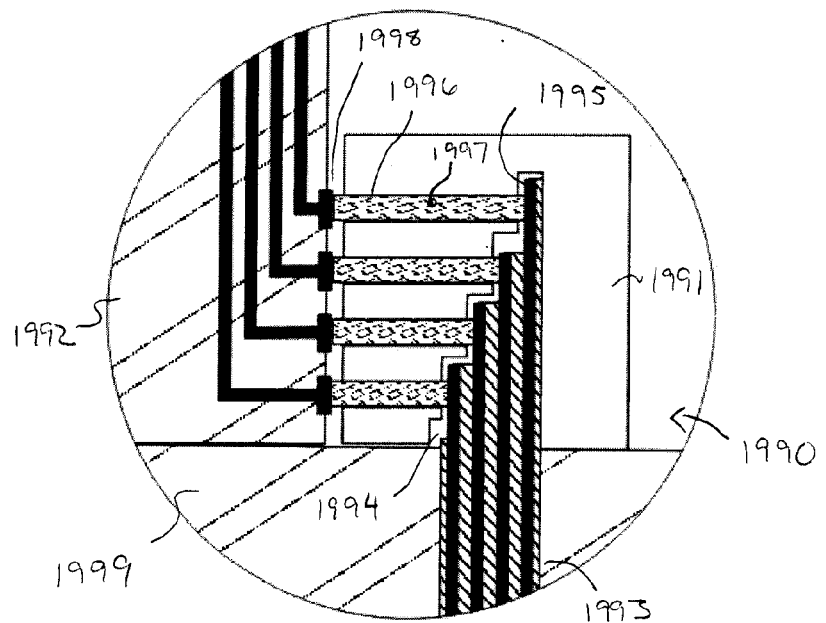

FIG. 19H illustrates an electronic connector 1990 according to another embodiment. The connector 1990 includes a housing 1991 having a stair-stepped cavity 1994 adapted to receive a flex cable 1993. A set of passageways 1996 extend perpendicularly to the flex cable 1999, each forming a through-hole from a respective step of the stair-stepped cavity 1994 to printed pads 1998 disposed on a daughterboard 1992. Compressible conductive members 1997 or assemblies (e.g., Fuzz buttons, conductive members with spring-bends as described above or conductive members with pogo pin assemblies at either end) are disposed within the passageways 1996 and compressed between a respective conductor 1995 of the flex cable 1996 and a corresponding one of the printed pads 1998. In the embodiment of FIG. 19H, the flex cable extends through an opening in a backplane 1999 and into the stair-stepped cavity 1994, the ends of the flex cable being cut in stair-stepped pattern to conform to the cavity. In an alternative embodiment, the flex cable 1993 may extend directly into the stair-stepped cavity without passing through a backplane opening (e.g., in interconnection applications that do not include backplanes). Also, the flex cable 1993 may be a multi-layer flex cable (i.e., having an array of individual conductors) with the conductors of other layers mating with conductive members 1997 extending through passageways not visible in the profile view of FIG. 19H.

Figure 19I:
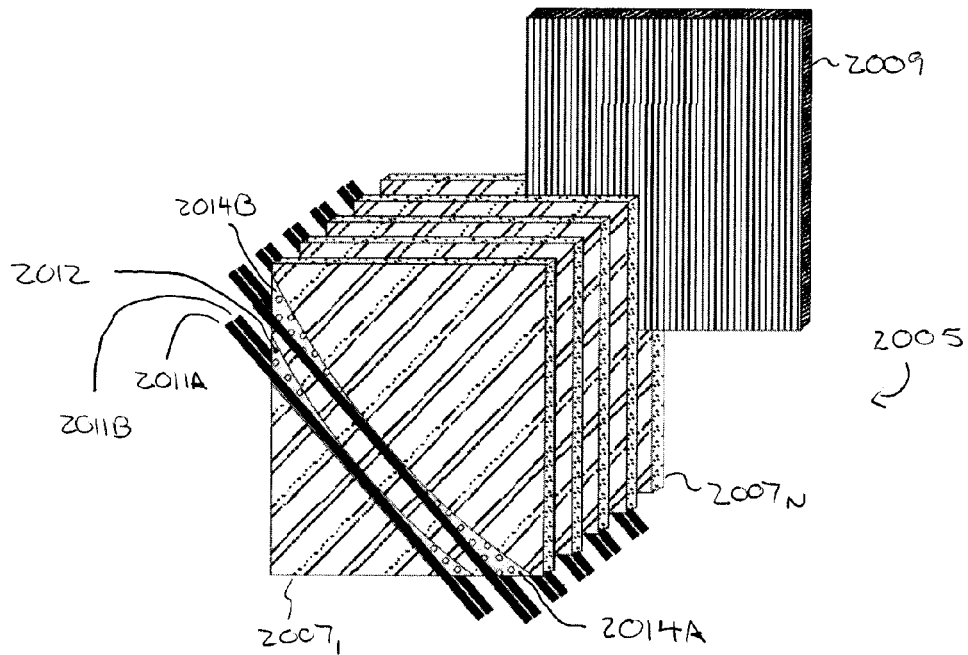
Figure 19J:
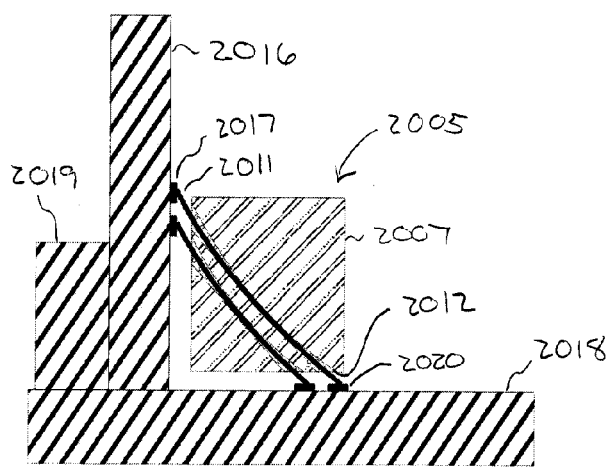

FIG. 19I illustrates another embodiment of a connector having guide members 20071-2007N and insulating members 2009 disposed between adjacent pairs of guide members. Each of the guide members 2007 includes one or more channels 2012 through which substantially straight conductive members 2011 extend. In the specific embodiment of FIG. 19I, counterpart pairs of conductive members 2011A, 2011B are disposed in counterpart channels 2012 formed on opposite surfaces of each guide member 2007. Alternatively, channels may be formed only on one surface of each guide member 2007. Each of the channels 2012 includes widened regions 2014A, 2014B at either end to enable the conductive member 2011 to bend in response to a contact force. FIG. 19J illustrates the connector 2005 of FIG. 19I coupled between landings 2017 and 2020 on PCBs 2016 and 2018, respectively (e.g., a daughterboard and backplane). As shown, the connector 2005 is disposed such that the landings 2017 and 2020 each apply a bending force against contact ends of the conductive elements 2011, causing the conductive elements 2011 within each of the guide members 2007 to bend within the widened regions of the channels 2012. By this arrangement, ends of the conductive elements 2011 are urged against the landings 2017 and 2020 to establish reliable electrical contact without use of intermediary structures such as pogo pin assemblies or fuzz buttons, and without need to solder the conductive elements 2011 to landings 2017 and/or 2020. The connector 2005 may be secured to the PCBs 2016 and 2018 by clips, screws, bolts or other mechanical fasteners. Also, the PCBs 2016 and 2018 may be held in position relative to one another by a retaining block 2019 (e.g., the coupling block 2019 being permanently or removably screwed, bolted, clipped, or otherwise secured to each of the PCBs 2016 and 2018) or other retaining structure.

Figure 19K:
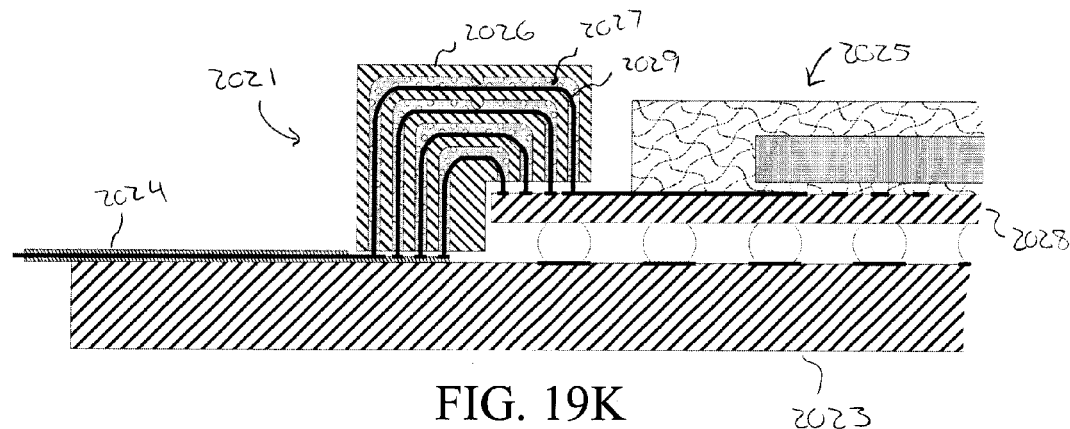

FIG. 19K illustrates an embodiment of a connector 2021 that may be used to interconnect contacts disposed on parallel surfaces. In the particular embodiment shown, the connector is used to establish an electrical connection between a first set of contacts disposed on the substrate 2028 of an IC package 2025 and conductors of a cable 2024 disposed on a surface of a PCB 2023. The connector 2021 includes a housing 2026 having passageways 2027 and conductive elements 2029 disposed within the passageways 2027. The passageways are 'U'-shaped (or 'J'-shaped), effecting a 180 degree turn such that the conductive elements 2029 extend between contacts disposed on parallel surfaces (i.e., the surface of substrate 2028 and the surface of PCB 2023). As shown in FIG. 19K, the parallel surfaces may be offset from one another (i.e., non-coplanar). Alternatively, the parallel surfaces may be coplanar. In alternative embodiments, the surfaces at which the contacts to be interconnected are disposed may have any angle relative to one another, with the passageways 2027 effecting turns as necessary to establish contact between the surfaces.

Figure 19L:
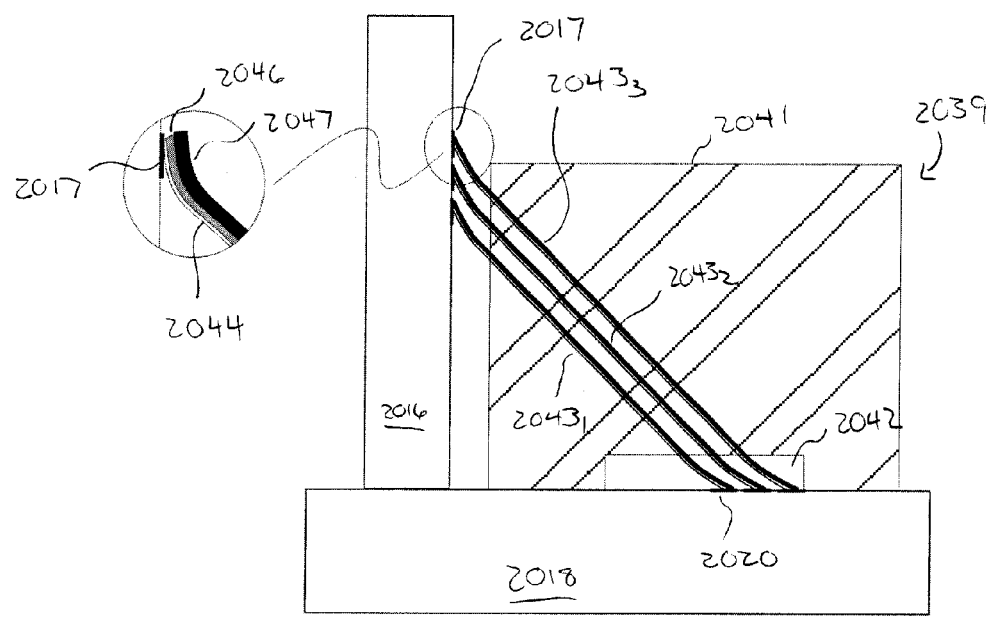
Figure 19M:
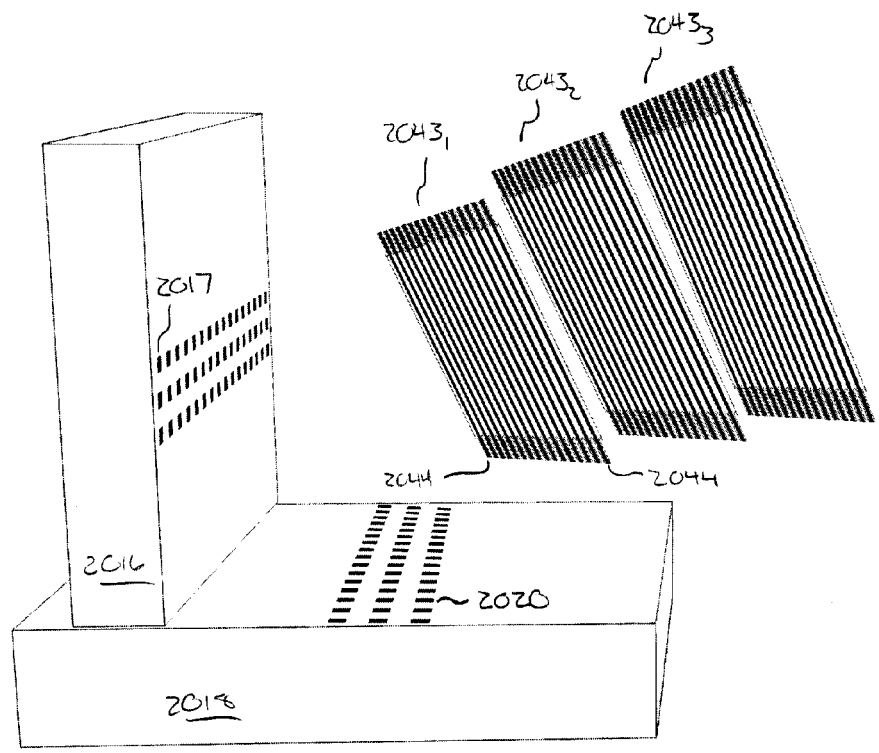

FIG. 19L illustrates another embodiment of a connector 2039 that may be used to interconnect contacts 2017 and 2020 disposed on respective PCBs 2016 and 2018. The connector 2039 includes a flex circuit cables 2043$_1$-2043$_3$ that extend through a housing 2041 and emerge from different surfaces of the housing 2041. In one embodiment, the housing 2041 is secured to (or rests on) PCB 2018 and includes a recessed region (or cavity) 2042 into which the flex circuit cables 2043$_1$-2043$_3$ extend. The housing 2041 may alternatively be secured to PCB 2016. Each of the flex circuit cables 2043 includes a metal backing 2047, insulating sheet 2046 and conductors 2044 (only one conductor 2044 being shown in FIG. 19L), with the conductors 2044 each contacting a respective one of contacts 2017 on PCB 2016 and a corresponding one of contacts 2020 of PCB 2018. FIG. 19M is a perspective view illustrating an arrangement of contacts 2017 and 2020 on PCBs 2016 and 2018, respectively, and the flex circuit cables 2043$_1$-2043$_3$ of FIG. 19L. As shown, each of the flex circuit cables 2043 includes multiple conductors 2044 disposed to mate with corresponding contacts 2017 and 2020 of the PCBs 2016 and 2018, respectively.

Figures 19N, 19O:
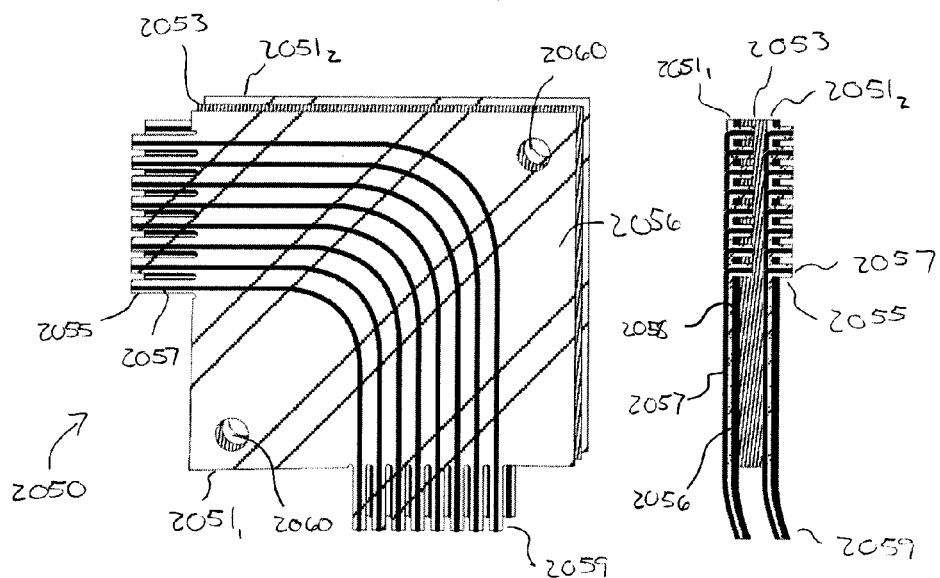

FIGS. 19N and 19O illustrate an alternative embodiment of a connector 2050 having a pair of flex circuit members 2051$_1$ and 2051$_2$ separated from one another by an insulating member 2053. Each of the flex circuit members 2051 is formed from a low-dielectric-constant film (or sheet) 2056 and having flat or round conductors 2057 disposed thereon. The film 2056 and conductors 2057 protrude from a body of the connector 2050 to form contact ends 2055 and 2059. The connector 2050 may have any number of flex circuit members 2051 and insulating members 2053 in alternative embodiments, and the flex circuit members 2051 and insulating members 1603 may be secured to one another using adhesive material and/or by mechanical fasteners (e.g., screws, bolts or pins inserted into openings 2060). In one embodiment, shown in the profile view of FIG. 19), a metal backing 2058 may be disposed on a side of the film 2056 opposite the conductors 2057 for shielding purposes. Also, the contact ends 2055 and 2059 may have bends to facilitate contact with counterpart printed pads (or cable conductor landings) on a printed circuit board.

Cable Housings

Figure 20:
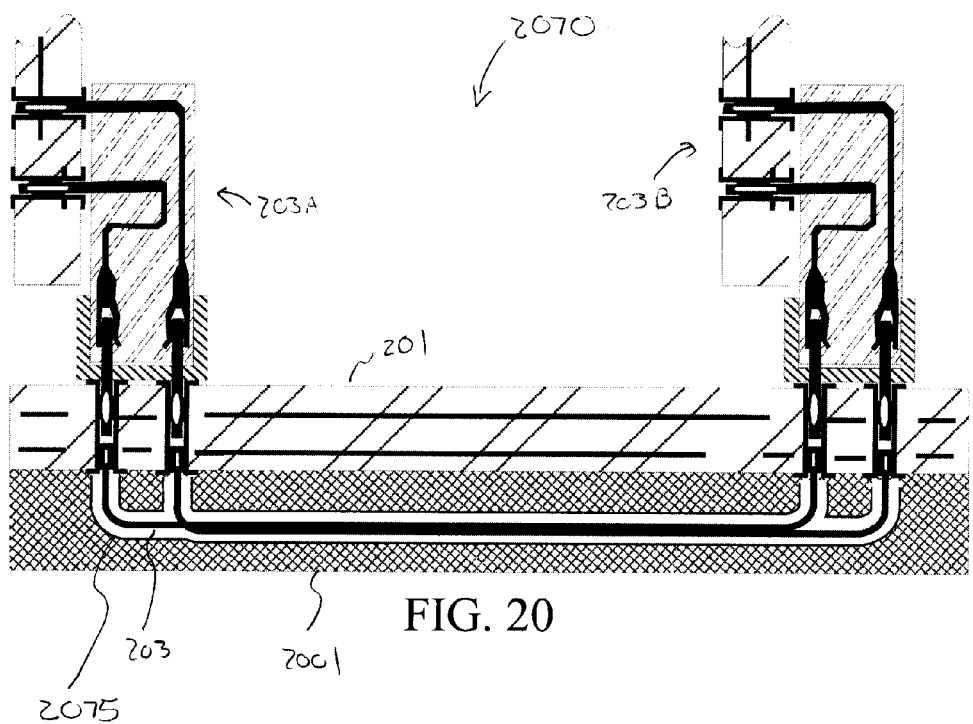
FIG. 20 illustrates an interconnection system according to an alternative embodiment of the invention.

FIG. 20 illustrates an interconnection system embodiment 2000 that corresponds to the interconnection system of FIG. 2A (i.e., cables 203 are coupled between vias in backplane 201 to establish interconnections between daughterboards 203A and 203B), except that a cable housing 2000 is provided to encapsulate the cables 203 extending between the backplane vias. In one embodiment, the housing 2001 is a polymeric material molded over the cables 203 after the cables have been coupled to the backplane. The housing 2001 may be secured to the backplane by mechanical retaining members (e.g., screws, bolts, clips, etc.) and/or adhesive material. Alternatively, the housing 2001 may be formed from a material that adheres to the surface of the backplane when cast. In an alternative embodiment, a prefabricated housing 2001 is secured to the backplane to form a cable chamber 2005 though which the cables 203 extend. For example, the prefabricated housing 2001 may be formed from aluminum, polymeric material or other material that can be easily manufactured and secured to the backplane. More generally, housings formed from virtually any material may be molded or disposed over the cables 203 or the cables used in any of the backplane assemblies described above (e.g., the backplane assemblies described in reference to FIGS. 2, 4 and 8) to prevent the cable from being moved relative to the backplane assembly and to prevent inadvertent contact with the cables.

Composite-Cable Interconnection Systems

Figure 21:
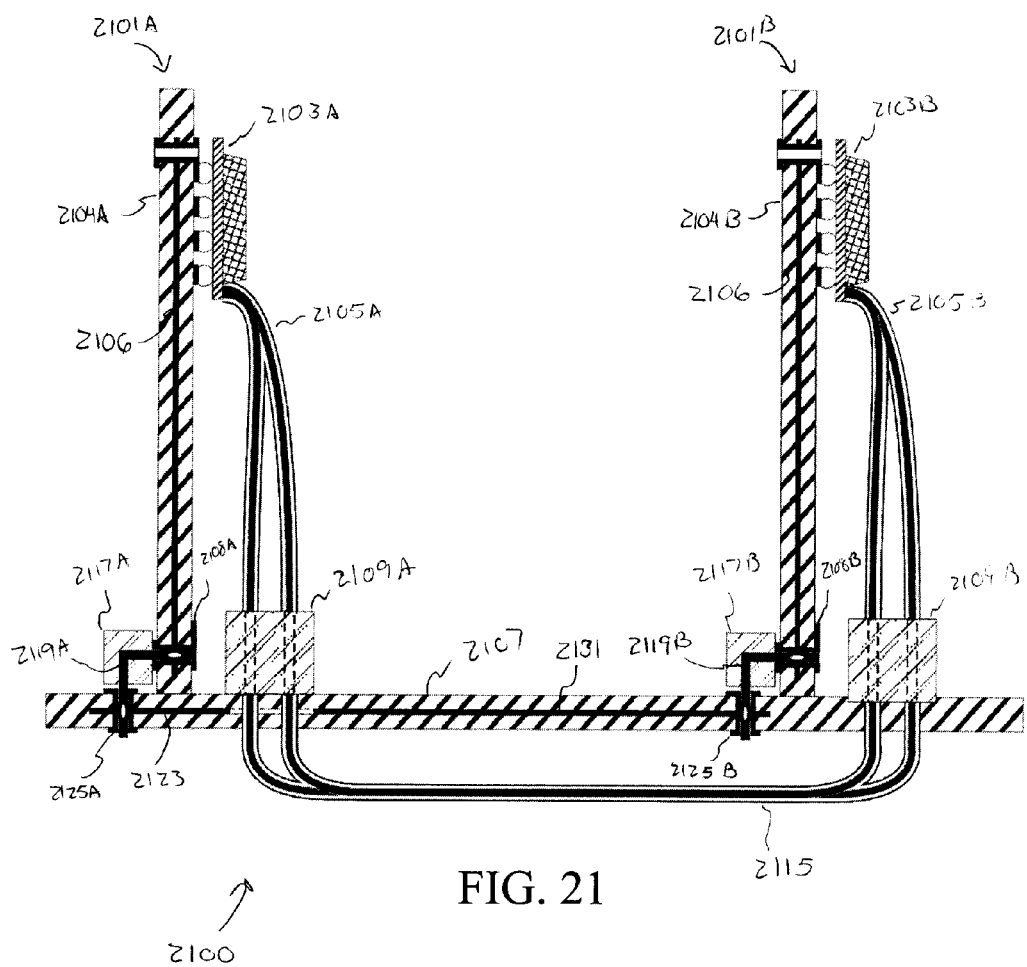
FIG. 21 illustrates an interconnection system according to another embodiment of the invention.

FIG. 21 illustrates a backplane-based interconnection system 2100 according to another embodiment of the invention. In contrast to the backplane-based interconnection systems of FIGS. 2, 4 and 8 in which conventional daughterboard assemblies are coupled to cabled backplanes, one or more cabled daughterboard assemblies are used in combination with a cabled backplane to establish signal paths having one or more cable-to-cable junctions. Because multiple cables are integrated to form the signal path, such signal paths are referred to herein as composite-cable signal paths. Referring to FIG. 21, a first daughterboard 2101A includes a PCB 2104A having an IC device 2103A disposed thereon, and a cable 2105A coupled directly between the IC device 2103A and a capture block 2109A. A second daughterboard 2101B similarly includes a PCB 2104B having an IC device 2103 disposed thereon, and a cable 2105B coupled directly between the IC device 2103B and a capture block 2109B. Various embodiments of printed circuit board assemblies and signaling systems having cabled interconnections to an integrated circuit device are described in U.S. patent application Ser. No. 10/426,930, filed Apr. 29, 2003, which is hereby incorporated by reference.

The capture block 2109A may be any of the capture blocks described above, and includes contacts that mate with conductors of cables 2115 disposed in through-holes of the backplane 2107 (or cable assemblies as described in reference to FIG. 8). In the embodiment of FIG. 21, the daughterboards 2101A, 2101B include conventional right angle connectors 2117A, 2117B having conductive members 2119A, 2219B for interconnecting conventional conductive traces 2131 and 2106 on the backplane 2107 daughterboards 2101, respectively. The conductive traces 2131 and 2106 are used, for example, to transmit non-speed-critical signals, and/or to provide power and ground voltages. In an alternative embodiment, the right angle connectors 2117A, 2117B may be used merely for mechanical support, with all signals and power delivered via cables 2115. Although shown as being physically offset from the surfaces of the daughterboards 2101, the capture blocks 2109 may be secured to the daughterboards 2101 in an alternative embodiment. In such an embodiment, if all signals and power are delivered via cables (i.e., through the capture block), the right-angle connectors 2117A, 2117B (or either of them) may be omitted altogether, and the capture blocks 2109A, 2109B used to physically secure the daughterboards 2101 to the backplane 2107. Also, while two daughterboards 2101A, 2101B having cabled chip-to-backplane signal paths are shown in FIG. 21, one of the daughterboards may alternatively include conventional conductive trace interconnects to the IC device.

Reflecting on the interconnection system 2100 of FIG. 21, it can be seen that the entire signal path between IC devices 2103A and 2103B is formed by cabled connections. Consequently, impedance discontinuities resulting from via stubs, conventional connector interfaces, non-uniform trace widths, and materials having unequal dielectric-constants are avoided, thereby reducing signal reflections and increasing signal to noise ratio. By using low-dielectric-constant insulating materials to insulate the conductors within cables 2105A, 2115 and 2105B, extremely low dielectric losses may be achieved, reducing signal dispersion (and therefore reducing intersymbol interference) and attenuation. As a result, low-power signal transmission circuits (e.g., current-mode logic drivers, push-pull signal drivers and so forth) may be used to generate signals having substantially smaller signal swing, thereby increasing supply voltage headroom and enabling increasingly smaller process geometries and supply voltages. Conductive shields may be disposed about the conductors within cables 2105A, 2115 and 2105B, thereby reducing crosstalk and further increasing the signal-to-noise ratio and enabling a potentially higher-density of interconnections between daughterboards. Also, because all the component cables within a composite-cable signaling path may be cut to precisely the same length as counterpart cables within another composite-cable signaling path, timing skew may be substantially reduced without need for complex trace routing. Further, the backplane 2107 and PCBs 2104A and 2104B may be fabricated in substantially fewer substrate layers and with substantially simplified trace routing due to the reduced number of signal traces borne by such structures.

Figure 22:
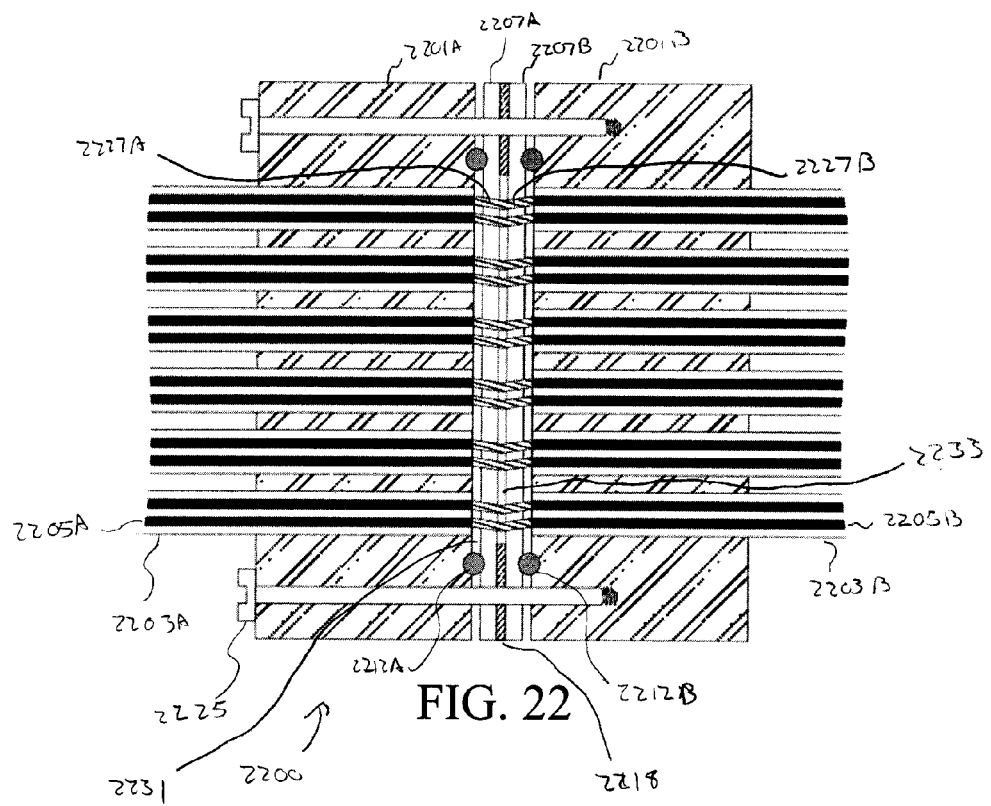
FIG. 22 illustrates an embodiment of a cable-to-cable connection structure.

FIG. 22 illustrates an embodiment of a cable-to-cable connection structure 2200 having counterpart alignment heads 2201A and 2201B, and counterpart connector elements 2207A and 2207B. Cables 2203A and 2203B are received in respective through-holes in the alignment heads 2201A and 2201B, and are disposed such that the cable conductors 2205A and 2205B are exposed at an inner surface of the alignment heads 2201A and 2201B, respectively. In one embodiment, compliant contacts 2227A and 2227B are disposed within the connector elements 2207A and 2207B, respectively, such that, when one of the connector elements 2207 is secured to the corresponding alignment head 2201, the contacts 2227 are urged against the flat ends of the cable conductors 2205. The connector element 2207 may be secured to the corresponding alignment head 2201 by adhesive or by retaining members (e.g., screws or clips). Also, as shown in FIG. 22, a seal ring 2212A, 2212B may be disposed between the connector element 2207 and corresponding alignment head 2201 to keep out undesired matter. When the alignment head-connector assemblies are mated to one another, the compliant contacts 2227A, 2227B disposed within the connectors 2207A, 2207B contact one another to form an electrical interconnection path between the conductors 2205A, 2205B disposed within the alignment heads 2101A, 2101B. Screws 2225 (or clips or other retaining members may be used to secure the two halves of the connection structure 2200 together, and a compressible inner seal ring 2218 may be disposed in a frame about the face of one or both of the connection elements 2207A, 2207B to form a sealed chamber 2233 when the two halves of the connection structure 2200 are joined.

Figure 23A:
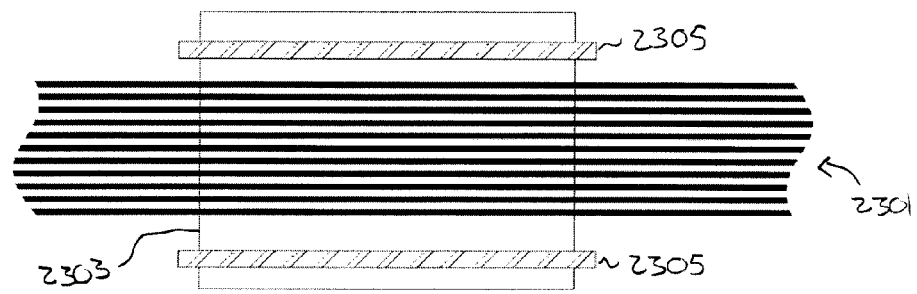
FIGS. 23A-D illustrate methods of manufacturing a cable-to-cable connector according to an embodiment of the invention.
Figure 23B:
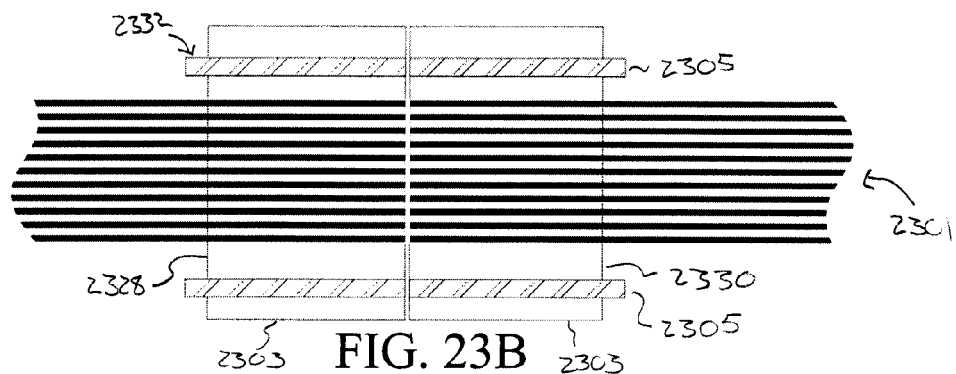
Figure 23C:
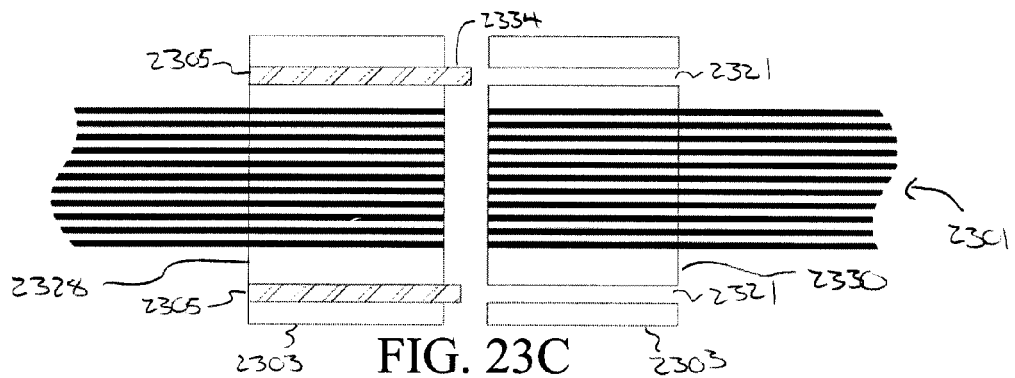

FIGS. 23A-D illustrate methods of manufacturing a cable-to-cable connector according to an embodiment of the invention. Initially, as shown in FIG. 23A, a set of cables 2301 are held parallel to one another in a loom-type structure (not shown) and a molded housing 2303 is formed over a portion of the cables 2301. Guide pins 2305 may also be held in a predetermined position relative to the cables 2301 with the molded housing being formed over a portion of the guide pins 2305 as well. The cables 2301 may be any of the cables described above (e.g., twisted pair, coaxial cable, twin-axial cable, etc.) and may be shielded or unshielded. Referring to FIG. 23B, the molded housing 2303, cables 2301 and guide pins 2305 are cut in half along a centerline that extends perpendicularly to the lengths of the cables 2301, thereby forming counterpart halves 2328 and 2330 of a cable-to-cable connector. The mating faces of the counterpart connector halves 2328 and 2330 may be chemically treated, lapped or otherwise processed to ensure that the flat ends of conductors within the cables 2301 of each connector half contact one another when the connector halves 2328 and 2330 are pressed together. An oxide piercing, metal coated or semiconductive material (e.g., diamond dust or carbide) may be disposed between the mating surfaces of the two connector halves 2328 and 2330 to ensure reliable electrical contact. As shown in FIG. 23C, the guide pins 2305 are removed from connector half 2330 to form alignment holes 2321. Extended portions of the guide pins 2305 in the other connector half (i.e., shown at 2332 in FIG. 23B) are pushed through the molded housing 2303 of connector half 2328 such that portions 2334 of the guide pins 2305 project out of the mating surface of the connector half 2328. The projecting guide pin portions 2334 are received in the alignment holes 2321 of the counterpart connector half 2330, aligning the two connector halves 2328 and 2330 when pushed together.

Figure 23D:
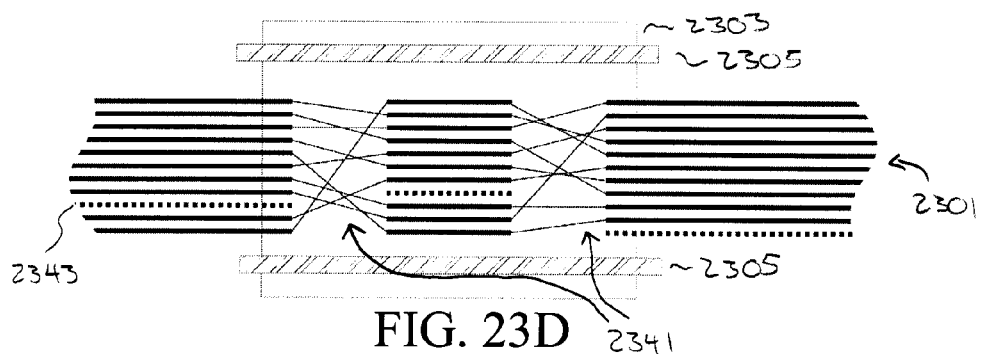

FIG. 23D illustrates an embodiment in which the cables 2301 are twisted or routed in a random manner (i.e., as indicated at 2341) to obfuscate the conductor connection order. Such cable-to-cable connectors may be used in security applications, each connector half effectively being keyed to the other half. Dummy cables, shown by dotted lines 2343, may be included to further obfuscate the conductor connection order.

Figure 24:
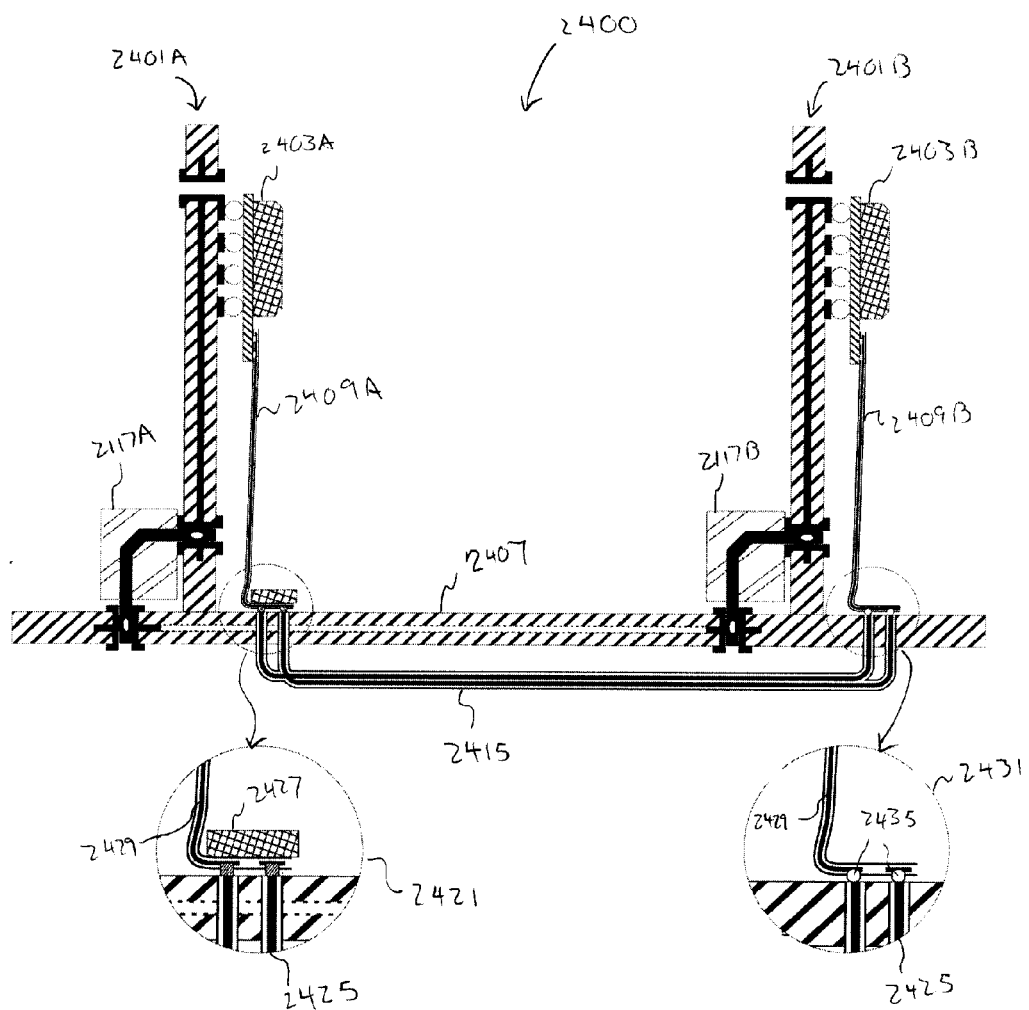
FIG. 24 illustrates a composite-cable interconnection system according to an embodiment of the invention.

FIG. 24 illustrates an embodiment of a composite-cable interconnection system 2400 having ribbon cables 2409A and 2409B that extend between a cabled backplane assembly 2407 and IC devices 2403A and 2403B, respectively. The IC devices 2403A and 2403B are mounted to respective daughterboards 2401A and 2401B, the daughterboards being removably attached to the backplane assembly by connectors 2117A and 2117B. As discussed in reference to FIG. 21, the connectors 2117A and 2117B may be used to provide conventional electrical interconnections between printed traces on the backplane assembly 2407 and daughterboards 2401, or may be used solely to secure the daughterboards 2401 in position. In one embodiment, shown in detail view 2421, discrete conductors 2429 within the ribbon cable 2409 are held in contact with respective projecting conductors 2425 of cables 2415 by a retainer assembly 2427. The retainer assembly may be fastened to the backplane using screws, clips or other fastening mechanisms, and applies pressure against the ribbon cable 2409 to maintain contact between the ribbon cable conductors 2429 and the projecting conductors 2425. In an alternative embodiment, shown in detail view 2431, the ribbon cable conductors 2429 are soldered to the conductors 2425 of cables 2415.

Figure 25:
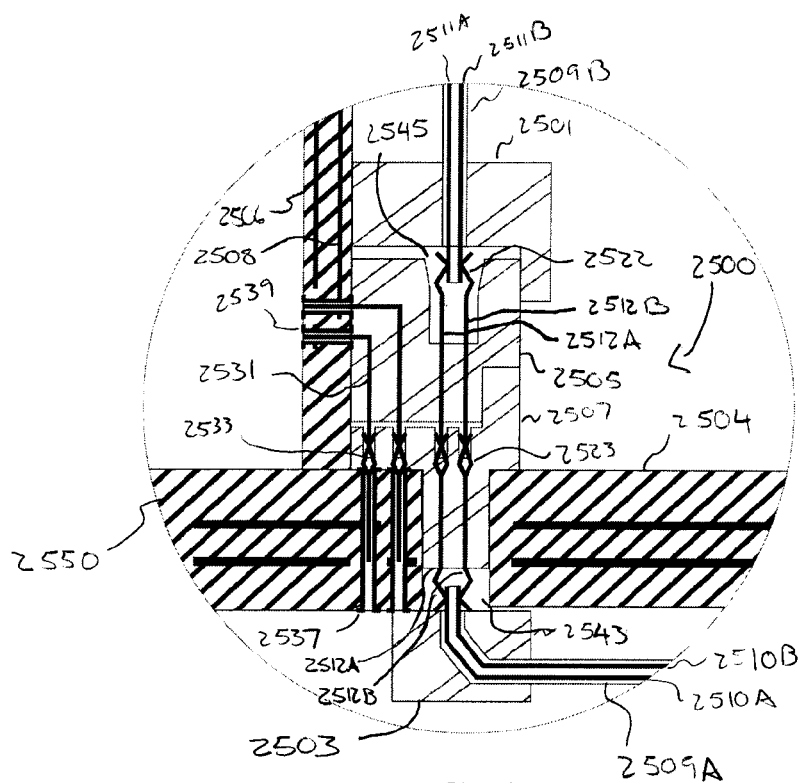
FIG. 25 illustrates a cable-to-cable connector according to an alternative embodiment.

FIG. 25 illustrates a cable-to-cable connector 2500 according to an alternative embodiment. The connector 2500 includes a pair of capture blocks 2501 and 2503, and a pair of cable contact blocks 2505 and 2507. Capture block 2503 is disposed adjacent a first surface of a backplane 2550 and receives a first cable 2509A. A pair of signal conductors 2510A, 2510B within the cable 2509A projects into a first cavity 2543 formed between the capture block 2503 and cable contact block 2507 and is inserted between a pair of contacts 2512A, 2512B such that each of contacts 2512A and 2512B is electrically coupled to a respective one of cable conductors 2510A and 2510B. The contacts 2512A and 2512B extend each through the cable-contact block 2507 and terminate in respective female receptacles 2523 that engage counterpart contacts 2521A and 2521B. The contacts 2521A, 2521B extend through the cable contact block 2505 and terminate in a receptacle 2522. The capture block 2501 is disposed adjacent the cable contact block 2505 and receives a second multi-conductor cable 2509B. Signal conductors 2511A and 2511B within the cable 2509B project into a cavity 2545 formed between the cable contact block 2505 and capture block 2501 and is received within the receptacle 2522 formed by the contacts 2521A, 2521B such that each of the conductors 2511A and 2511B contacts a respective one of the contacts 2521A and 2521B. Thus, a first conductor 2510A of cable 2509A is coupled to a first conductor 2511A of cable 2509B through contacts 2512A and 2521A, and a second conductor 2510B of cable 2509A is coupled to a second conductor 2511B of cable 2509B through contacts 2512B and 2521B.

Still referring to FIG. 25, the cable contact block 2505 may include additional conductors 2531 that project into conductive vias 2539 formed in daughterboard 2506 (i.e., to electrically couple conductors 2531 with conductive traces 2508 printed on the daughterboard 2506) and that project into counterpart receptacles 2533 within the cable contact block 2507. The receptacles 2533 within the cable contact block 2507 include conductive members which extend into vias 2537 formed within the backplane 2504, thereby establishing signal paths between conductive traces on the backplane 2504 and conductive traces on the daughterboard 2506, the signal paths being used, for example, for transmission of non-speed-critical signals and/or for establishing power and ground connections. Thus, the cable-to-cable connector 2500 may be used to establish high-speed cabled signaling paths as well as signal paths for non-speed-critical signals, power and ground. It should be noted that, while a profile view is shown, the cable-to-cable connector 2500 has a depth dimension and may be used to establish connections between any number of cable conductors. For example, in one embodiment, the cable 2509A is a flex cable having a row of conductors disposed along the depth dimension (only the outermost two of the conductors 2510A, 2510B being shown in FIG. 25). Also, additional sets of contacts similar to 2512A, 2512B may be provided to receive additional flex cables. Further, in an alternative embodiment, the cables 2509A, 2590B may be a twin-axial cables having side-by-side center conductors (and optional return conductors), twisted pair cables, coaxial cables or other types of electronic cables.

Figure 26:
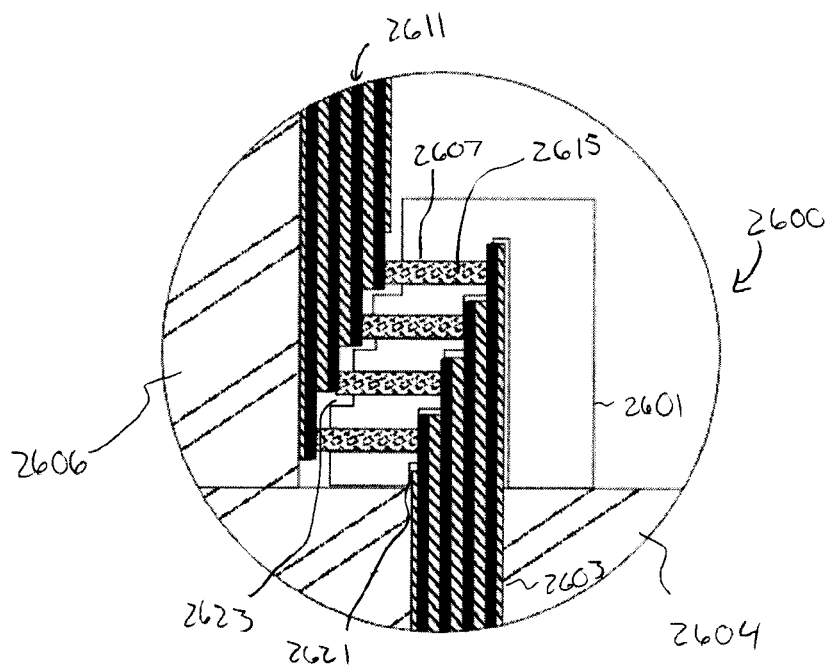
FIG. 26 illustrates a cable-to-cable connector according to another alternative embodiment.

FIG. 26 illustrates a cable-to-cable connector 2600 according to another alternative embodiment. The connector 2600 includes a housing 2601 having a stair-stepped cavity 2621 to receive a first flex cable 2603, and a stair-stepped outer contour 2623 that conforms to the shape of a second flex cable 2611. A set of passageways 2607 extend perpendicularly to the lengthwise extensions of the cables 2603 and 2611, each passageway forming a through-hole that extends from a respective step of the stair-stepped cavity 2621 to a corresponding step of the outer contour 2623. Compressible conductive members 2615 or assemblies (e.g., Fuzz buttons, conductive members with spring-bends as described above or conductive members with pogo pin assemblies at either end) are disposed within the passageways 2607 and compressed between respective conductors of the flex cables 2603 and 2611. The flex cables 2603 and 2611 may each be a multi-layer flex cable (i.e., having an array of individual conductors) with the conductors of the additional cable layers being electrically coupled to one another by conductive members extending through passageways not shown in the profile view of FIG. 26.

Figure 27:
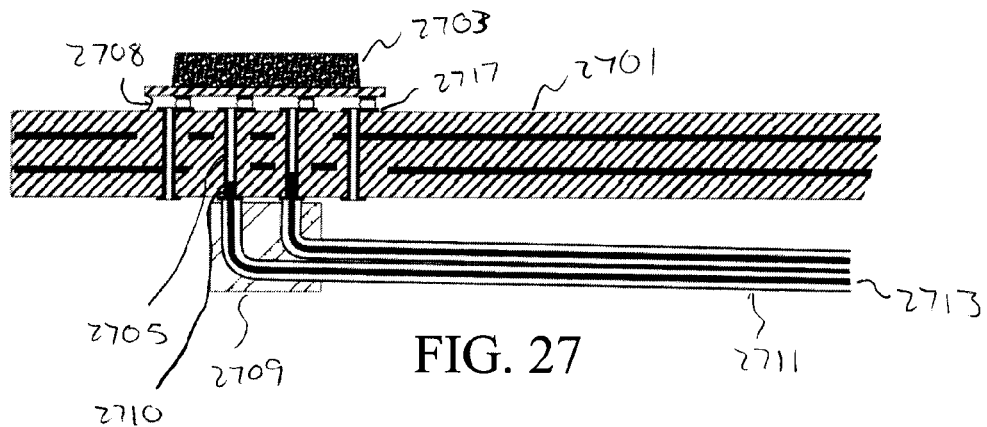
FIG. 27 illustrates an alternative arrangement for connecting an IC device to a signaling path formed by cables.

FIG. 27 illustrates an alternative arrangement for connecting an IC device 2703 to a signaling path formed by cables 2711. Rather than coupling the cables 2711 directly to the IC device 2703 as described in reference to FIG. 21, the IC device 2703 is mounted to a PCB 2701 in a conventional manner. That is, contacts 2708 of the IC device 2703 (e.g., a ball grid array or other mounting arrangement) are electrically coupled to conductive pads 2717 on the PCB 2715, the pads 2717 themselves being coupled to conductive vias 2705. Instead of using printed traces on the PCB 2701 to conduct signals to and from the conductive vias 2705, however, cables 2711 are coupled to the conductive vias 2705 (e.g., by solder connection or press-fit connection as shown at 2710) at the surface of PCB 2701 opposite the surface to which IC device 2703 is mounted. By this arrangement, via stubs are largely avoided (i.e., the entire via forms a signaling path, with little or none of the via extending beyond the cable contact point), and signals are routed directly through the printed circuit board 2701 and onto the conductors 2713 of cables 2711. The cables 2711 may include any number of conductors 2713, and may be shielded as described above. A guide block 2709 may be used to control the bend radius of the cables coupled to the vias.

Figure 28:
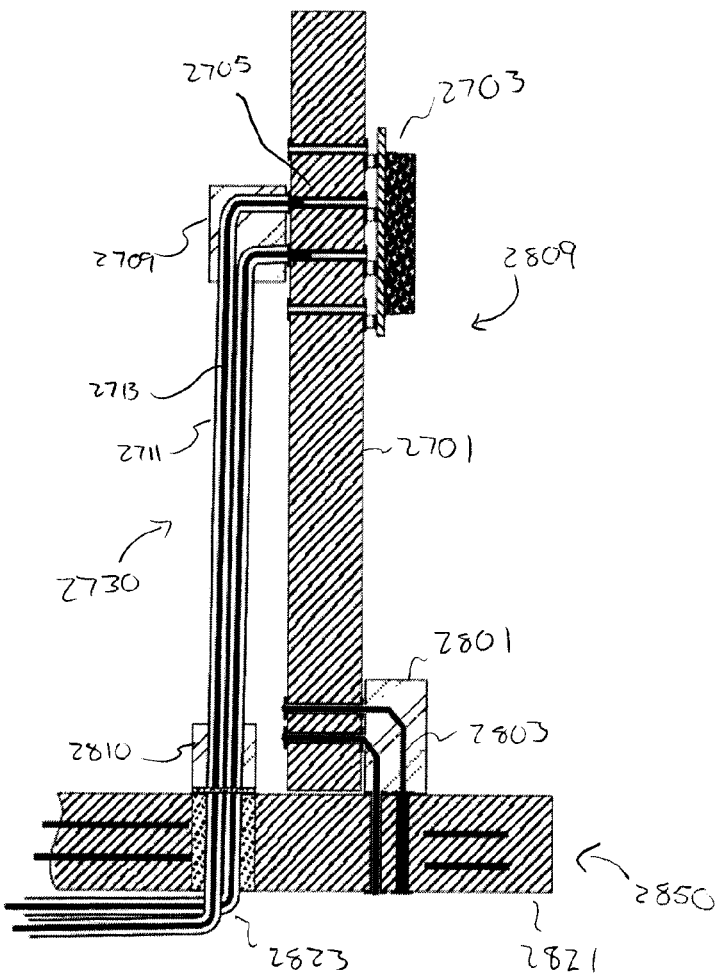
FIG. 28 illustrates the interconnection arrangement of FIG. 27 in a backplane-based interconnection system according to an embodiment of the invention.

FIG. 28 illustrates the interconnection arrangement of FIG. 27 in a backplane-based interconnection system according to an embodiment of the invention. The interconnection system corresponds to the interconnection system 2100 of FIG. 21, except that the via-to-cable interconnection of FIG. 27 is used instead of the direct cable connection to the IC device 2703. While both approaches have advantages, the interconnection system of FIG. 28 represents a relatively easy manufacturing change as conventional IC packaging and mounting technologies may be used to form the IC device 2703 and PCB 2701, and little or no changes are required in the assembled daughterboard 2809 other than omission of the via-connected traces that are replaced by the cabled signaling paths. After the daughterboard 2909 is assembled, a cable assembly 2730 including the cables 2711, capture block 2810 and, optionally, guide block 2709, may then be coupled to the daughterboard 2809, for example, by soldering or press-fitting the conductors 2713 of cables 2711 within conductive vias 2705 and, if provided, fastening the guide block 2709 to the PCB 2701 (e.g., using clips, screws, bolts, adhesive, etc.). The cable-to-cable connection between the cable assembly 2730 and the cables 2923 in the backplane assembly 2850 may be implemented by any of the cable-to-cable connection structures described above. Also, while coaxial cables are depicted in FIG. 28, twisted pair cables, twin-axial cables and various other types of electronic cables may be used in alternative embodiments. Also, a conventional right angle connector 2801 having conductive elements 2803 may be used to removably secure the daughterboard to the backplane 2821 and to establish signaling paths for non-speed-critical signals and for power and ground.

Figure 29:
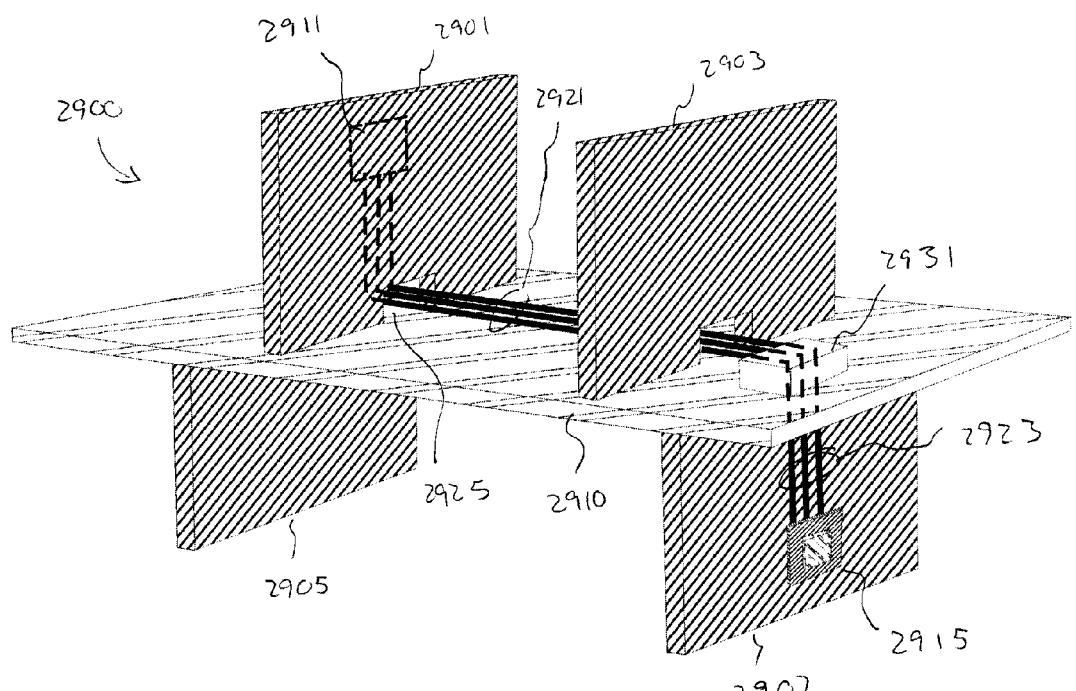
FIG. 29 illustrates an interconnection system having a midplane according to an embodiment of the invention.

While numerous embodiments of cable-based signaling systems and components thereof have been described above in the context of backplane-based interconnection systems, it should be noted that such signaling systems and components may readily be applied in other interconnection systems, including motherboard-to-daughterboard interconnection systems, midplane interconnection systems, and interconnections between mechanically unjoined printed circuit boards. FIG. 29, for example, illustrates an interconnection system 2900 having a midplane 2910, and a daughterboards 2901, 2903, 2905, 2907 disposed on either side of the midplane 2910. A set of composite-cable signal paths are formed by cables 2921 extending from an IC device 2911, through notches or openings 2925 formed in daughterboards 2901 and 2903, to a capture block 2931. The cables 2921 are electrically coupled to counterpart cables 2923 (e.g., using any of the above-described cable-to-cable connectors, or through conductive vias in the midplane 2910) and which extend to IC device 2915. As in all of the cable-based signaling systems disclosed herein, the signals transmitted on the signaling paths may be any type of signals (e.g., current mode signals, signals generated by push pull drivers, differential signals, single-ended signals etc.), having any number of data encoding schemes.

Alternative Interconnection Systems

Figure 30:
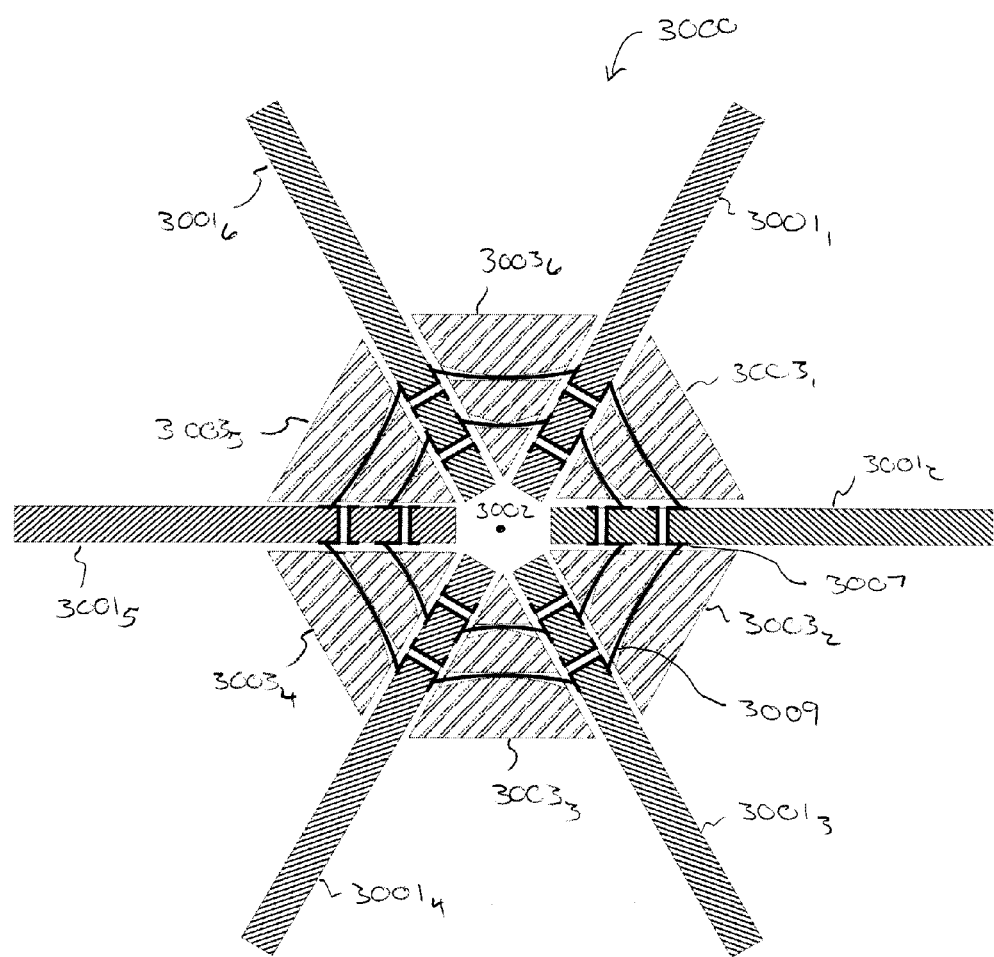
FIG. 30 illustrates an interconnection system according to an alternative embodiment of the invention.

FIG. 30 illustrates an interconnection system 3000 according to an alternative embodiment of the invention. The interconnection system includes PCBs $3001_1$-$3001_6$ and corresponding connectors $3003_1$-$3003_6$ disposed in a hub-and-spoke arrangement. That is, the PCBs $3001_1$-$3001_6$ are disposed in a radial pattern about a central axis 3002 and are secured to one another by wedge-shaped connectors $3003_1$-$3003_6$. Each of the connectors $3003_1$-$3003_6$ includes conductive elements 3009 that extend through connector passageways in the connectors 3003 and are urged against printed pads 3007 on adjacent PCBs 3001 (e.g., in the manner described in reference to FIGS. 19I and 19J). Although the conductive elements 3009 are depicted as forming a complete circuit through all the PCBs $3001_1$-$3001_6$, the conductive elements 3009 may also form point-to point signal paths between any adjacent or non-adjacent pair of PCBs (i.e., traversing one or more intermediary PCBs in the case of interconnection between adjacent and non-adjacent PCBs). The connectors may be secured to the PCBs 3001 by mechanical fasteners (e.g., screws, bolts, clips, etc.) and may also (or alternatively) be fastened to a center post extending along axis 3002 (the center post not being shown in FIG. 30). The PCBs 3001 may also be secured to the center post, if provided. Although six PCBs 3001 and connectors 3003 are shown in FIG. 30, more or fewer PCBs 3001 and connectors 3003 may be provided in alternative embodiments.

Figure 31A:
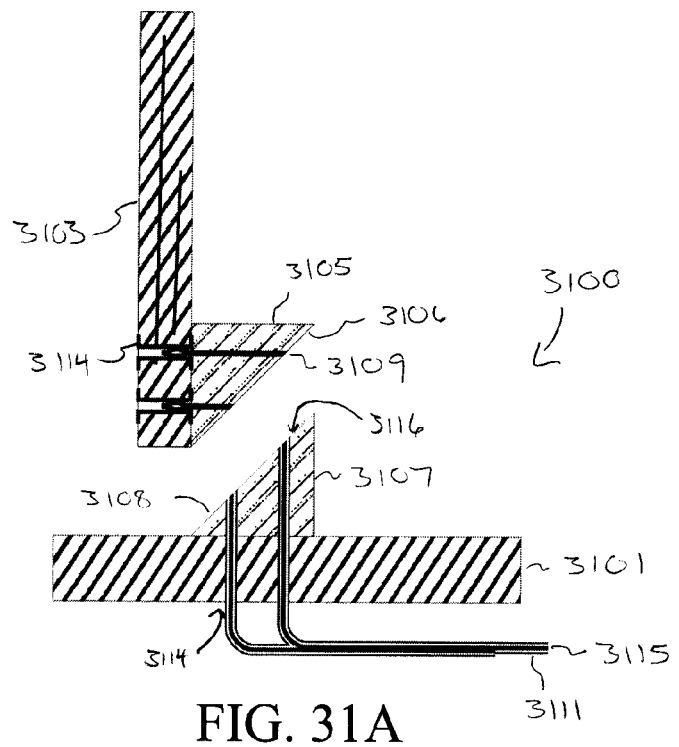
FIGS. 31A and 31B illustrate embodiments of board-to-board interconnection systems that includes connector halves disposed on respective printed circuit boards.

FIG. 31A illustrates an embodiment of a board-to-board interconnection system 3100 that includes connector halves 3105 and 3107, each having a beveled contact surface (3106 and 3108, respectively) for mating with the other. Cables 3111 extend through openings 3114 (e.g., through-holes) in a backplane 3101 and through passageways 3116 in connector half 3107. Conductors 3115 within the cables 3111 are exposed at the contact surface 3108 to form landings for counterpart contacts within the connector half 3107. Conductive elements 3109 (e.g., pins) disposed within connector half 3105 project into conductive vias 3114 in a daughterboard 3103 and extend to the contact surface 3106. When the contact surfaces 3106 and 3108 are disposed in contact with one another, the conductive elements 3109 contact the flat or chamfered ends of conductors 3115 (which may be beveled) to establish electrical contact therewith.

Figure 31B:
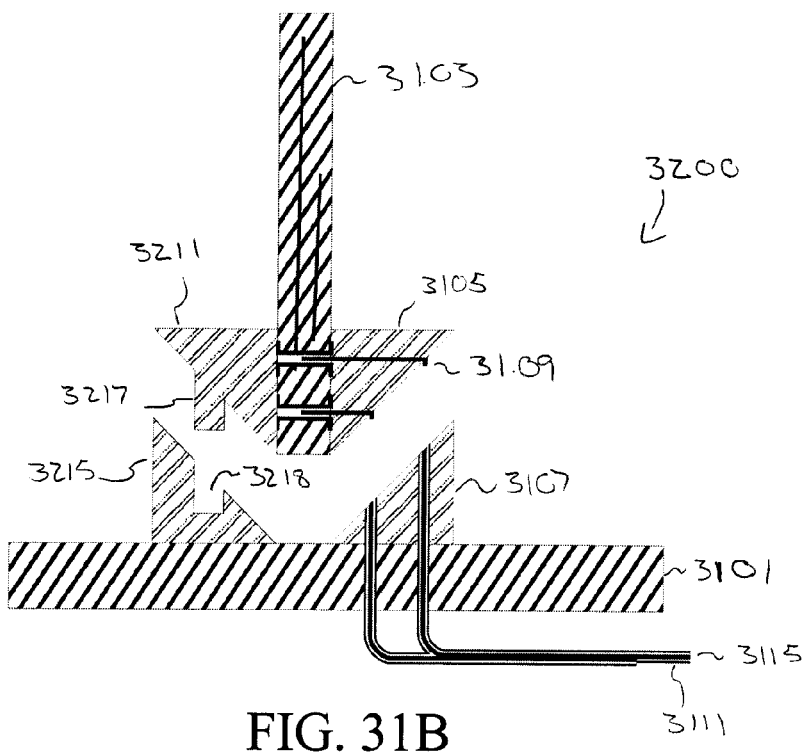

FIG. 32 illustrates another embodiment of a board-to-board interconnection system 3200. The interconnection system 3200 is similar to interconnection system 3100 of FIG. 31 (i.e., having daughterboard 3103, backplane 3101, connector halves 3105 and 3107 and cables 3115), but additionally includes a guide block 3211 disposed on the daughterboard 3103 and a mounting receptacle 3215 disposed on the backplane 3101. The guide block 3211 includes a projecting member 3217 to be received within a counterpart alignment hole 3218 within mounting receptacle 3215, the projecting member 3217 and alignment hole being precisely positioned relative to one another to ensure contact between the conductive members 3109 and cable conductors 3115 when the daughterboard 3103 is connected to the backplane 3101.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. An electronic assembly comprising:
a substrate having first and second surfaces;
a first through-hole extending through the substrate from a first opening at the first surface to a second opening at the second surface;
a first projecting pin extending through the first opening into the first through-hole and terminating at a first pin terminal secured within the first through-hole;
a first cable that includes a first conductive member with first and second flexible end sections, the first flexible end section terminating at a first cable terminal, the first flexible end section extending through the second opening and including a spring structure that includes first and second bends within the first through-hole, and wherein the first cable terminal is forcibly engaged against the first pin terminal by a first force; and
a capture member disposed adjacent to the second surface of the substrate,
wherein the capture member secures the first cable at a predetermined position relative to the substrate,
wherein the capture member exerts a second force on the first cable urging the first cable toward the first through-hole, at least some of the second force being transmitted from through the first cable and into the pin terminal in the form of the first force, and
wherein the capture member is secured in a fixed position relative to the substrate.

2. The assembly of claim 1, wherein the through-hole is a non-plated through-hole.

3. The assembly of claim 1, wherein the first force is transmitted through the first flexible end section to maintain the forcible engagement between the first cable terminal and the first pin terminal.

4. The assembly of claim 3, wherein the first flexible end section comprises a deformation as a result of the first force.

5. The assembly of claim 4, wherein the deformation in the first flexible end section includes one of the first and second bends of the first flexible end section.

6. The assembly of claim 4, wherein an extent of the deformation is limited, by forcible contact between at least one point on an exterior surface of the first flexible end section and an interior surface of the first through-hole.

7. The assembly of claim 1, wherein the capture member further secures a second cable at predetermined position relative to the substrate.

8. The assembly of claim 1, wherein the substrate comprises a printed circuit board with at least one signal trace.

9. The assembly of claim 1, further comprising a first daughter board mechanically coupled with the substrate and comprising a first signal path in electrical continuity with the first projecting pin.

10. The assembly of claim 9, further comprising a second daughter board mechanically coupled with the substrate and comprising a second signal path.

11. The assembly of claim 1, the first cable further comprising a second conductive member.

12. The assembly of claim 11, wherein the first and second conductive members comprise a differential pair.

13. The assembly of claim 12, wherein the first cable is a coaxial cable.

14. The assembly of claim 12, wherein the first cable comprises a twisted pair of conductors.

15. The assembly of claim 1, wherein the first cable comprises a conductive shield.

16. The assembly of claim 1, wherein the first conductive member is disposed within a first outer insulating sleeve.

17. The assembly of claim 11, wherein a portion of the first conductive member and the second conductive member are both disposed within a first outer insulating sleeve.

18. An electronic assembly comprising:
a substrate having first and second surfaces;
a through-hole extending through the substrate from a first opening at the first surface of the substrate to a second opening at the second surface of the substrate;
a first projecting pin extending into the first opening into the through-hole and terminating at a pin terminal secured within the through-hole;
a cable that includes a conductive member with first and second flexible end sections, the first flexible end section terminating at a first cable terminal, the first flexible end section extending into the second opening and including a spring structure that includes first and second bends within the through-hole, and the first cable terminal being forcibly engaged, by a first force, against the pin terminal secured within the through-hole; and
a capture member disposed adjacent to the second surface of the substrate,
wherein the capture member secures the cable at a predetermined position relative to the substrate,
wherein the capture member exerts a second force on the cable urging the cable toward the through-hole, at least some of the second force being transmitted from through the cable and into the pin terminal in the form of the first force, and
wherein the capture member is secured in a fixed position relative to the substrate.

* * * * *